United States Patent [19]

Hyatt

[11] Patent Number: 5,615,380

[45] Date of Patent: Mar. 25, 1997

[54] INTEGRATED CIRCUIT COMPUTER SYSTEM HAVING A KEYBOARD INPUT AND A SOUND OUTPUT

[76] Inventor: Gilbert P. Hyatt, P.O. Box 81230, Las Vegas, Nev. 89180

[21] Appl. No.: 506,642

[22] Filed: Apr. 9, 1991

Related U.S. Application Data

[63] Continuation of Ser. No. 849,812, Nov. 9, 1977, and a continuation-in-part of Ser. No. 860,277, Dec. 13, 1977, and a continuation of Ser. No. 457,451, Dec. 27, 1989, which is a continuation of Ser. No. 343,112, Apr. 24, 1989, Pat. No. 4,896,260, which is a continuation of Ser. No. 402,520, Oct. 1, 1973, Pat. No. 4,825,364, which is a division of Ser. No. 101,881, Dec. 28, 1970, abandoned, said Ser. No. 457,451, is a continuation of Ser. No. 209,115, Jun. 17, 1988, Pat. No. 4,942,516, which is a continuation-in-part of Ser. No. 879, 293, Nov. 24, 1969, abandoned, Ser. No. 101,881, Dec. 28, 1970, abandoned, Ser. No. 860,253, Dec. 14, 1977, abandoned, Ser. No. 860,256, Dec. 14, 1977, Pat. No. 4,829,419, Ser. No. 402,520, Oct. 1, 1973, Pat. No. 4,825,364, and Ser. No. 223,959, Jan. 12, 1981, abandoned, which is a continuation of Ser. No. 101,881, which is a continuation-in-part of Ser. No. 879,293, said Ser. No. 860,253, is a continuation-in-part of Ser. No. 879,293, and Ser. No. 101,881, said Ser. No. 860,256, is a continuation-in-part of Ser. No. 879,293, and Ser. No. 101,881, said Ser. No. 402,520, is a continuation of Ser. No. 101,881, said Ser. No. 860,277, is a continuation-in-part of Ser. No. 101,881, Ser. No. 134,958, Apr. 19, 1971, Ser. No. 135,040, Apr. 19, 1971, Ser. No. 229,213, Apr. 13, 1972, Pat. No. 3,820,894, Ser. No. 230, 872, Mar. 1, 1972, Pat. No. 4,531,182, Ser. No. 232,459, Mar. 7, 1972, Pat. No. 4,370,720, Ser. No. 246,867, Apr. 24, 1972, Pat. No. 4,310,878, Ser. No. 288,247, Sep. 11, 1972, Pat. No. 4,121,284, Ser. No. 291,394, Sep. 22, 1972, Pat. No. 4,396,976, Ser. No. 302,771, Nov. 1, 1972, Ser. No. 325,941, Jan. 22, 1973, Pat. No. 4,060,848, Ser. No. 366,714, Jun. 4, 1973, Pat. No. 3,986,022, Ser. No. 339,817, Mar. 9, 1973, Pat. No. 4,034,276, Ser. No. 490,816, Jul. 22, 1974, Pat. No. 4,029,853, Ser. No. 476,743, Jun. 5, 1974, Pat. No. 4,364, 110, Ser. No. 522,559, Nov. 11, 1974, Pat. No. 4,209,852, Ser. No. 550,231, Feb. 14, 1975, Pat. No. 4,209,843, Ser. No. 727,330, Sep. 27, 1976, abandoned, Ser. No. 730,756, Oct. 7, 1976, abandoned, Ser. No. 754,660, Dec. 27, 1976, Pat. No. 4,486,850, Ser. No. 812,285, Jul. 1, 1977, Pat. No. 4,371,953, Ser. No. 844,765, Oct. 25, 1977, Pat. No. 4,523, 290, Ser. No. 849,812, Nov. 9, 1977, and Ser. No. 849,733, Nov. 7, 1977, abandoned, said Ser. No. 849,812, is a continuation-in-part of Ser. No. 101,881, Ser. No. 134,958, Ser. No. 135,040, Ser. No. 230,872, Ser. No. 232,459, Ser. No. 246,867, Ser. No. 288,247, Ser. No. 229,213, Ser. No. 291,394, Ser. No. 302,771, Ser. No. 325,933, Jan. 22, 1973, Pat. No. 4,016,540, Ser. No. 325,941, Ser. No. 476,743, Ser. No. 550,231, Ser. No. 366,714, Ser. No. 730,756, Oct. 7, 1976, abandoned, Ser. No. 752,240, Dec. 20, 1976, abandoned, Ser. No. 801,879, May 31, 1977, Pat. No. 4,144,582, Ser. No. 844,765, and Ser. No. 849,733.

[51] Int. Cl.[6] .................................................. G06F 13/00
[52] U.S. Cl. ................................. 395/800; 364/DIG. 1; 364/DIG. 2; 364/232
[58] Field of Search .................................. 364/200, 900, 364/DIG. 1 MS File, DIG. 2 MS File; 235/146; 341/20–25; 340/711, 712; 84/600, 601; 395/800, 200, 275, 650, 225

[56] References Cited

U.S. PATENT DOCUMENTS 2,897,638  8/1959  Maker .................................. 364/474 X (List continued on next page.)

OTHER PUBLICATIONS

"Consumer Electronics Show Highlights Television Games", Electronic Design 15, Jul. 19, 1976, p. 21.

(List continued on next page.)

Primary Examiner—Robert B. Harrell
Attorney, Agent, or Firm—Gilbert P. Hyatt

[57] ABSTRACT

An improved computer system is implemented with an integrated circuit computer having integrated circuit (IC) memories and using a keyboard input and sound output to communicate with an operator. Provision is made for a dynamic memory with a memory refresh arrangement. Memory refresh is synchronized with computer control signals to minimize contention or conflicts with computer operations and to share control circuitry. Improved control system architecture, computer architecture, and memory architecture are provided that are particularly suitable for operator interaction, integrated circuit data processors, and dynamic memories.

49 Claims, 9 Drawing Sheets

U.S. PATENT DOCUMENTS

| | | | |
|---|---|---|---|
| 2,951,190 | 8/1960 | Baermann | 179/114 M |
| 3,088,661 | 5/1963 | Brigham et al. | 235/2 |
| 3,142,820 | 7/1964 | Daniels | 395/275 |
| 3,165,595 | 1/1965 | Noshiro | 179/100.2 |
| 3,187,321 | 6/1965 | Kameny | 340/712 |
| 3,190,038 | 6/1965 | Kardon | 46/117 X |
| 3,209,074 | 9/1965 | French | 360/12 |
| 3,209,084 | 9/1965 | Gamzon | 381/186 |
| 3,297,107 | 1/1967 | Shipp | 186/35 |
| 3,315,235 | 4/1967 | Carnevale et al. | 395/325 |
| 3,332,071 | 7/1967 | Goldman et al. | 353/30 |
| 3,346,853 | 10/1967 | Koster | 395/140 |
| 3,356,836 | 12/1967 | Stenby | 364/710.12 |
| 3,364,315 | 1/1968 | Gorike | 179/115.5 R |
| 3,389,404 | 6/1968 | Koster | 395/144 |
| 3,398,241 | 8/1968 | Lee | 381/51 |
| 3,406,379 | 10/1968 | Palevsky et al. | 395/500 |
| 3,462,742 | 8/1969 | Miller et al. | 395/775 |
| 3,487,369 | 12/1969 | King et al. | 364/706 |
| 3,509,329 | 4/1970 | Wang et al. | 364/750.5 |
| 3,515,792 | 6/1970 | Deutsch | 84/605 |
| 3,538,639 | 11/1970 | Tomaro | 46/232 |
| 3,566,365 | 2/1971 | Rawson et al. | 395/575 |
| 3,566,370 | 2/1971 | Worthington et al. | 128/710 |
| 3,568,094 | 3/1971 | Metzger | 332/9 R |
| 3,578,912 | 5/1971 | Beavers | 340/328 |
| 3,582,671 | 6/1971 | Ott | 307/117 |
| 3,583,093 | 6/1971 | Glass et al. | 46/117 |
| 3,588,353 | 6/1971 | Martin | 381/51 |
| 3,596,256 | 7/1971 | Alpert et al. | 395/275 |
| 3,620,538 | 11/1971 | Mercer et al. | 274/1 A |
| 3,623,016 | 11/1971 | Winkler | 340/172.5 |
| 3,634,596 | 1/1972 | Rupert | 84/1.28 |
| 3,641,496 | 2/1972 | Slavin | 395/2 |
| 3,646,522 | 2/1972 | Furman et al. | 395/375 |
| 3,651,485 | 3/1972 | McDonnell | 364/DIG. 1 |
| 3,654,708 | 4/1972 | Brudner | 434/307 |
| 3,679,875 | 7/1972 | Rawson et al. | 235/375 |
| 3,681,756 | 8/1972 | Burkhard et al. | 395/2 |
| 3,686,627 | 8/1972 | Zachar et al. | 395/425 |
| 3,688,271 | 8/1972 | Rouse | 340/870.03 |
| 3,702,988 | 11/1972 | Haney et al. | 364/DIG. 1 |
| 3,725,877 | 4/1973 | Keil | 340/172.5 |
| 3,727,190 | 4/1973 | Vogelman et al. | 364/413.02 |
| 3,728,480 | 4/1973 | Baer | 273/DIG. 28 |
| 3,730,995 | 5/1973 | Mathews | 179/1 VC |
| 3,737,863 | 6/1973 | Rowland et al. | 364/413.02 |
| 3,740,725 | 6/1973 | Fletcher | 395/250 |
| 3,744,030 | 7/1973 | Kuljian | 395/775 |
| 3,747,069 | 7/1973 | Hershberg | 434/320 |
| 3,750,139 | 7/1973 | Blishak | 340/765 |
| 3,760,375 | 9/1973 | Irwin | 364/DIG. 1 |
| 3,775,756 | 11/1973 | Balser | 395/375 |
| 3,778,774 | 12/1973 | Phillips et al. | 395/250 |
| 3,781,865 | 12/1973 | Yamazaki | 340/765 |
| 3,794,763 | 2/1974 | Boudewijns et al. | 179/1 VC |
| 3,808,591 | 4/1974 | Panicello et al. | 340/27 R |
| 3,810,106 | 5/1974 | Nadler et al. | 369/32 |
| 3,878,514 | 4/1975 | Faber | 395/375 |
| 3,952,289 | 4/1976 | Beligant | 340/172.5 |
| 3,962,800 | 6/1976 | Feldheim | 35/8 B |
| 3,986,022 | 10/1976 | Hyatt | 250/205 |
| 4,026,555 | 5/1977 | Kirschner et al. | 273/85 R |
| 4,034,983 | 7/1977 | Dash et al. | 273/85 G |
| 4,036,178 | 7/1977 | Lee et al. | 119/51.02 |
| 4,053,740 | 10/1977 | Rosenthal | 364/705 |
| 4,073,067 | 2/1978 | Beach | 35/8 B |
| 4,093,223 | 6/1978 | Wilke et al. | 273/94 R |
| 4,121,284 | 10/1978 | Hyatt | 364/DIG. 1 |
| 4,162,792 | 7/1979 | Chang | 273/85 G |
| 4,171,135 | 10/1979 | Doyle et al. | 273/237 |
| 4,209,843 | 6/1980 | Hyatt | 364/728.3 |
| 4,310,878 | 1/1982 | Hyatt | 364/183 |
| 4,364,110 | 12/1982 | Hyatt | 364/474.22 |
| 4,370,720 | 1/1983 | Hyatt | 364/474.36 |
| 4,396,976 | 8/1983 | Hyatt | 364/130 |
| 4,523,290 | 6/1985 | Hyatt | 364/602 |
| 4,531,182 | 1/1985 | Hyatt | 364/131 |
| 4,825,364 | 4/1989 | Hyatt | 364/DIG. 1 |
| 4,829,419 | 5/1989 | Hyatt | 364/188 |
| 4,964,075 | 10/1990 | Shaver et al. | 364/900 |

OTHER PUBLICATIONS

"Video Games Continue To Sell Big, But EMI/RFI Proofing Is A Problem", J. McDermott, Electronics Design 9, Apr. 26, 1977, pp. 36–40.

"Microprocessor–Based Video Games", Li et al., Electronics Design 25, Dec. 25, 1977, pp. 84–87.

"Electronic Games No Longer Need TV", A. Rosenblatt, Electronics, Aug. 18, 1977.

"Chess Mate", Electronics, Mar. 4, 1976, p. 44.

"Games", G.M. Walker, Electronics, Jun. 24, 1976, pp. 89–96.

"Small–Vocabulary, Discrete–Word Recognizer Using A Microprocessor And Winograd Fourier Transform", Dixon et al., IBM TDB vol. 19 No. 11, Apr. 1977, pp. 4483–4484.

"Applying Microcomputers In Video Games", S. Mazor, IEEE, vol. CE–23 No. 3, Aug. 1977, pp. 258–261.

"Digital Techniques For Computer Voice Response: Implementations and Applications", Rabiner et al., IEEE, vol. 64 No. 4, Apr. 1976, pp. 416–433.

"Wiring Telephone Apparatus From Computer–Generated Speech", Flanagan et al., Bell Syst. Tech. J., vol. 51, Feb. 1972, pp. 391–397.

"Some Experience In Word Recognition", King et al., IBM J., vol. 10, Jan. 1966, pp. 65–79.

"Automatic Speech Recognition—State Of The Art In 1972", S.R. Hyde, Proceedings Of The Conference On Machine Perception Of New Patterns And Pictures, 1972, pp. 109–116.

"A Survey Of Digital Speech Processing Techniques", R.W. Shafer, IEEE Trans. Audio Electroacoust., vol. AU–20, Mar. 1972, pp. 28–35.

"Computers That Talk And Listen: Man–Machine Communication By Voice", James L. Flanagan, Proceedings of the IEEE, vol. 64 No. 4, Apr. 1976, pp. 405–415.

"Automatic Synthesis From Ordinary English Text", C.H. cooker et al., IEEE Trans. Audio Electroacoust., vol. AU–21, Jun. 1973, pp. 293–298.

"On Line–Computers For Speech Research", P.B. Deans, IEEE Trans. Audio Electrocoust., vol. Au–18, Dec. 1970, pp. 418–425

"A Multiline Computer Voice Response System Utilizing ADPCM Coded Speech", Rosenthal et al., IEEE Trans. Acoustics Speech Signal Processing, vol. ASSP–22, Oct. 1974, pp. 339–352.

"Minicomputer–Based Laboratory For Speech–Intelligibility Research", Lin et al., Proceedings of IEEE, vol. 61 No. 11, Nov. 1973, pp. 1583–1588.

"Practical Applications Of Voice Input To Machines", T.B. Martin, Proceedings of IEEE, vol. 64 No. 4, Apr. 1976, pp. 487–501.

"Voice Output Input Control of Equipment", J.P. Halgas, Fire Control Development And Engineering Directorate, Oct. 1975.

"Voice–Activated Stop In Telephone Dictating Systems", P. Schoettler, IBM TDB, vol. 13 No. 10, Mar. 1971, pp. 2954–2955.

"Microprocessors Tiny Overseers That Run Everything From Cars To Ovens", J. Free, Popular Science, Mar. 1977, pp. 90–93.

"Speech Recognition System", R. Bakis, IBM TDB, vol. 13 No. 4, Sep. 1970, pp. 828–831.

"Self–Contained Electronic Games", D. Mennie, Spectrum, Dec. 1977, pp. 21–25.

"Scamp Microprocessor Aims To Replace Mechanical Logic", J.A. Morris et al., Electronics, Sep. 18, 1975, pp. 81–87.

"The History of Video Games", S.D. Bristow, IEEE Trans. on Consumer Elec., Feb. 1977, pp. 58–68.

"MOS Technology Brings Fun And Games To TV Sets", M.Lorkovic, Electronics, May 13, 1976, pp. 87–92.

"Microprocessor Aids Game Format Change", Electronics, Oct. 30, 1976, pp. 32, 34.

"More Complex Video Games Keep Player Interest High", T.G. Blahuta, Electronics, Apr. 15, 1976, pp. 16, 162.

"Board Games Grab Microprocessors", Electronics, Jul. 21, 1977, pp. 32, 34.

"Microprocessors In Consumer Products", Russo et al., Proceedings of IEEE, vol. 66 No. 2, Feb. 1978, pp. 131–141.

"Electronics Gamesmanship", D. Mennie.

"Microprocessor–Board Video Games", Li et al., Electronic Design 25, Dec. 6, 1977, pp. 84–88.

"An Approach To Microprocesor–Based Game Architecture", K. Li, Gametronics Proceedings, pp. 31–43.

"Games People Play", J. Brancatelli, Washington Star, Feb. 1978, pp. 28–31.

"Dual Microprocessors Simplify Interactive Terminal Operation", Electronics Design 26, Dec. 20, 1976, p. 40.

"Electronics Games That Amuse, Challenge, And Outwit You", B. Hawkins, Popular Science, Dec. 1978, pp. 79–81.

"TI Makes Noise In Games Toys", Electronics, Jun. 1977, pp. 31–32.

"Roundup of TV Electronic Games", K. Carrole, Popular Electronics, Dec. 1976, pp. 32–36.

"Meet MIDAC And MIDSAC: Dice, Pool, Shooting Fools", R. Gibbons, Chicago Tribune, Jun. 27, 1954, pp. 1–2.

"Spacewar Game", DECUSCOPE, vol. 1 No. 1, Apr. 1962, pp. 1–4.

"Games Computers Play", Popular Science, vol. 197 No. 4, Oct. 1970, p. 44.

"On The Demonstration of High–Speed Digital Computers", Bauer et al., Journal of The Association For Computing Machinery, vol. 1 No. 4, Oct. 1954, pp. 177–182.

"Pool Games Speeding Computers' Progress", Oklahoma City Times, Sep. 30, 1967.

"Spacewar", Analog Science Fiction/Sciene Fact, vol. 87 No. 5, Jul. 1971, pp. 67–79.

"Electronic Light–Mark Originator, A New Device For Television Studios And Television News–Reporting Installations", R. Sondermeyer, Funk and Ton, Nov. 4, 1954, pp. 179–186.

"Illustrations Of Computer Powers", Computers and Automation, Sep. 1954, p. 26.

"Spacewar", S. Brand, II Cybernetic Frontiers, 1974, pp. 54–60.

"New 1978 Electronic Games", K. Jensen, Popular Electronics, Jan. 1978, pp. 33–43.

"Dictionary of Computers, Information Processing, and Telecommunications" 2nd Edition (1984) p. 446.

Hyatt "Universal Control Logig For Photoelectric Punched Tape Readers", Computer Design (Oct. 68) pp. 56–59, (Nov. 68) pp. 68–75.

Mrazek "Digital Dispay Systems" Mos Brief #8, Electronic Design #24, vol. 14 (Nov. 22, 1969) pp. first and second pages.

Flynn "CRT terminals—talking to computers", Electronic Products (Jun. 1970) pp. 22–29.

Boysel et al. "Four–Phase LSI LOGIC offers New Approach to Computer Designer", Computer Design (Apr. 1970), pp. 141–146.

Atley "LSI poses dilemma for system designers", Electronic Design #3 (Feb. 1, 1970) pp. 44–52.

Campeau "The Block Oriented Computer" IEEE Transactions on Computers, vol. C–18, No. 8 (Aug. 1969) pp. 706–718.

"New semiconductor concepts simplify pocket calculator" EEE–(Jun. 1970) pp. 26–34.

Atley "Can You build a system with off–the shelf LSI?" Electronic Design #5, (Mar. 1, 1970) pp. 46–51.

Hughes et al. Internation Conference on Microelectronics 3rd–5th Jun. 1969, pp. pp. 1–2.

Casarosa et al. "The control unit of a small size microprogramed computer" Dialog Abstract from INSPEC database (Nov. 1970).

IBM "Personal Computer Hardware Reference Library," Technical Reference for the IBM XT (Apr. 1984), pp. i to ii, 1–7, 1–15, 1–29, 4–1 to 4–16, 5–25, 5–56, and 5–68.

Bauer et al; "DODDAC—An integrated system for data processing, interrogation, and display"; Proceedings of the Eastern Joint Computer Conference; Dec. 12–14, 1961.

Beelitz et al; "System architecture for large–scale integration"; AFIPS Fall Joint Computer Conference proceedings; 1967.

Boysel; "Adder on a chip: LSI helps reduce cost of small machine"; Electronics; Mar. 18, 1968.

Bucholz, W.; "Computer Controlled Audio Ouput"; IBM Technical Disclosure Bulletin; vol. 3, No. 5, Oct. 1960; p. 60, 179/1SM.

Chapman: "Prospectives in voice response from computers"; 1970 Proceedings on the International Conference on Communications.

Flanagan; "Synthetic voices for computers"; IEEE Spectrum; pp. 22–45; Oct. 1970.

Hopkins; "electronic navigator charts man's path to the moon"; Electronics; Jan. 9, 1967.

Hovik; "Microprogramming"; Electronic Products magazine; Apr. 19, 1971; pp. 82–86.

Koster; "A stored Program Display Console: Bunker Ramo Model 90"; Sixth National Symposium On Information Display: Society For Information Display; 1965.

Levy et al; "System Utilization of Large–Scale Integration"; IEEE Transactions on Electronic Computers; Oct. 1967.

Mathews; "The digital computer as a musical instrument"; Science magazine; Nov. 1, 1963.

Mathews; "The technology of the computer music"; M.I.T. Press 1969.

Booth et al; Automatic Digital Computers; 1963, pp. 60–75.

Burroughs Corp; Digital Computer Principles; McGraw–Hill (1962) pp. 381–382.

Gschwind; Design of Digital Computers; Springer–Verlag (1967) pp. 170–177.

Husson; Microprogramming Principles And Practices; Prentice–Hall (1970) pp. 1–5, 12, 19–20, 186–189, 412, and 415–417.

Kline; Digital Computer Design; Prentice–Hall (1977) at Fig. 10.5.

Matlick; Computer Storage Systems And Technology; John Wiley and Sons (1977) at pp. 1–3.

Davis; "Computer Data Displays"; Prentice Hall; 1969.

Hudson; "The Aplications and Implications of Large Scale Integration"; Computer Design; Jun. 1968.

Rice; "LSI and Computer System Architecture"; Computer Design; Dec. 1970.

Weitzman; "Voice Recognition and Response Systems"; Datamation; Dec. 1969.

Hewlett Packard; "Automatic Calculator Plotting with the HP System 9100".

Hewlett Packard Calculator Model 9100A Service Manual.

IBM 7094 Data Processing System; Form No. A22–6703; Oct. 21, 1966.

IBM Systems Reference Library; IBM 7094 Principles of Operation; File No. 7094–01 GA–22–6703–4 (complete document).

INTEGRATED CIRCUIT COMPUTER SYSTEM HAVING A KEYBOARD INPUT AND A SOUND OUTPUT

CROSS REFERENCE TO RELATED APPLICATIONS

The present application is a continuation of parent application DIGITAL SOUND SYSTEM FOR CONSUMER PRODUCTS Ser. No. 05/849,812 filed on Nov. 9, 1977 now pending in the PTO; which parent application is a continuation of the following list of ancestor applications:

(1) FACTORED DATA PROCESSING SYSTEM FOR DEDICATED APPLICATIONS Ser. No. 101,881 filed on Dec. 28, 1970; proceedings therein having been terminated, and now abandoned.

(2) CONTROL SYSTEM AND METHOD Ser. No. 05/134,958 filed on Apr. 19, 1971; still pending in the PTO;

(3) CONTROL APPARATUS Ser. No. 05/135,040 filed on Apr. 19, 1971; still pending in the PTO;

(4) MACHINE CONTROL SYSTEM OPERATING FROM REMOTE COMMANDS Ser. No. 230,872 filed on Mar. 1, 1972; now U.S. Pat. No. 4,531,182 issued on Jul. 23, 1985;

(5) COORDINATE ROTATION FOR MACHINE CONTROL SYSTEM Ser. No. 232,459 filed on Mar. 7, 1972 and now U.S. Pat. No. 4,370,720 issued on Jan. 25, 1983;

(6) DIGITAL FEEDBACK CONTROL SYSTEM Ser. No. 246,867 filed on Apr. 24, 1972 and now U.S. Pat. No. 4,310,878 issued on Jan. 12, 1982;

(7) COMPUTERIZED SYSTEM FOR OPERATOR INTERACTION Ser. No. 288,247 filed on Sep. 11, 1972 and now U.S. Pat. No. 4,121,284 issued on Oct. 17, 1978;

(8) APPARATUS AND METHOD FOR PRODUCING HIGH REGISTRATION PHOTO-MASKS Ser. No. 229,213 filed on Apr. 13, 1972 and now U.S. Pat. No. 3,820,894 issued on Jun. 28, 1974;

(9) A SYSTEM FOR INTERFACING A COMPUTER TO A MACHINE Ser. No. 291,394 filed on Sep. 22, 1972 and now U.S. Pat. No. 4,396,976 issued on Aug. 2, 1983;

(10) DIGITAL ARRANGEMENT FOR PROCESSING SQUAREWAVE SIGNALS Ser. No. 05/302,771 filed on Nov. 1, 1972; still pending in the PTO;

(11) APPARATUS AND METHOD FOR PROVIDING INTERACTIVE AUDIO COMMUNICATION Ser. No. 325,933 filed on Jan. 22, 1973 now U.S. Pat. No. 4,016,540 issued on Apr. 5, 1977;

(12) ELECTRONIC CALCULATOR SYSTEM HAVING AUDIO MESSAGES FOR OPERATOR INTERACTION Ser. No. 325,941 filed on Jan. 22, 1973 and now U.S. Pat. No. 4,060,848 issued on Nov. 29, 1977;

(13) COMPUTERIZED MACHINE CONTROL SYSTEM Ser. No. 476,743 filed on Jun. 5, 1974 and now U.S. Pat. No. 4,364,110 issued on Dec. 14, 1982;

(14) METHOD AND APPARATUS FOR SIGNAL ENHANCEMENT WITH IMPROVED DIGITAL FILTERING Ser. No. 550,231 filed on Feb. 14, 1975 and now U.S. Pat. No. 4,209,843 issued on Jun. 24, 1980;

(15) ILLUMINATION CONTROL SYSTEM Ser. No. 366,714 filed on Jun. 4, 1973 and now U.S. Pat. No. 3,986,022 issued on Oct. 12, 1976;

(16) PROJECTION TELEVISION SYSTEM USING LIQUID CRYSTAL DEVICES Ser. No. 730,756 filed on Oct. 7, 1976; now abandoned;

(17) DIGITAL AUDIONIC SYSTEM Ser. No. 752,240 filed on Dec. 20, 1976 and now abandoned;

(18) DIGITAL AUDIONIC SYSTEM Ser. No. 801,879 filed on May 31, 1977 now U.S. Pat. No. 4,144,582;

(19) DATA PROCESSOR ARCHITECTURE Ser. No. 844,765 filed on Oct. 25, 1977; now U.S. Pat. No. 4,523,290 issued on Jun. 11, 1985;

(20) INTELLIGENT DISPLAY SYSTEM Ser. No. 849,733 filed on Nov. 9, 1977 and now abandoned; and the present application is further a continuation in part of copending parent application which HIGH INTENSITY ILLUMINATION CONTROL SYSTEM Ser. No. 05/860,277 filed on Dec. 13, 1977 which in turn is a continuation in part of each application in the following chain of parent patent applications copending therebetween:

(1) FACTORED DATA PROCESSING SYSTEM FOR DEDICATED APPLICATIONS Ser. No. 101,881 filed on Dec. 28, 1970; proceedings therein having been terminated, and now abandoned.

(2) CONTROL SYSTEM AND METHOD Ser. No. 05/134,958 filed on Apr. 19, 1971; still pending in the PTO;

(3) CONTROL APPARATUS Ser. No. 05/135,040 filed on Apr. 19, 1971; still pending in the PTO;

(4) APPARATUS AND METHOD FOR PRODUCING HIGH REGISTRATION PHOTO-MASKS Ser. No. 229,213 filed on Apr. 13, 1972 and now U.S. Pat. No. 3,820,894 issued on Jun. 28, 1974;

(5) MACHINE CONTROL SYSTEM OPERATING FROM REMOTE COMMANDS Ser. No. 230,872 filed on Mar. 1, 1972; now U.S. Pat. No. 4,531,182 issued on Jul. 23, 1985;

(6) COORDINATE ROTATION FOR MACHINE CONTROL SYSTEM Ser. No. 232,459 filed on Mar. 7, 1972 and now U.S. Pat. No. 4,370,720 issued on Jan. 25, 1983;

(7) DIGITAL FEEDBACK CONTROL SYSTEM Ser. No. 246,867 filed on Apr. 24, 1972 and now U.S. Pat. No. 4,310,878 issued on Jan. 12, 1982;

(8) COMPUTERIZED SYSTEM FOR OPERATOR INTERACTION Ser. No. 288,247 filed on Sep. 11, 1972 and now U.S. Pat. No. 4,121,284 issued on Oct. 17, 1978;

(9) A SYSTEM FOR INTERFACING A COMPUTER TO A MACHINE Ser. No. 291,394 filed on Sep. 22, 1972 and now U.S. Pat. No. 4,396,976 issued on Aug. 2, 1983;

(10) DIGITAL ARRANGEMENT FOR PROCESSING SQUAREWAVE SIGNALS Ser. No. 05/302,771 filed on Nov. 1, 1972; still pending in the PTO;

(11) ELECTRONIC CALCULATOR SYSTEM RAVING AUDIO MESSAGES FOR OPERATOR INTERACTION Ser. No. 325,941 filed on Jan. 22, 1973 and now U.S. Pat. No. 4,060,848 issued on Nov. 29, 1977;

(12) ILLUMINATION CONTROL SYSTEM Ser. No. 366,714 filed on Jun. 4, 1973 and now U.S. Pat. No. 3,986,022 issued on Oct. 12, 1976;

(13) DIGITAL SIGNAL PROCESSOR FOR SERVO VELOCITY CONTROL Ser. No. 339,817 filed on Mar. 9, 1973 and now U.S. Pat. No. 4,034,276 issued on Jul. 5, 1977;

(14) HOLOGRAPHIC SYSTEM FOR OBJECT LOCATION AND IDENTIFICATION Ser. No. 490,816 filed on Jul. 22, 1974 and now U.S. Pat. No. 4,029,853 issued on Jun. 24, 1980;

(15) COMPUTERIZED MACHINE CONTROL SYSTEM Ser. No. 476,743 filed on Jun. 5, 1974 and now U.S. Pat. No. 4,364,110 issued on Dec. 14, 1982;

(16) SIGNAL PROCESSING AND MEMORY ARRANGEMENT Ser. No. 522,559 filed on Nov. 11, 1974 and now U.S. Pat. No. 4,209,852 issued on Jun. 24, 1980;

(17) METHOD AND APPARATUS FOR SIGNAL ENHANCEMENT WITH IMPROVED DIGITAL FILTERING Ser. No. 550,231 filed on Feb. 14, 1975 and now U.S. Pat. No. 4,209,843 issued on Jun. 24, 1980;

(18) ILLUMINATION SIGNAL PROCESSING SYSTEM Ser. No. 727,330 filed on Sep. 27, 1976; now abandoned;

(19) PROJECTION TELEVISION SYSTEM USING LIQUID CRYSTAL DEVICES Ser. No. 730,756 filed on Oct. 7, 1976; now abandoned;

(20) INCREMENTAL DIGITAL FILTER Ser. No. 754,660 filed on Dec. 27, 1976 and now U.S. Pat. No. 4,486,850 issued on Dec. 4, 1984;

(21) ANALOG READ ONLY MEMORY Ser. No. 812,285 filed on Jul. 1, 1977 and now U.S. Pat. No. 4,371,953 issued on Feb. 1, 1983;

(22) DATA PROCESSOR ARCHITECTURE Ser. No. 844,765 filed on Oct. 25, 1977; now U.S. Pat. No. 4,523,290 issued on Jun. 11, 1985;

(23) DIGITAL SOUND SYSTEM FOR CONSUMER PRODUCTS Ser. No. 05/849,812 filed on Nov. 9, 1977; now pending in the PTO; and

(24) INTELLIGENT DISPLAY SYSTEM Ser. No. 849,733 filed on Nov. 9, 1977 and now abandoned; and the present application is further a continuation of parent patent application A DYNAMIC MEMORY SYSTEM HAVING MEMORY REFRESH Ser. No. 07/457,451 filed on Dec. 27, 1989 now issuing; which parent application in turn is a continuation of ancestor patent application DATA PROCESSOR HAVING INTEGRATED CIRCUIT MEMORY REFRESH Ser. No. 343,112 filed on Apr. 24, 1989 now U.S. Pat. No. 4,896,260 issued on Jan. 23, 1990 which in turn is a continuation of ancestor patent application MONOLITHIC DATA PROCESSOR WITH MEMORY REFRESH Ser. No. 402,520 filed on Oct. 1, 1973 now U.S. Pat. No. 4,825,364 issued on Apr. 25, 1989 which in turn is a Divisional of ancestor patent application FACTORED DATA PROCESSING SYSTEM FOR DEDICATED APPLICATIONS Ser. No. 101,881 filed on Dec. 28, 1970 and now abandoned:

which parent application Ser. No. 457,451 is in turn a continuation of ancestor patent application SINGLE CHIP INTEGRATED CIRCUIT COMPUTER ARCHITECTURE Ser. No. 209,115 filed on Jun. 17, 1988 now U.S. Pat. No. 4,942,516 issued on Jul. 17, 1990; which in turn is a continuation-in-part of the following chain of patent applications:

1) METHOD AND APPARATUS FOR PROCESSING THE DIGITAL OUTPUT OF AN INPUT MEANS Ser. No. 879,293 filed on Nov. 24, 1969 now abandoned;

2) FACTORED DATA PROCESSING SYSTEM FOR DEDICATED APPLICATIONS Ser. No. 101,881 filed on Dec. 28, 1970 now abandoned which is a continuation in part of said ancestor patent application Ser. No. 879,293;

3) SINGLE CHIP INTEGRATED CIRCUIT COMPUTER ARCHITECTURE Ser. No. 860,253 filed on Dec. 14, 1977 now abandoned which is a continuation in part of said ancestor patent applications Ser. No. 879,293 and Ser. No. 101,881;

4) MICROCOMPUTER CONTROL OF MACHINES Ser. No. 860,256 filed on Dec. 14, 1977 now U.S. Pat. No. 4,829,419 issued on May 9, 1989 which is a continuation in part of said ancestor patent applications Ser. No. 879,293 and Ser. No. 101,881;

5) MONOLITHIC DATA PROCESSOR WITH MEMORY REFRESH Ser. No. 402,520 filed on Oct. 1, 1973 now U.S. Pat. No. 4,825,364 issued on Apr. 25, 1989 which is a continuation of said ancestor patent application Ser. No. 101,881; and 6) DATA PROCESSING SYSTEM Ser. No. 223,959 filed on Jan. 12, 1981 now abandoned which is a continuation of said ancestor patent application Ser. No. 101,881: and all by Gilbert P. Hyatt; where the benefit of the filing dates of all of the above-listed applications except for prior application Ser. No. 879,293 are herein claimed in accordance with the United States Code such as with 35 USC 120, 35 USC 121, and other authorities provided therefor;

where all of the above listed patents and patent applications are incorporated herein by reference as if fully set forth at length herein;

where one skilled in the art will be able to combine the disclosures in said applications and patents that are incorporated by reference with the disclosure in the instant application from the disclosures therein and the disclosures herein;

wherein the present application is further related to applications:

(1) ADAPTIVE ILLUMINATION SOURCE INTENSITY CONTROL DEVICE Ser. No. 152,105 filed on Jun. 11, 1971 by Lee, Wimmer, and Hyatt now U.S. Pat. No. 3,738,242 issued on Jun. 12, 1973;

(2) ADAPTIVE ILLUMINATION CONTROL DEVICE Ser. No. 325,792 filed on Jan. 22, 1973 by Lee, Wimmer, and Hyatt now U.S. Pat. No. 3,927,411 issued on Dec. 16, 1975;

(3) ILLUMINATION CONTROL SYSTEM Ser. No. 327,918 filed on Jan. 30, 1973 by Lee, Wimmer, and Hyatt now U.S. Pat. No. 3,818,496 issued on Jun. 18, 1974;

(4) INTERACTIVE CONTROL SYSTEM Ser. No. 101,449 filed on Dec. 28, 1970 by Lee et al and now abandoned in favor of a continuing application;

(5) MEANS AND METHOD FOR SELECTIVELY CONTROLLING ANIMALS Ser. No. 438,328 filed on Jan. 31, 1974 by Lee and Hyatt now U.S. Pat. No. 3,897,752 issued on Aug. 5, 1975; and (4) ELECTRO-OPTICAL PRINTER Ser. No. 754,647 filed on Dec. 27, 1976 by Stanly and Hyatt now U.S. Pat. No. 4,236,223 issued on Nov. 25, 1976;

wherein all of the above-referenced applications are herein incorporated by reference as if fully set forth at length herein.

BACKGROUND OF THE INVENTION

1. Field of the Invention

This invention is related to computer systems and in particular a computer system having integrated circuit computers, keyboards, sound response, and dynamic memories with memory refresh.

2. History of the Prior Art

Prior art data processors typically use magnetic memories such as core memories, thereby precluding a fully integrated circuit computer architecture. Although some prior art computers use integrated circuit memories, these computers use static (non-refreshable) integrated circuit memories; thereby precluding the advantages achievable with a fully integrated circuit computer and with dynamic (refreshable) integrated circuit memories.

Prior art data processors use core memories for program storage and for operand storage. The non-volatile characteristic of core memories, wherein information is preserved when power is removed, permits a program to be stored and preserved in the core memory. The electrically alterable characteristic of core memories permits operands to be stored and modified in the core memory. Such core memories are not producible with monolithic processes as used to manufacture integrated circuits, where the core memory is typically a large, expensive array of discrete elements.

The prior art is further shown in the prior art references cited in the prosecution hereof.

SUMMARY OF THE INVENTION

The present invention is directed towards integrated circuit computer systems having integrated circuit computers and dynamic memories with memory refresh. An integrated circuit dynamic memory having memory refresh is particularly advantageous for a monolithic data processor, which is a data processor wherein the digital portions including the memory portions may be produced with monolithic processes. A data processor architecture is provided that permits use of an integrated circuit read only main memory for program storage and an integrated circuit scratch pad memory for operand storage. Therefore, the memory portions of the data processor may be manufactured with integrated circuits to provide an integrated circuit or monolithic data processor.

This patent application is specifically directed to the keyboard input and sound output features of the present invention. The serial implementation disclosed herein is particularly advantageous for an integrated circuit computer system.

This patent application is also specifically directed to the dynamic integrated circuit memory feature of the present invention, which will now be described by summarizing various disclosures set forth in the instant application as-filed. Refresh of dynamic memory elements is exemplified by recirculation of the accumulator and scratch pad memories as described in the micro-operation description for the FA, FB, and FC micro-operations herein and as set forth in the $A_{15}D$ and $\overline{A_N\text{Clock}}$ logical equation in Table I herein. For example, refresh of "dynamic MOS-FET type integrated circuits" is provided by recirculation, exemplified by recirculation of the "A-Register" and the "SPM-Register" (FA, FB, and FC micro-operation descriptions herein) and further exemplified with the WO terms (implying the FA, FB, and FC micro-operations) in the $A_{15}D$ and $\overline{A_N}$ Clock logical equations (Table I herein).

Therefore, memory information can be refreshed in response to computer sequencing signals such as the WO signal and in response to computer micro-operation signals such as the FA, FB, and FC micro-operation signals to improve data processor utilization of memories.

An object of the present invention is to provide an improved computer system.

A further object of the present invention is to provide an improved system for operator interaction.

A further object of the present invention is to provide an improved batch fabricated system.

A further object of the present invention is to provide an improved multiple computer system.

A further object of the present invention is to provide an improved integrated circuit computer system.

A further object of the present invention is to provide an improved memory system.

A further object of the present invention is to provide an improved sound system.

The foregoing and other objects, features, and advantages of the present invention will become apparent from the following detailed description of preferred embodiments of this invention, as illustrated in the accompanying drawings.

BRIEF DESCRIPTIONS OF THE DRAWINGS

A better understanding of the invention may be had from a consideration of the following detailed description taken in conjunction with the following drawings, in which:

FIGS. 1(A) and 1(B) are block diagrams of the system comprising FIG. 1A showing a general purpose data processing system having audio response capability and FIG. 1B showing the audio response portion of the system of FIG. 1A.

Figure 2:
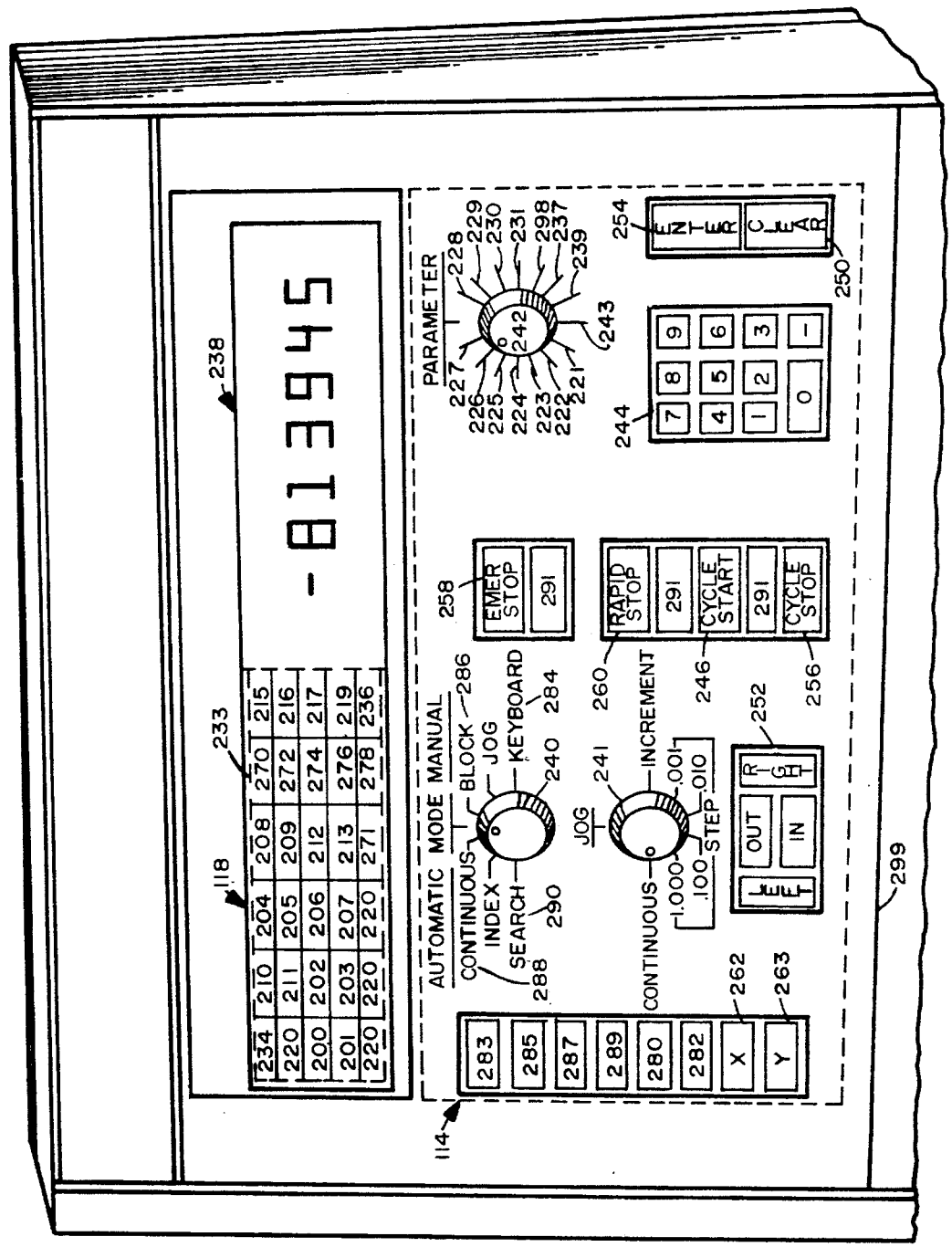
FIG. 2 is a diagram of the control and display panel.
Figure 3:
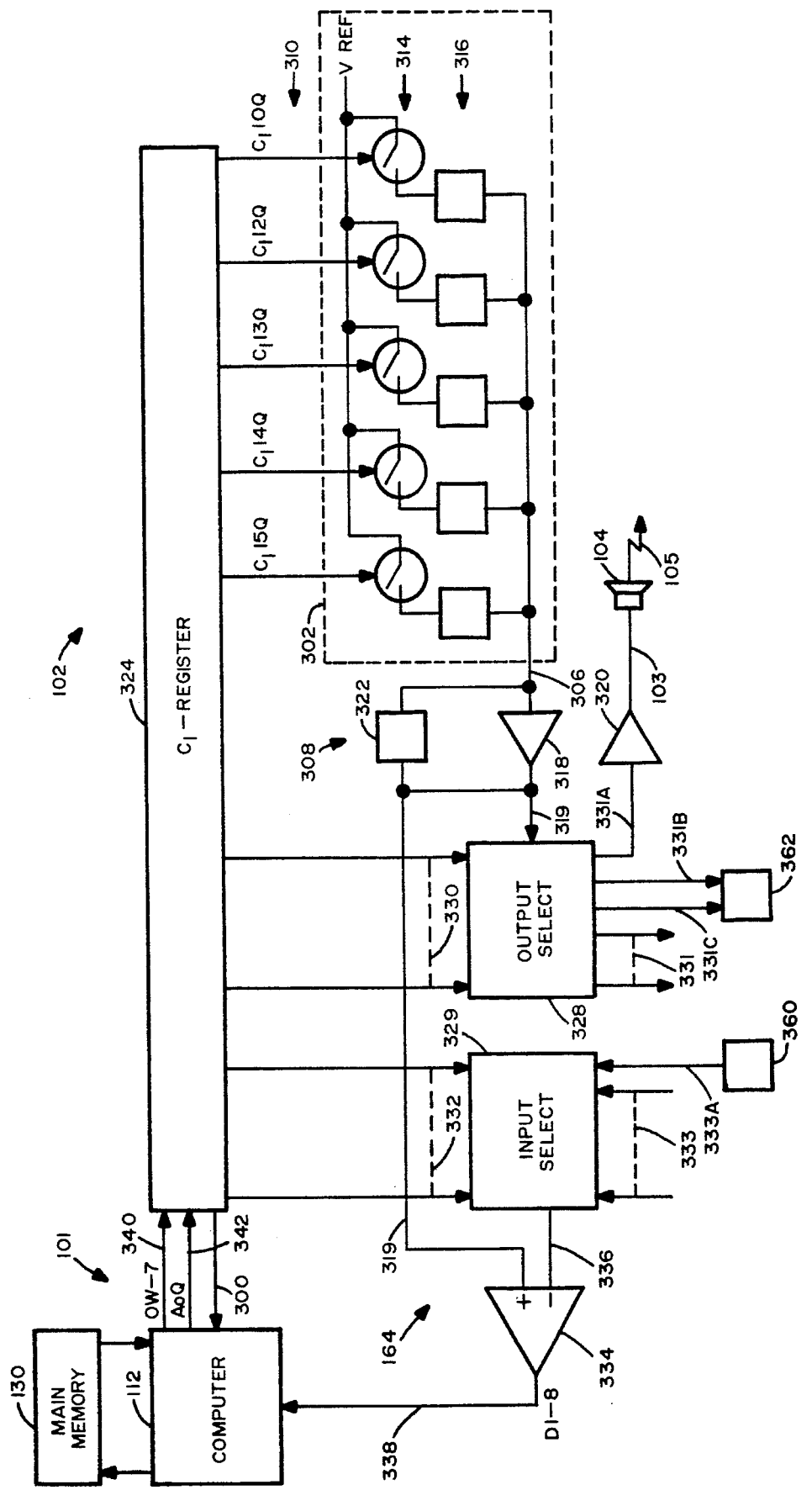
FIG. 3 is a block diagram and schematic diagram of the converter subsystem.
Figure 4A:
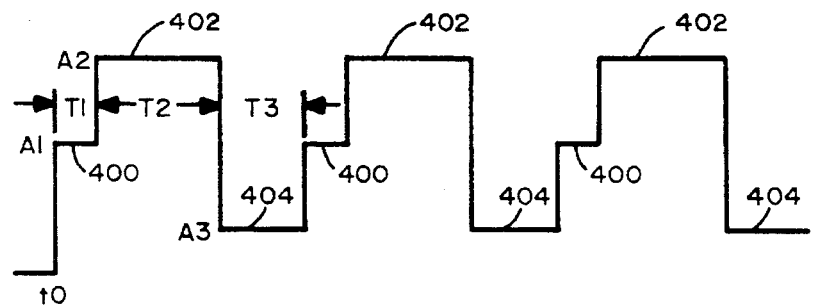
FIG. 4A shows a waveform to exemplify audio signal buildup.
Figures 1, 4B:
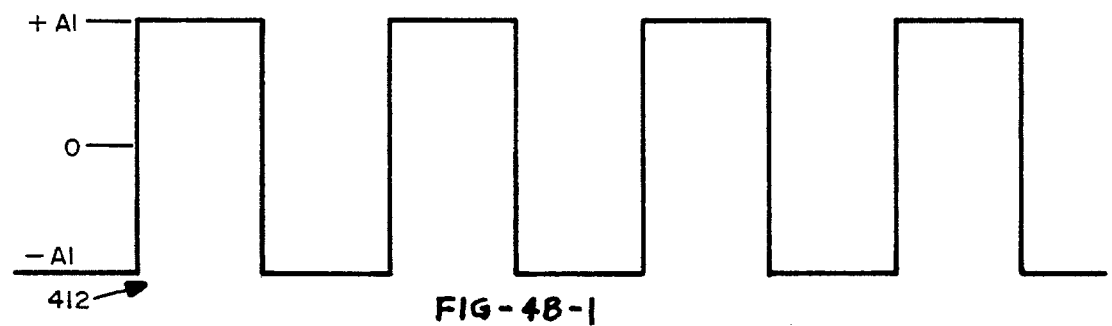
Figures 2, 4B:
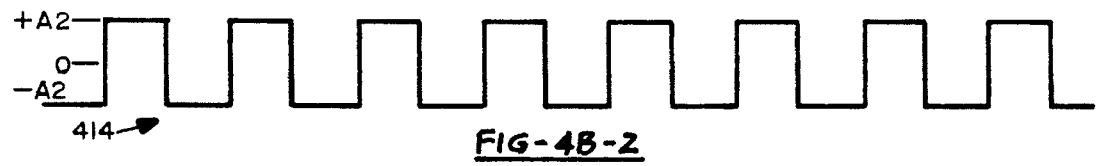
Figures 3, 4B:
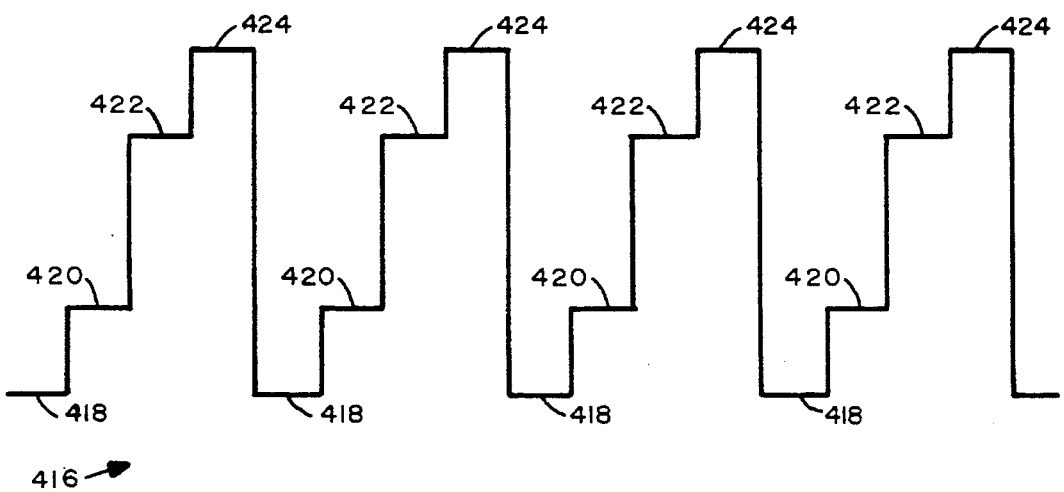

FIG. 4B; comprising FIG. 4B-1, FIG. 4B-2, and FIG. 4B-3; shows waveforms to exemplify audio signal buildup; where the first waveform shown in FIG. 4B-1 and the second waveform shown in FIG. 4B-2 are combined to form the third waveform shown in FIG. 4B-3 to exemplify audio signal buildup.

Figure 5C:
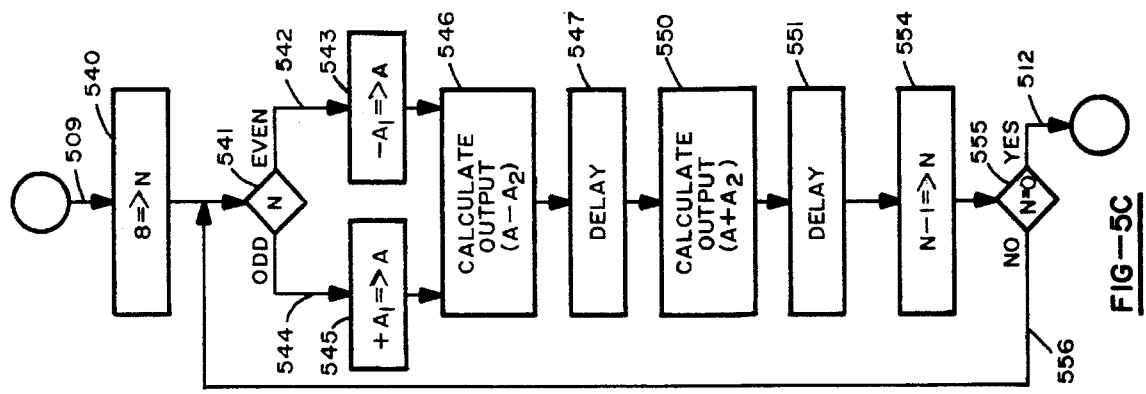
Figure 5B:
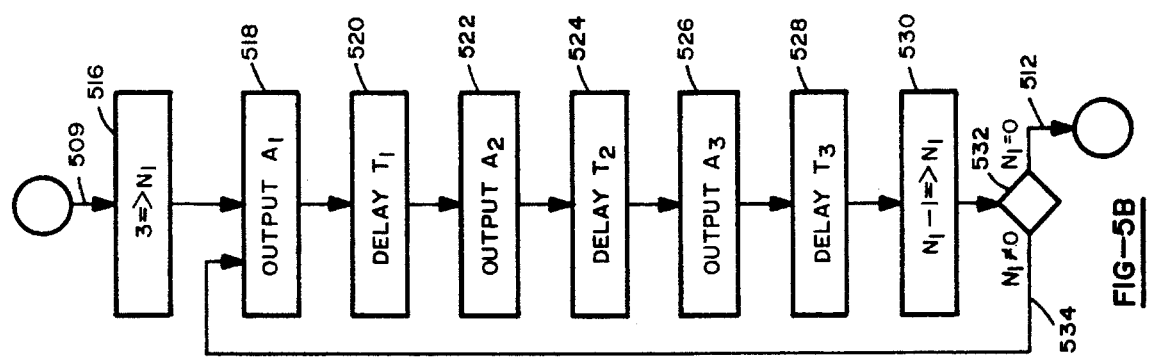
Figure 5A:
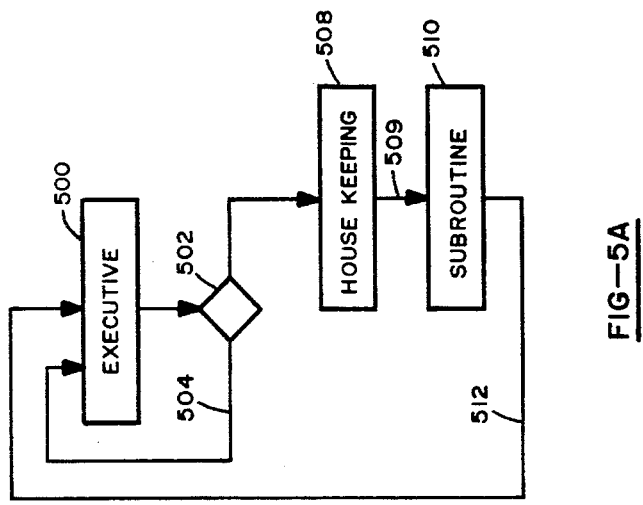
Figure 5D:
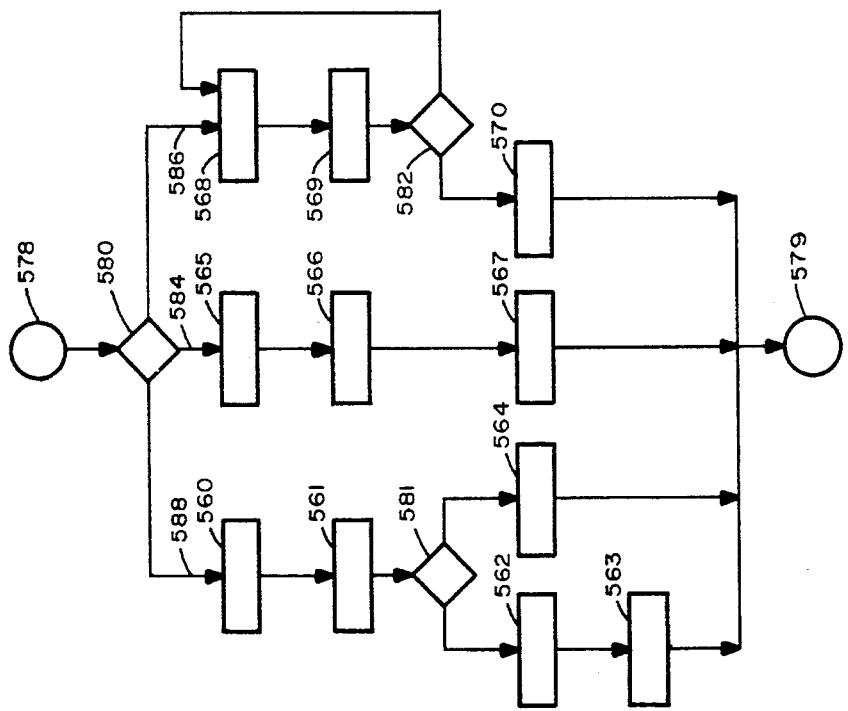

FIGS. 5A, 5B, 5C, and 5D show program flow diagrams of audionic operations comprising FIG. 5A showing an executive routine, FIG. 5B showing a flow diagram related to generating the waveform of FIG. 4A, FIG. 5C showing a flow diagram related to generating the waveforms of FIG. 4B, and FIG. 5D showing a flow diagram related to signal buildup.

Figure 6:
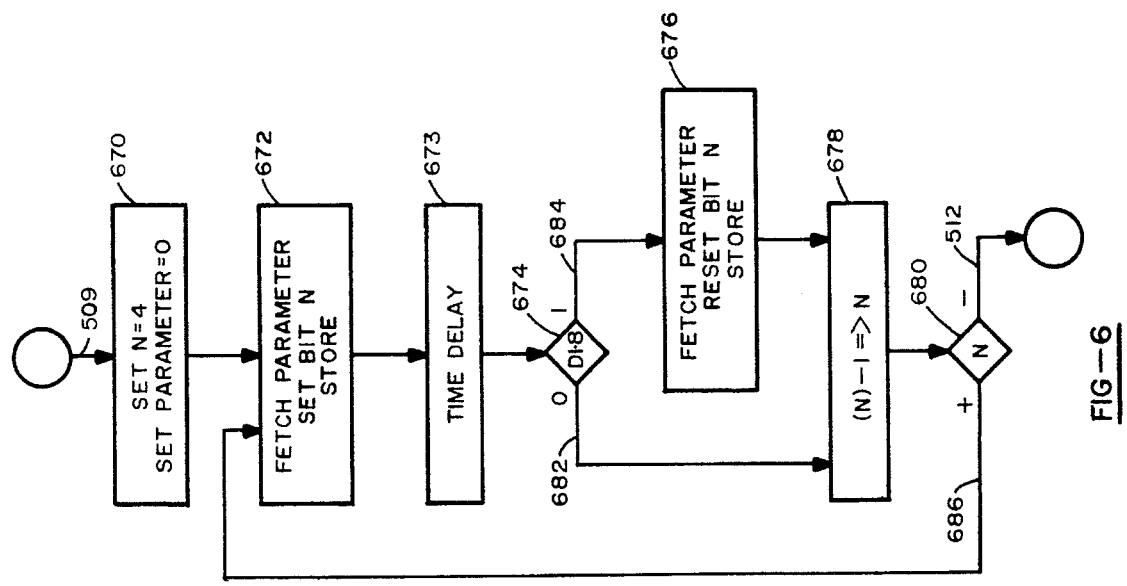

FIG. 6 shows a program flow diagram of converter operations.

Figure 7:
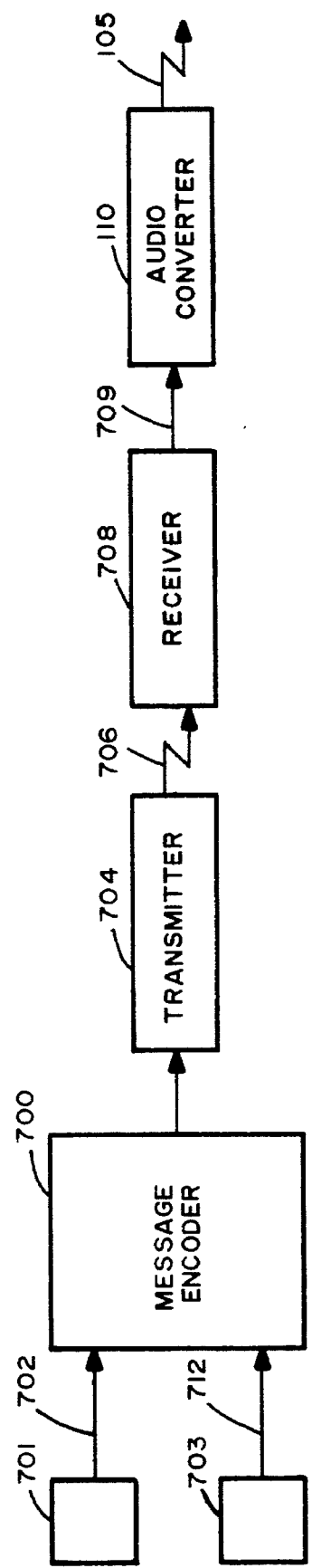

FIG. 7 is a block diagram of an audionic communication link.

Figure 8A:
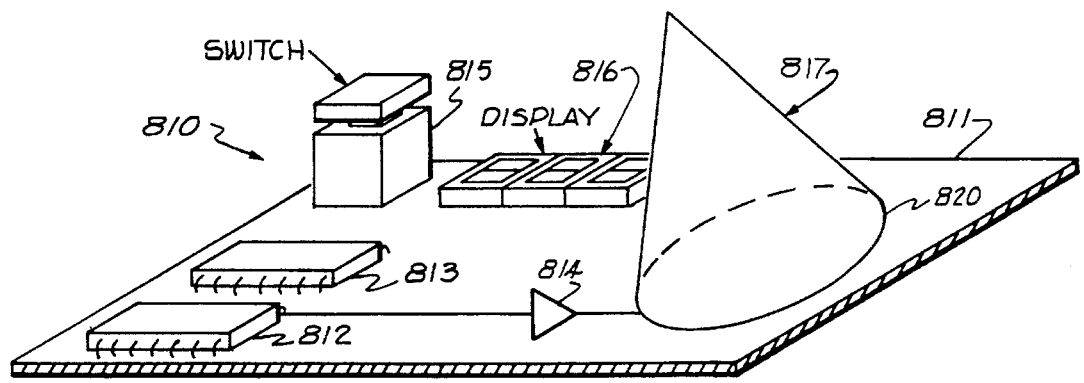
Figures 8B, 8C:
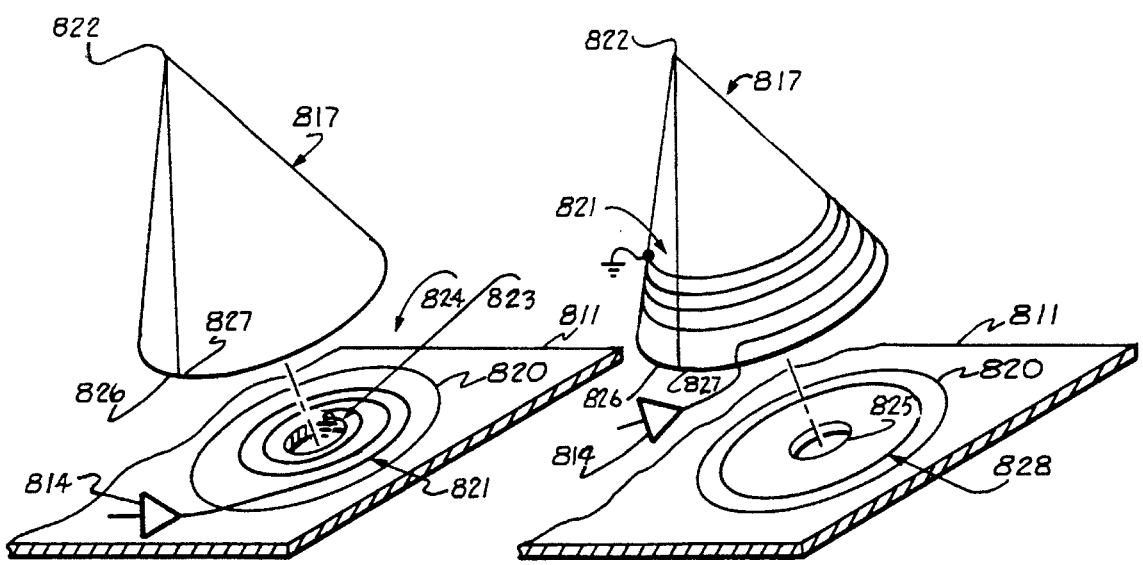
Figures 8D, 8E:
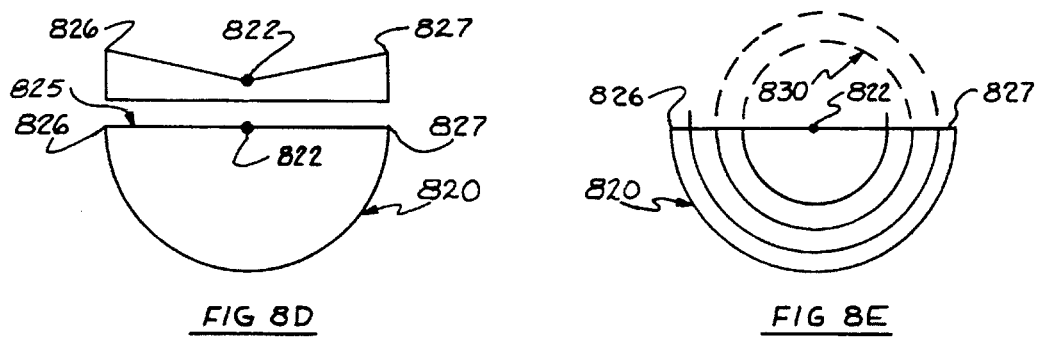

FIGS. 8A, 8B, 8C, 8D, and 8E show a batch-fabricated arrangement comprising FIG. 8A showing the batch-fabricated arrangement, FIGS. 8B and 8C showing batch-fabricated transducer embodiments, and FIGS. 8D and 8E showing batch-fabricated transducer construction.

Figure 9A:
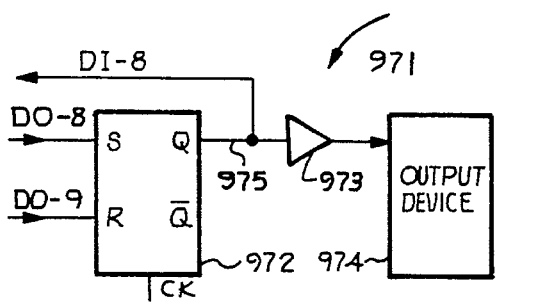
Figure 9B:
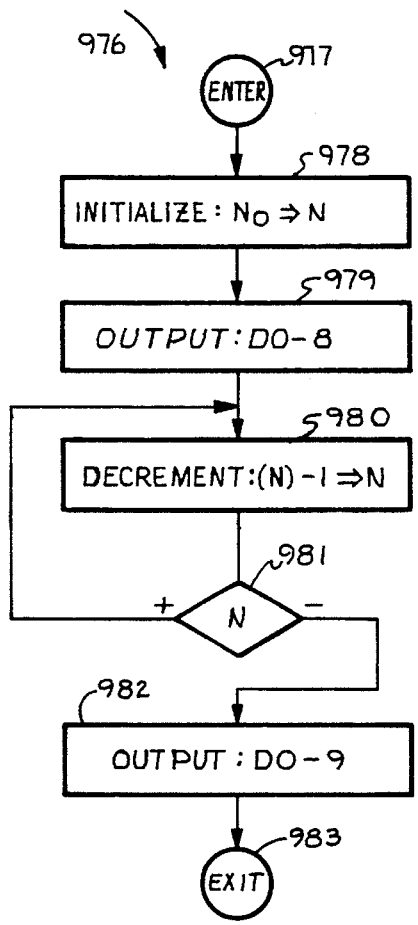
Figure 9C:
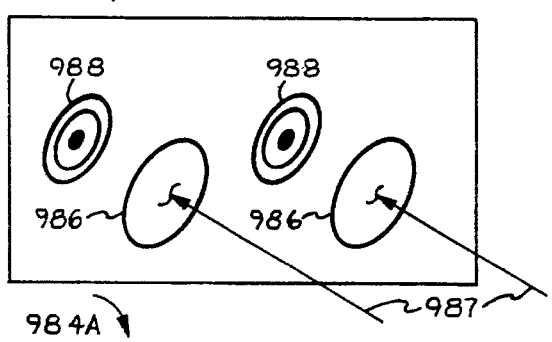
Figure 9C:
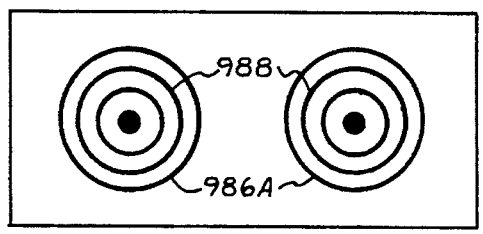
Figure 9C:
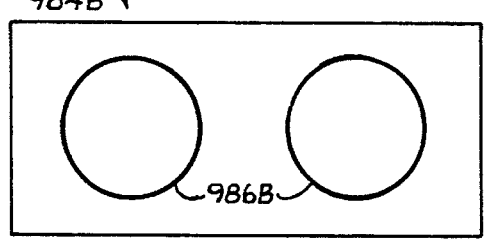
Figure 9D:
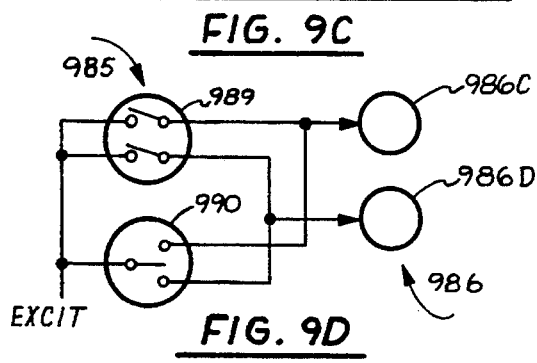
Figure 9E:
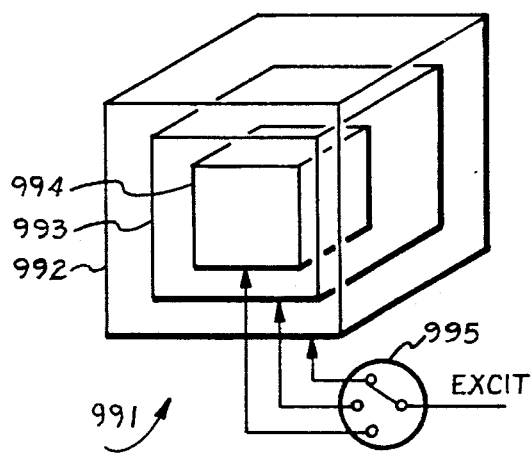

FIGS. 9A, 9B, 9C, 9D, and 9E shows pulse modulated and display arrangements comprising FIG. 9A showing a pulse modulation circuit, FIG. 9B showing a pulse modulation program flow diagram, FIGS. 9C and 9D showing a liquid crystal display arrangement, and FIG. 9E showing a liquid crystal toy.

Figure 1A:
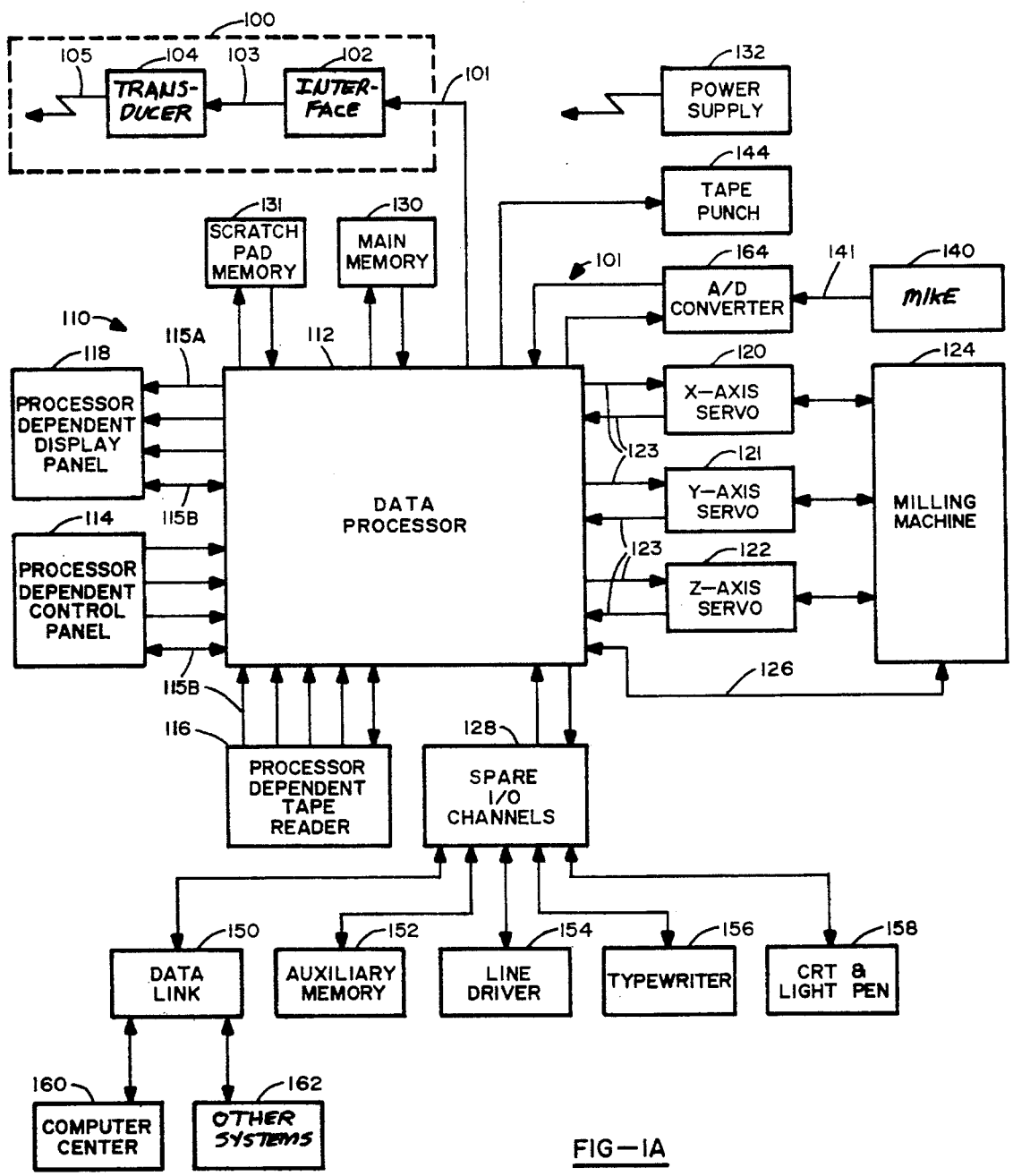

FIGS. 1A and 2 of this application are generally the same as FIGS. 1 and 2 in the previously referenced applications, Computerized System For Operator Interaction Ser. No. 288,247 and Factored Data Processing System For Dedicated Applications Ser. No. 101,881; with changes to make those figures compatible with the form and substance of the instant application.

By way of introduction of the illustrated embodiment, the components shown in FIGS. 1 through 9 of the drawings have been assigned general reference numerals and a brief description of such components is given in the following description. The components in each figure have in general been assigned three digit reference numerals wherein the hundreds digit of the reference numerals corresponds to the figure number. For example, the components in FIGS. 1A and 1B have reference numerals between 100 and 199 and the components in FIG. 2 have reference numerals between 200 and 299 except that the same component appearing in successive drawing figures has maintained the first reference numeral.

DETAILED DESCRIPTION OF THE INVENTION

Figure 1B:
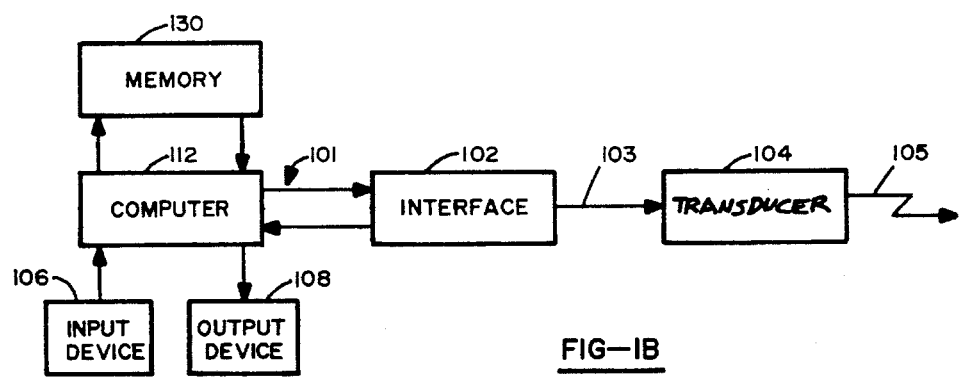

The audionic system of this invention can take any of a number of possible forms. A preferred embodiment of the present invention is shown in FIGS. 1A and 1B and will be described in detail hereafter.

This application is a continuation-in-part of the previously referenced applications Ser. No. 101,881 and Ser. No. 288,247 and relates more specifically to an audionic message system which may be provided by applying the general teachings of the parent applications to the specific context of this audionic system for operator interaction.

The system of this invention is exemplified by the system disclosed in the referenced related applications and shown in FIG. 1A. As discussed in the parent applications, the system peripherals and extremities may be changed to meet the requirements of the particular application while still exemplifying the teachings of that invention. For example, the data processing system 110 has been shown as a numerical control system for controlling a milling machine 124, where input and output peripheral subsystems have been described which are suitable for performing this desired control function in the previously referenced application Ser. No. 101,881. However, those skilled in the art will readily recognize that the numerical control system is merely illustrative of the present invention and the principles of that invention are equally applicable to other systems such as audionic systems described herein in which different forms of input and output peripheral subsystems might be used to perform the particular task of such other systems. An audionic subsystem is shown in FIG. 1B to illustrate the audionic application of the system of this invention.

In the preferred embodiment, the system of this invention is a dedicated data processing system; where the data processor 112 is a stored program data processor committed to one or more prime tasks. As shown in FIGS. 1A and 1B, the data processor 112 performs a system prime task under program control such as the numerical control of a machine 124 or such as calculator processing in conjunction with an operator through control panel 114 and display panel 118. In the system of this invention, an audionic subsystem 100 including audionic interface 102 and transducer 104 is provided for operator communication, where the peripherals not required for this audionic system such as the machine 124 of the numerical control application are not included in the system.

The data processor 112 may also perform system subtasks such as processor coaction for operation of a peripheral as discussed for the factored or integrated data processing system of the parent applications and as discussed for the analog-to-digital (A/D) converter hereafter.

It is within the scope of this invention to provide a display panel 118 as an auxiliary operator interface in the audionic system and may be refreshed such as under computer program control as described in detail in the referenced applications. It is still further within the scope of this invention to provide computer processing of switch rudimentary signals as discussed in the referenced applications.

The data processor 112 operates under control of a program stored in the main memory 130 and may operate in conjunction with a scratch pad memory 131. As discussed in the parent applications, the preferred embodiment of this data processor is as a monolithic data processor, where the main memory 130 is an integrated circuit read only memory and the scratch pad or intermediate memory 131 is an integrated circuit alterable memory.

The data processor 112 operates in conjunction with a plurality of peripherals which include an audionic subsystem which is shown in FIGS. 1B and 3 and which may include an operator panel such as the control panel 114 or display panel 118 or both, which are shown in more detail in FIG. 2; a tape reader 116 which may be a punched tape reader; a data link 150 to communicate with a computer center 160 and other systems 162; an auxiliary memory 152 such as a rotating memory or other well known memory; line drivers and receivers 154 to communicate with various other subsystems; a typewriter 156; a CRT display and light pen 158; and other such subsystems.

A reduced block diagram is shown in FIG. 1B where the system of FIG. 1A is reduced to the specific form of an audionic system. Processor 112 is responsive to information stored in memory 130 to provide audionic messages 101 to audionic interface 102 to control transducer 104 with signals 103. The transducer provides audio (sound) signals 105 in response to electrical control signals 103. The data processor 112 is a stored program data processor in a preferred embodiment but may be a special purpose logic device in other embodiments. The interface 102 accepts digital command signals 101 and generates transducer control signals 103. In a preferred embodiment, audionic interface 102 includes a D/A converter and amplifier to drive transducer 104 with analog control signals 103. A preferred embodiment of a D/A converter 302 is discussed in detail hereafter. Other embodiments will become obvious to those skilled in the art. In other embodiments, audionic interface 102 can be implemented with other control arrangements, where control signals 103 may be digital drive signals or other such signals. It will become obvious to those skilled in the art that other control or signal processing arrangements can be provided for interface 102 that will be responsive to digital command signals to provide the speech messages.

The audionic transducer 104 may be a well known speaker or earphone for generating sound waves in an air medium or may be another type of transducer that impresses audionic signals on other medium such as in water or on a bone. Therefore, audionic signals may include sound waves, speech waves, vibration, and other such signals. Various input subsystems 106 and output subsystems 108 may also be included in the audionic system as required by the application.

As shown in FIG. 5, a parallel output register 324 receives digital signals 101 from data processor 112 to excite D/A converter 302. Register 324 is exemplified by the $C_I$ Register shown in FIGS. 13 and 15 of the referenced application Ser. No. 101,881. The digital signals $C_{I15}Q$ through $C_{I10}Q$ select analog switches 314, which may be FET switches or other well known circuits, to selectively excite the resistor ladder 316 to sum the signals from switches 314 to generate analog signal 306.

Amplifier 318 and power amplifier 320 will buffer, filter, and amplify analog signal 306 to generate signal 103 to drive the sound transducer 104. Other circuit arrangements will become obvious to those skilled in the art.

Operation of the audionic device is generally described with a constant sample rate or a constant period between sample updates. An added degree of flexibility and optimization is achieved with a variable sample rate or update period. As will be discussed hereafter in conjunction with the waveform of FIG. 4A and the program flow chart of FIG. 5B, a programmable period T is provided to decrease the required number of samples, to increase audio fidelity, and to generally increase the flexibility of the audionic system.

The operation of this invention will be better understood with a simple example. A repetitive square wave waveform is illustrated in FIG. 4A. This waveform is characterized by amplitudes $A_1$ 400, $A_2$ 402, and $A_3$ 404 with corresponding periods $T_1$, $T_2$, and $T_3$. If this waveform were properly amplified and used to excite a speaker transducer, a characteristic sound would be generated.

A preferred embodiment of the apparatus to generate this sound is shown in FIG. 5. The digital data processor 112 accesses digital sound information from a digital audionic memory such as the main memory 130 of the data processor 112 or an auxiliary memory 152. The digital memory may be a core memory, an integrated circuit read only memory, a rotating memory such as a drum or disc, or other such memory. In a preferred embodiment, an integrated circuit read only memory is used. The digital signals 101 are transferred to a D/A converter 302 which converts the digital signals 101 to analog sound signals 306. These analog sound signals 306 are processed with an audio signal processor 308 which may include amplifiers 318, 320 filters 322; and other audio signal processor devices. The processed analog sound signals 103 are used to drive a sound transducer 104 to generate audiable sound 105. This sound must be of the proper amplitude and frequency to be detected in a useful form at the destination, which is typically the human ear.

An audionic system can provide a plurality of time shared outputs. As shown in FIG. 3, the computer 112 can sequentially select a plurality of output channels 331 with addresses 330 to select logic 328. Each output channel 331 can be an audionic channel as illustrated for channel 331A with amplifier 320 and transducer 104, where amplifier 320 can provide a sample-and-hold capability to enhance time share operation. This multiple output system can be used for a system having a plurality of operators such as an airplane with a flight crew, an audionic testor for a plurality of patients being tested, or other such applications.

Human factor considerations may be related to size such as with visual displays that must be of a size sufficient for an operator to conveniently resolve the visual message. Therefore, the degree of miniaturization of a system with a visual display has an inherent limitation. The audionic system of this invention has virtually no miniaturization limitation related to human factors considerations, where the audionic message may be interpreted by an operator with little consideration for physical dimensions such as will become obvious to those skilled in the art.

Because the audionic system has no practical size requirement such as discussed for human factor requirements for visual displays, fuller advantage may be taken of monolithic technology and smaller less expensive systems may be configured with audionic devices than with display devices.

Improved miniaturization characteristics can be achieved with the digital audionic system of this invention over the analog filter and mechanical prior art arrangements, where the digital audionic arrangement is more adaptable to monolithic LSI implementation.

Display systems require adequate structure to mount the display elements in an orientation adequate for operator viewing. The line-of-sight viewing requirements of visual displays pose further requirements for structure and for location and orientation of the display. The audionic system is not constrained by the mounting of elements nor line-of-sight requirements. For example, an audionic system can be located in a pocket, remote from the operator's area of attention, and other such degrees of freedom which will permit optimization of configuration and useage.

The audionic system of this invention has particular advantages when constructed as a monolithic audionic system. This monolithic audionic system is intended to mean a system where the audionic portions are constructed mostly of integrated circuits with well known monolithic or integrated circuit processes. All parts of the audionic device, possibly with the exception of the audionic transducer 104, lend themselves to the monolithic process. For example, the monolithic data processor 112 and monolithic read only memory 130 are discussed in the referenced application Ser. No. 101,881, and may use a monolithic D/A converter 302 and monolithic amplifier 318. These monolithic elements may be manufactured on a single integrated circuit chip or on a plurality of integrated circuits chips. To provide a monolithic audionic system, it is not necessary that all of these elements be monolithic elements, but it is preferred that broad use be made of monolithic elements.

A particularly efficient arrangement uses the well known large scale integration (LSI) processes and technology to construct the monolithic audionic devices. Such LSI processes may be MOS-FET or bipolar integrated circuit processes.

Human factors considerations associated with visual and audio communication are heavily weighted in favor of audio communication. An operator must make a conscious effort to view a visual display, distracting attention from other tasks. In contrast, an operator can receive an audio message without significant distraction of attention. Generally, a visual message must be continually presented to assure that it is available when viewed by an operator, but an audio message is typically intermittant in nature and accepted by an operator when presented. An example is presented herein for an audionic calculator, where the operator can accept a single audionic message independent of other operator activity even though the message is provided only once and at a time when the operator is concentrating on other activities. In contrast, it will be obvious that a visual display must be continuously generated to insure that the operator receives the message at an arbitrary time at which the operator may view the display. The audionic message is an active message that commands operator attention and the visual message is a passive message that awaits operator attention.

Because of the active, intermittant nature of audio messages and the passive, continuous nature of visual messages; a lower power audionic system may be arranged which dissipates substantially less power than a comparable visual display system. This low power arrangement for the audionic system can be related to the generation of audionic messages intermittently when required rather than continuously repeating the message. It has been found that an intermittant audionic message is actually preferred because a continually repeated message can be displeasing to an operator; yet an intermittant message such as generated upon operator interrogation is satisfactory and usually most desireable. It has been found that the duty cycle of an audionic message may be less than 1% of the operating time for many applications. With the audionic clock, the duty cycle may be only 0.01% based upon approximately five interrogations per day. Therefore, it can be appreciated that the average power dissipation can be extremely low for intermittant operation.

With the intermittant operation consideration discussed above, it has been found that power dissipation can be further reduced by minimizing the standby power of the audionic portions of the system such as the D/A converter 302 and amplifiers 318, 320. This can be accomplished with an embodiment using a circuit design that has low standby power dissipation such as when biased to cutoff. Another embodiment uses a design that incorporates a switch to turn off the power supplied to selected audionic elements. This power switch may be controlled by processor 112, may be an interrogation switch actuated by the operator, or other devices that will become obvious to those skilled in the art.

The audionic memory is presented herein as a portion of main memory 130, which is a monolithic read only memory in a preferred embodiment. It will become obvious to those skilled in the art that other type memory devices may be used to store audionic information. Well-known flip-flop memories such as shift registers and RAM memories can store audionic information. Also magnetic memories such as the well known core memories and rotating memories (drum and disc memories) can also be used to store audionic information. Special memory arrangements such as the "bubble memory" may also be used to store audionic information. This stored audionic information is intended to mean the information used to construct the audionic messages such as speech samples; amplitude, time, and frequency information; subroutines to construct messages; and other such information.

The economy of the audionic device can be defined with an example. Assuming that a 1 KHz frequency response and a 5 bit (1 part in 32) resolution is acceptable for speech fidelity, then a sample rate of twice this frequency, 2 KHz may be used. This relates to a data rate of:

(2,000 samples/second) (5 bits/sample)=10,000 bits/second

Also assuming that speech averages one word per half second and that large scale integration (LSI) read only memory (ROM) costs 0.1 cent per bit, then the cost per word is:

(10,000 bits/second) (½ second/word)($10$^{-3}$/bit)=$5/word

An audionic system such as a calculator system or clock system would require approximately 20 words including the ten numbers 0–9 and various control words. At the rate of $5/word, a 20 word audionic system would require $100 for the LSI-ROM audionic memory.

The above example was based upon storing each sample in sequential fashion. Significant economies can be achieved by using audionic optimization techniques such as discussed herein. It is estimated that the memory requirement can be reduced by 75% with the use of audionic optimization, yielding an LSI-ROM audionic memory costing only $25 for the system in the above example.

Another consideration associated with the audionic optimization arrangement is that the frequency response can be increased substantially without greatly increasing the audionic memory requirement. It is estimated that the frequency response can be increased by 500%, from 1 KHz to 5 KHz, with only a 50% increase in audionic memory cost, from $25 to $37.50 when the optimized subroutine arrangement is used as compared to merely the storage of samples for each sample period.

The system of this invention may be further characterized as a digital audionic system, where the digital devices build-up audionic messages in the digital domain using various digitally generated frequency and amplitude components. This digital audionic system is more than a programmable control for audio oscillators and filters, but eliminates the need for such devices with digital operations. This system may be still further characterized as an interactive audionic system, where the audionic responses are generated in response to and in an interactive manner with an operator operating a device. As an example, the operator depresses calculator keys and receives audionic messages as continuous interactive feedback for proper operation.

The terms computer and data processor used herein are intended to include a stored program data processor. The preferred embodiment of a stored program data processor is presented in the previously referenced application Ser. No. 101,881. It will be obvious that a stored program data processor is unique in that the operation of such a data processor is determined by a stored program. This stored program may be contained in a uniquely definable main memory as shown schematically in FIGS. 1A and 1B. This block diagram representation is in accordance with prior art memories, such as core memories or rotating memories. In the preferred embodiment of this invention the main memory 130 is an integrated circuit read only memory. This arrangement is unique because the integrated circuit processes required to manufacture the main memory 130 may be the same as the integrated circuit processes required to manufacture the data processor, thereby permitting an integrated monolithic data processor and stored program memory to be fabricated together. A well defined boundary between processor means and stored program memory means may not exist in a factored data processor subsystem. Therefore, a more generalized data processor must be visualized wherein the stored program may be an integral part of the data processor. Similarly, because of the low cost and flexibility of this integrated circuit read only memory, part of the data processor logic may be implemented in this read only memory just as part of the extremity logic is implemented in this read only memory. One characterization of the stored program of this monolithic data processor is a repetitive array of memory elements that defines the operation of the data processor which constitutes a stored program. This main memory contains a group of digital conditions or instructions accessed sequentially from the main memory and executed in the data processor to perform data processor tasks such as computational and control tasks. The data processor is responsive to program routines or groups of these instructions to perform data processor operations and system operations.

A preferred embodiment of the audionic system of this invention is implemented with integrated circuit techniques which are well known to those skilled in the integrated circuit art. Integrated circuits are monolithic devices that are fabricated in the form of individual "chips". A monolithic arrangement may be fabricated on a single chip such as with the well known LSI circuits or on a plurality of chips that are interconnected together. A read only memory integrated circuit may be arranged as a monolithic array of read only memory bits. An alterable memory integrated circuit may be arranged as a monolithic array of alterable memory bits. Because of the common integrated circuit processes, various logic, circuit, and memory arrangements may be integrated together; thereby eliminating conventional prior art partitioning boundaries. Other characteristics of monolithic integrated circuit technology may be used to advantage to implement this invention, as will become obvious to those skilled in the art.

AUDIONIC PROGRAM OPERATIONS

The data processor 112 executes the executive program to control all program operations and provide for time sharing with program routines. The data processor detects inputs and conditions with the executive program, then transfers to the various program subroutines necessary to perform the computations and generate the outputs. The data processor can execute programs on a time shared basis by branching out of subroutines such as on a sequential, interrupt, or priority basis as is well known in the art. For simplicity of description, relatively complex program operations such as time sharing operations are not shown in the flow diagrams in FIGS. 5A–5D and 6; but will become obvious to those skilled in the art. The data processor stored program operation will be described hereafter. The data processor 112 is responsive to a stored program contained in main memory 130 to provide this processing capability. Operation of the data processor 112 is controlled by the executive routine 500 where the executive routine accesses the subroutines to be executed, sets the priority of these subroutines, defines the timing, and other such well-known operations. The executive routine 500 will control the data processor to periodically test the real time parameter in operation 502 to determine if it is time to enter one of the real time subroutines; where the real time parameter may be derived from a real time clock, a program timer in the executive routine 500, or other well known means and methods for deriving this parameter. In one embodiment, this timer may be implicit in the stored program, where a transfer to the appropriate subroutine is provided after a certain number of instructions have been executed, thereby implying the required real time period. If the required periods have not expired, the data processor will return to the executive routine along path 504. If one of the required periods has expired to within the required tolerance, the data processor will preserve the return address and other parameters for reentry to the executive routine 500 and perform other required housekeeping functions in operation 508, then the data processor will enter the subroutine 510 along path 509 to perform the required program operations. The data processor will exit the subroutine by fetching the return address, preserved in operation 508, then transferring back to the executive routine 500 along path 512.

Audionic signals carry information in the frequency and amplitude characteristics. These characteristics are determined primarily by the data processor 112 and to a minor extent by the other system devices 302, 308, and 104. The data processor 112 operates under program control to generate the required digital sound signals 101. A simple program flow diagram to provide digital sound signals is shown in FIG. 5B which corresponds to the digital sound signals shown in FIG. 4A. The program enters the subroutine along path 509 to operation 516 which sets up the initial conditions for the subroutine. One of these initial conditions is preloading the constant "three" into a storage location defined as $N_1$ to provide three iterations for three repetitive cycles of the waveform, shown repetitively in FIG. 4A. The computer then executes operation 518 by fetching the $A_1$ parameter and outputting this parameter to the D/A converter 302 to generate the $A_1$ amplitude 400. The computer 112 then executes operation 520 which provides a $T_1$ period time delay. The computer then executes operation 522 by fetching the $A_2$ parameter and outputting this parameter to the D/A converter 302 to generate the $A_2$ amplitude 402, followed by execution of operation 524 which provides a $T_2$ period time delay. The computer then executes operation 526 by fetching the $A_3$ parameter and outputting this parameter to the D/A converter 302 to generate the $A_3$ amplitude 404, followed by execution of operation 528 by providing a $T_3$ period time delay. The computer then executes operation 530 which decrements the N parameter to define the number of iterations through this subroutine which are still required for a total of three cycles of the waveform shown in FIG. 4A. The computer then tests the N parameter in operation 532. If the N parameter is greater than zero, additional iterations are required to generate the total of three cycles of the waveform, so the program loops back along path 534 for additional cycles of the repetitive waveform. If the N parameter in operation 532 is equal to zero, then the three waveform cycles have been generated and the program branches along path 512 to exit the subroutine.

Complex audio waveforms may be considered to be the superposition of many frequency components with associated scale factors such as defined by well known mathematical methods typified by the Fourier series. The digital superposition of two squarewaves will now be described to exemplify the superposition arrangement for building-up audionic messages. More complex waveforms can be generated by using the teachings of this invention, which will now become obvious to those skilled in the art. For example, sine waves can be substituted for the squarewave of this example; complex phase, frequency, and amplitude combinations can be used; many different waveforms can be superimposed (not limited to two waveforms); and such other extensions of this technique.

As shown in FIG. 4B, waveform $A_2$ 414 will be superimposed on waveform $A_1$ 412 to generate waveform 416. The superimposed waveform is generated with a program shown in the program flow chart of FIG. 5C. In general, this program generates a component of the $A_1$ squarewave 412, then superimposes a component of the $A_2$ squarewave 414 on the $A_1$ squarewave 412. For illustrative purposes the example will be shown with waveform $A_2$ 414 exactly one half of the frequency of waveform $A_2$ 412. Also for simplicity, the program iterations will be shown synchronized to the iteration parameter (N).

The computer 112 enters the superposition subroutine alone path 509 and initializes the cycle counter parameter N to eight for eight half cycle periods of the $A_1$ waveform 412 in operation 540. The computer then tests the N parameter in operation 541 to determine if the $A_1$ waveform 412 is on a negative or positive half cycle as determined by the N parameter being even or odd, respectively. For the first iteration N=8 and for each alternative iteration N is an even number; so the computer branches along path 542 and loads the $-A_1$ amplitude parameter into the A parameter storage location in operation 543. The computer then executes operation 546 by adding the A parameter which is now $-A_1$ to the $-A_2$ parameter and outputting the sum $(-A_1-A_2)$ to the audionic subsystem 100 to generate signal level 418. The computer then executes a time delay for the sample period in operation 547 and then executes operation 550 by adding the A parameter which is now $-A_1$ to the $+A_2$ parameter and outputting the sum $(-A_1+A_2)$ to the audionic subsystem 100 to generate signal level 420. The computer then executes a time delay for the sample period in operation 551 and then executes operation 554 by decrementing the N parameter, indicative of the completion of a negative $(-A_1)$ half cycle period of the $A_1$ waveform. The computer then tests the N parameter in operation 555. If N is not equal to zero, then the computer loops back to operation 541 along path 556. If N is equal to zero, then the computer exits the subroutine along path 512, indicative of eight half cycle periods of the $A_1$ waveform being generated. For the second iteration, the computer next tests the N parameter in operation 541 to determine if the $A_1$ waveform 412 is on a negative or positive half cycle. For the second iteration N=7 and for each alternative iteration N is an odd number; so the computer branches along path 544 and the $+A_1$ amplitude parameter is loaded into the A parameter storage location in operation 545. The computer then executes operation 546 by adding the A parameter which is now $+A_1$ to the $-A_2$ parameter and outputting the sum $(+A_1-A_2)$ to the audionic subsystem 100 to generate signal level 422. The computer then executes a time delay for the sample period in operation 547 and then executes operation 550 by adding the A parameter which is now $+A_1$ to the $+A_2$ parameter and outputting the sum $(+A_1+A_2)$ to the audionic subsystem 100 to generate signal level 424. The computer then executes a time delay for the sample period in operation 551 and then executes operation 554 by decrementing the N parameter, indicative of the completion of a positive $(+A_1)$ half cycle period of the $A_1$ waveform. The computer then tests the N parameter in operation 555. If N is not equal to zero, then the computer loops back to operation 541 along path 556. If N is equal to zero, then the computer exits the subroutine along path 512, indicative of eight half cycle periods of the $A_1$ waveform being generated.

The computer will continue to iterate through the subroutine shown in FIG. 5C until the N parameter is decremented to zero, where the test in operation 555 will then cause the computer to exit the subroutine along path 512.

A more detailed description of the executive program will now be discussed to better illustrate the operation of this invention. FIG. 5D shows an example of how the executive program selects the appropriate subroutines, shown as rectangular blocks 560–570, in sequence or based upon decision elements, shown as diamond blocks 580–582. The computer 112 executes the executive program and associated program routines to build-up the audionic message. Although only a few subroutines are illustrated, it will become obvious to those skilled in the art that the sub-message sounds can be built-up virtually without limit to provide almost any type of audionic message.

For the example shown in FIG. 5D, the computer will enter this routine through operation 578 and exit through operation 579 to perform the illustrated operations. The decision operation 580 will cause the computer to follow baths 584, 586, or 588; dependent upon the message selected. Path 584 will cause the execution of subroutines 565–567 to provide a fixed sequence of sounds to be built up. Path 586 will cause the execution of subroutines 568–570, where subroutines 568 and 569 may be executed for a plurality of times to build up a repetitive pattern of sub-sound elements as defined by execution of decision element 582. Path 588 will cause the execution of subroutines 560–564, where either subroutines 562 and 563 or subroutine 564 may be executed as controlled with decision operation 581.

Subroutines may be re-entrant, where the return address is preserved upon entry for return to the executive routine. Multi-level subroutines may be programmed, where subroutine 566 may transfer to the subroutine group 568–570 with a re-entrant transfer to subroutine 568 and a return from subroutine 570. The subroutine group entered in operation 578 and exited in operation 579 may be a re-entrant subroutine group with a transfer to operation 578 and a return from operation 579.

Subroutines 560–570 may each provide a relatively simple sub-sound element, but when executed in conjunction with a plurality of other subroutines, may build-up a complex sound message.

Various sub-sounds may be generated with subroutines and then combined such as with superposition or other techniques to build up more complex sounds. For example, subroutines 565 and 566 may each generate sub-sounds of different frequencies, shapes, and amplitudes and subroutine 567 may combine these sub-sounds to provide a more complex sound pattern.

The packing and unpacking program operations will now be discussed.

A packed discrete word may be considered to be a word with a plurality of condition bits representing command conditions or status conditions. For example, the data processor can output a discrete packed word with command conditions to an interface register to command various discrete machine functions and the computer can input a packed discrete word with status conditions from an interface register to define various discrete machine status conditions. The packing and unpacking of condition bits is performed under program control and provides interface hardware efficiency. It should be noted that a discrete condition may be a single binary bit either in the one or zero state located in a particular bit position of a digital word or may be a plurality of bits set in an array of one or zero states to define a more complex condition. As an example, a single bit may be sufficient to control the spindle on or off condition but a plurality of spindle speed bits may be required to define the various spindle speeds that can be commanded.

Status bits can be unpacked from an input word by logical ANDing or masking the input word with a control word, where the control word contains zeros in all of the non-related bit positions and ones in the related bit positions. The resultant masked word contains only the related conditions. Next, various program shifting operations are used to arrange the bit positions in the word, then various testing and processing operations detect the states of these condition bits for further processing.

Command bits can be packed into an output word by logical ANDing that word with a first control word; containing zeros in the bit positions to be modified to zero set the related bits in the command word, then logically ORing that command word with a second control word to pack command bits into the appropriate positions of the command word. The new command word is output to the interface register to generate machine commands and also stored in the computer as a record of the current machine command conditions.

In this manner, condition bits can be packed into or unpacked from digital words for the interface arrangement described herein. Other interface arrangements and programming methods will become obvious to those skilled in the art.

AUDIONIC PROGRAM GENERATION

A simple technique of recording the audionic samples will now be discussed with reference to FIG. 1. Speech signals 141 can be sensed with a microphone 140 and converted to digital signals 101 with an analog-to-digital (A/D) converter 164. A computer 112 controls the sampling of the A/D converter 164, monitors the samples 143, and stores the samples in memory 130. The stored samples constitute the audionic parameters to be used in the audionic system.

These samples can be recorded with well known digital recording devices such as a tape punch 144 for later incorporation into an LSI-ROM audionic memory with well known LSI-ROM techniques.

In order to minimize the requirement for audionic memory storage, several optimization techniques will now be discussed.

A first optimization technique uses an optimization program in a computer such as the sample computer 112. The computer 112 under program control samples the speech signals 141 with A/D converter 164 which may be at a rate greater than required for the audionic system. A preferred embodiment of an A/D converter 164 is discussed in detail hereafter. Other embodiments will become obvious to those skilled in the art. The computer 112 then analyzes the waveform with well known mathematical methods such as the Fourier method. Redundant and unnecessary information is eliminated and the desired information is assembled into an audionic program. Optimization may include elimination of high frequency components, elimination of adjacent samples that have approximately the same amplitudes with a corresponding increase in the sample period, and identification of similar waveform segments for subroutine generation.

It is important that the audionic messages have good esthetic qualities. Therefore, optimized audionic programs may be presented to an operator for approval. This may be accomplished by operating the audionic subsystem 100 with computer 112 and using D/A converter 302 and speaker 104 to convert from digital samples 101 to audionic messages 105 as discussed herein. The operator can command the computer 112 such as through control panel 114 to optimize the audionic program with different optimization techniques to obtain an acceptable audionic message with minimum audionic memory requirements. These optimization techniques include changing the frequency response, changing the sample phase or time relationships, changing various amplitude thresholds, and other such optimization techniques. Similarly, the audionic messages can be enhanced by varying the frequency relationships, amplitude relationships, and other speech characteristics.

A second optimization technique uses operator interaction such as with the computer 112. The speech waveform may be presented on a CRT display 158 and the operator may modify this waveform using a light pen 158 to communicate with the computer 112 with well known interactive CRT and computer arrangements. The operator may make a change in the waveform with the light pen 158, then listen to the audionic reply 105 through speaker 104 to determine the effect of the change. The change may be to eliminate a waveform component such as a peak, change an amplitude, change a waveform time or amplitude magnitude, match-up waveform portions by substituting one portion for another portion, and other such changes. If the change is not acceptable from the audionic reply, the operator can command the computer 112 such as with control panel 114 to restore it to a prior form.

A third optimization technique would be to record the speech waveforms on a strip chart recorder, manually edit the waveforms, and manually program an optimized audionic reply program.

Audionic assembler and compiler programs may be used to provide audionic programs from input information such as waveform information. Waveform analysis such as for pattern recognition involves the sampling of the waveform with converter 164 and performing a computational analysis on the waveform information to define the characteristics and to diagnose the condition. For rapidly varying waveforms, the data processor 112 may not be able to process the information at a rapid enough rate to keep up with the desired sample rate. Otherwise stated, the sample rate requirements may exceed the computation rate capability. Therefore, an arrangement is presented that permits a low speed data processor to process high speed data samples.

The data processor 112 receives data samples from A/D converter 164 and stores these samples in memory 130. If the data processor 112 can not perform the processing of the samples in real time at the desired sample rate, the data processor will store the samples in real time and process the samples when time is available to perform the processing operations. The processing routines may be types of Fourier Analysis programs and pattern recognition programs.

As an example for an audionic system, the data processor 112 will accept voice samples 101 from A/D converter 164 and store these samples in memory 130. When processing time is available such as after the desired waveform has been adequately sampled, the data processor 112 will access the samples stored in memory 130 and perform the desired processing to optimize the audionic samples, diagnose the sound conditions, and other such functions.

The off-line waveform processing by the data processor 112 has a general applicability such as for diagnosing automotive waveforms as with ignition signals, diagnosing biological systems waveforms such as with an electrocardiogram, and other such applications.

The audionic memory capacity requirements are a function of the mix of characters and the quantity of characters. Different tasks may require different character arrangements such as with the alarm clock message system. An audionic assembler is provided that operates under program control in a computer such as the computer at the remote computer center 160 to accept a set of audionic messages such as through control panel 114 or tape reader 116 and assemble an audionic program for storage in audionic memory 130. This audionic program may be sub-character subroutines or other programs that can be used to generate the required audionic messages. The assembled program can then be output such as with tape punch 144 for use with an audionic system. The assembled audionic program and the particular messages can be loaded into an audionic memory 130 such as with tape reader 116 for use with an audionic system 110.

ELEMENTAL CONVERTER

The factored computer system of the parent applications is further exemplified with an elemental converter subsystem illustrated in FIG. 3. This elemental converter provides for conversion of both, analog inputs and analog outputs under computer program control. Computer 112 generates a composite output word to register 324 which may be the $C_I$-Register described in the parent application Ser. No. 101,881. The composite word includes the digital information $C_I15Q$ through $C_I10Q$ 310 that is converted to an analog signal 306, output select address 330, and input select address 332. Output word-7 (OW-7) provides a gated clock to load the A-Register contents in the computer 112 into the $C_I$-Register 324 as a serial digital signal $A_OQ$. Serial feedback to the computer 112 may be provided as signal 300.

When operating in a D/A converter mode, computer 112 selects an output channel 331 with addresses 330 to connect the analog signal 319 to be applied to output lines 331, which may include well-known line drivers and sample-and-hold networks for analog signal processing and storage. One output channel is shown as an audionic channel to amplifier 320 to excite speaker 104 with signal 103 to generate audionic signal 105. Output select logic 328 is composed of well-known address decode logic and analog switches to conduct analog signal 319 to the selected output line 331. Such address decode logic and analog switches are well known in the art such as manufactured by Electronic Engineering Company of Santa Ana, Calif. as the EECO 762 Multi-Channel ADC and the EECO 765 Analog Multiplexer; Nortronics Corporation of Hawthorne, Calif. as the NAADAC-100 Solid State Converter; Hybrid Systems Corporation of Burlington, Mass. as the Model MUX201 Multiplexer; and Burr-Brown of Tucson, Ariz. as the Model MPM-85 Analog Multiplexer.

When operating in an A/D converter mode, computer 112 selects an input channel 333 with addresses 332 and disables output channels 331 with addresses 330, preventing extraneous outputs and connecting the selected analog input 333 to comparator 334 on signal line 336, which is compared to synthesized analog signal 319 to generate a digital compare signal 338 as a discrete input signal (DI-8) to computer 112.

The A/D converter 164 of this invention may be described as an elemental extremity, wherein the elemental converter 164 does not provide for the usual interface operations such as timing, sequencing, and controlling; which are performed by the data processor 112 in response to the stored program contained in the main memory 130. This converter 164 is processor dependent and requires data processor coaction for operation. The mutual interdependence of the data processor 112 and the elemental converter 164 further exemplifies the teachings of the factored computer system invention and may be contrasted to the off-line, stand-alone peripheral operation of prior art systems.

The data processor 112 provides processing and signal translating capability, yielding versatility and low cost. The converter 164 is a processor dependent extremity that is elemental in form and communicates with the data processor 112 in signal formats intrinsic to the converter 164. Operative dispersion is used to fulfill system requirements including signal translation and communication functions; where the data processor 112 processes the data in a time format intrinsic to the elemental converter 164.

The elemental converter 164 may be a part of a factored computer system 110, wherein some prime functions have been factored and separated from the converter 164. The factored prime functions of the converter 164 may be redundant, where these prime functions can be performed by the data processor 112. The data processor 112 is considered to be in a non-redundant, irreducible form. Factored prime functions of the converter 164 that are redundant in conventional arrangements are eliminated in the elemental converter 164 and performed with the data processor 112, thereby reducing the hardware associated with this converter and providing a minimal structured or elemental converter. The factored prime functions such as logic and sequencing are merged into the data processor 112 which performs these prime functions in response to the stored program under program control. The operation of this data processor 112 is therefore dispersed throughout the system such as for the performance of subtasks associated with elemental extremities, where the converter 164 is dependent on this operational dispersion of the data processor 112 in the performance of the operations. The system 110 may also be considered an integrated computer system, wherein the factored prime functions that are merged into the data processor causes an overlapping of converter subsystem functions as if the data processor and converter subsystems were integrated together. For example, the sequencing and control operations are associated with the converter 164 but are performed by the data processor 112. Converter operations have been assumed by or integrated into the data processor 112, where these converter subtasks are performed by the data processor 112 with the resultant elimination of converter logic and interface circuitry.

The elemental converter 164 has a passive nature, where converter operation is dependent on data processor coaction to actively provide converter functions. This passivity results from the factoring and reduction of redundant prime functions.

The data processor 112 is physically distributed throughout the system, wherein portions of the data processor input-output section may be physically part of the elemental converter extremity. The internal processor signals such as micro-operation signals may be provided to the elemental extremity such as for the transfer of data between the data processor and converter subsystems.

The data processor 112 communicates with the elemental converter 164 in a signal form intrinsic to the elemental converter 164 and acceptable to the data processor 112. These intrinsic signal forms are translated from the data processor format into the converter intrinsic format under program control, then communicated to the elemental converter 164 in a format that is required by the elemental converter 164. One example of these formats is the elemental converter signals which are in a special preprocessed signal format with special sequencing relations intrinsic to the elemental converter. The data processor 112 performs the processing required to derive these signal forms intrinsic to the elemental converter subsystem 164.

The general purpose nature of the data processor 112 is thus extended to the elemental converter extremity. A change can often be made in the operation of the elemental converter with merely a change in the stored program by the data processor, eliminating the requirement for a major redesign in the converter subsystem.

A processor dependent A/D converter increases the capability of a converter subsystem and reduces the amount of electronics required. As shown in FIG. 3, a stored program data processor 112 communicates with an elemental A/D converter 164 with serial whole word data $A_oQ$ 342 transferred from the data processor A-Register, with a gated clock OW-7 340 to clock the data into the converter register 324, and with a discrete input (DI-8) 338 for the data processor 112 to sample the converter output signal. Although most stored program data processors may be used, in a preferred embodiment the data processor 112 and signals 300, 338, 340, 342, and the $C_r$-Register 324 correspond to the system described in the referenced application Ser. No. 101,881.

A five bit analog-to-digital converter is discussed herein, although it will be obvious to those skilled in the art that other resolution converters can be implemented with this invention.

The data processor 112 under program control loads a digital approximation of the analog of parameter into the register 324. The digital signals 310 are used as the input to a D/A converter 302 to generate the analog output signal 306 proportional to the digital parameter contained in register 324. Such D/A converters are well known to those skilled in the art and consist of analog switches 314 controlled with the digital signals 310 to selectively sum signals provided from a weighted resistor tree 316. This weighted summation provides an analog approximation signal 319, to be compared with the analog input signal 336 with a well known electronic comparator 334 such as a Fairchild model 710 circuit. The comparison signal 338 is sampled by the data processor 112 to determine if the approximation analog signal 319 is greater than or less than the input analog signal 336 for use with a successive approximation computer alogorithm described hereafter or other data processor algorithm.

The analog input signal 336 can be a multiplexed signal from a plurality of analog input signals 333. Multiplexing is performed with analog multiplexor 329 and selection register 324 with digital selection signals 332. Selection register 324 is loaded with the input channel address from data processor 112 with data input signal $A_oQ$ 342 and gated clock signal OW-7 340.

A successive approximation data processor algorithm will now be discussed using the subroutine flow diagram shown in FIG. 6. Other algorithms will become obvious to those skilled in the art for the successive approximation method and for other methods.

The data processor 112 will enter the conversion subroutine along path 509 to operation 670, which initializes the algorithm parameters, sets the N word to four for five iterations, and zero sets the approximation parameter. The next operations 672, 673, 674, 676, 678, and 680 are within the iterative loop of the successive approximation algorithm. The computer will fetch the last approximation parameter in operation 672 which is initially set to zero, then one set the Nth bit, initially the fifth bit for N=4. This parameter is then stored for later use and is also output to the converter register 324 in operation 672. A time delay may next be provided in operation 673 to allow for settling of the analog approximation signal 319. The comparison signal 338 is next sampled by the data processor 112 such as with a skip-on-discrete instruction in operation 674. If the comparison signal 338 is a logical zero, the successive approximation parameter is still too small and the subroutine branches along path 682. If the comparison signal 338 is a logical one, the successive approximation parameter is too large, indicating that the parameter has "overshot" the number that is being approximated. Therefore, the subroutine branches along path 684 to operation 676 which fetches the parameter; resets bit N, the last bit set that caused the "overshoot" condition; then stores the parameter for later use. The computer then executes operation 678 which decrements the N word for the next iteration to determine the condition of the next bit, which is the decremented Nth bit. A check is made in operation 680 to insure that the N word is non-negative, where a negative N word defines that the fifth and last bit has been processed and the conversion is complete. For this condition, the computation will follow path 512 to exit from the conversion subroutine. If the N word is non-negative, the computer branches along path 686 to execute operations 672, 673, 674, 676, 678, and 680 for the next successive iteration.

The flexibility of the data processor 112 permits the converter to operate in a modal fashion, with different conversion modes used for different conditions.

During system operation, the data processor 112 is often able to predict the value of the input analog parameter from prior samples recently performed, various system conditions, or other methods. Therefore, a prediction approximation parameter would be output to register 324. In one embodiment, the most significant portion of this predicted parameter would be used for the first approximation parameter, with the least significant bits determined with the successive approximation algorithm.

The processor dependent converter can also be used to perform the functions of a programmable comparator In one embodiment, a programmable threshold digital parameter is loaded into register 324 to be compared to the analog input signal 336 to define if that signal is within that threshold. In another embodiment, a selected analog signal 336 is converted to the equivalent digital parameter, which is loaded into register 324 for comparison with a second multiplexed analog signal to determine which is larger.

The resolution of the processor dependent converter can be set by the data processor under program control to insure that only the required resolution is provided, thereby reducing processing time for the conversion.

In a preferred embodiment of the elemental converter, address information and data information are both "packed" together in the computer A-Register and output to the $C_f$-Register 324. For simplicity, the operations are not discussed in conjunction with the description of converter operation, but are described separately in the section entitled AUDIONIC PROGRAM OPERATIONS herein. Other packing and assembly operations to build-up digital words will become obvious to those skilled in the art.

OPERATION

An audionic system can be operated in response to external stimuli or in response to internal conditions. External stimuli can be provided with a keyboard such as keyboard 244 of control panel 114 for applications such as with a calculator. Internal conditions can be provided such as from internal timing operations under program control for applications such as with an audionic clock system. The appropriate audionic message can be provided under program control in response to the stimuli or condition.

Many of the types of operations described herein may use selected reply conditions or may use combinations of reply conditions, where the discussion of operation or mechanization with a single reply condition is presented for simplicity and does not preclude the alternative reply conditions.

An audionic system can be initialized to provide the desired operation selected from a plurality of different types of operation. Flexibility of the computer arrangement of this invention permits the system to be initialized with various operational parameters and conditions to customize the audionic system to the particular operator's requirements.

In one embodiment, a control panel 114 may be used with selector switches 240, 241, and 242 and with momentary switches as discussed for the operator panel in the referenced application Ser. No. 101,881. Other control arrangements will become obvious to those skilled in the art.

The calculator can be initialized by placing the Mode selector switch 240 to the Index position, placing the Parameter selector switch 242 to a position to select a parameter, then entering the desired command with the keyboard 244. The initialize parameters may define the reply rate, pitch, tone and other such control functions. Initialize commands can also define modes of operation and other discrete functions such as defined with M and G codes as discussed in the referenced application Ser. No. 101,881, and in the referenced application Ser. No. 230,872.

The audionic system can then be placed in the operate mode by placing the Mode selector switch 240 in the Keyboard position, then entering parameters with the keyboard 244, and then depressing the discrete command switches such as the Add 283, Subtract 285, Multiply 287, and Divide 289 switches to command the associated operations.

Input of operator commands is an important requirement for many applications of the audionic system 110. Human factors considerations require input devices such as switch input devices to have physical dimensions dictated by ease of operator useage. Reduction of the quantity and complexity of input devices can reduce the physical size considerations and simplify operation.

A description of a simplified switch input arrangement will now be presented for an automotive audionic system to exemplify a generalized switch input arrangement for a broad range of applications.

An automobile driver may control audionic responses with switches mounted in a convenient location such as on the periphery of a steering wheel. Depression of a select switch will cause a parameter to be audionically identified based upon the number of switch depressions. For example, the driver may depress the select switch once for a speed parameter, twice for a time parameter, thrice for an oil pressure parameter and so forth. The audionic system 110 will respond with the selection and a parameter such as:

"-TIME-FIVE-FORTY-ONE-" or

"-SPEED-FIFTY-SEVEN-" or other such parameter.

If the driver depresses the switch again during the message, the audionic system will cease the message and start a new message associated with the next sequential selection. As another example, the driver will depress the select switch for a period of time, where the period of time is related to the parameter. For example, each second of the period may relate to the next selection in sequence. After the parameter has been selected by the driver releasing the switch, the selected parameter will be presented audionically. To assist the driver, the periods may be counted off in audionic fashion as follows:

"-ONE-TWO-THREE-TIME-FOUR-THRITY-TWO-"

or the selections may be counted off as follows:

"-SPEED-PRESSURE-TIME-FOUR-THIRTY-TWO"

where the solid underline is indicative of the required period of switch depression to select the time parameter and the dashed underline is indicative of the optional period of switch depression to select the time parameter.

The parameter sequence may be arranged to provide the most important parameter first for rapid access, with subsequent parameters provided in order of importance.

A Mode selector switch 240 may be used to select a mode such as a repeat mode to repeat the selected parameter at periodic intervals. As still another example, the computer 112 can provide an automatic scan of a selected set of parameters for operator cognizance. This scan will present a plurality of parameters in sequence either upon operator interrogation or automatically such as at periodic intervals.

As an audionic announciator, if a parameter passes a prescribed tolerance such as a preset speed limit, a minimum oil pressure, or a maximum temperature; then the parameter would be presented in audionic message form to alert the operator to the condition.

Inputs for an audionic system can be provided with switches, which will now be described for an audionic clock application using the control panel of FIG. 2 to exemplify input operations. The operator will position the Mode selector switch 240 to the Jog position, the Jog selector switch 241 to the Continuous or step position, and the Parameter selector switch 242 to the selected parameter position. The operator will next depress the appropriate slew switch 252 to slew the time parameter in the desired direction. As the time parameter is updated by the computer 112, audionic messages are presented to alert the operator to the updated time parameter. The operator can also verify the latest time parameter by depressing the repeat switch 282. In an alternative arrangement, the operator would position the Mode selector switch 240 to the Keyboard position 284, position the Parameter selector switch 242 to the appropriate parameter position such as Time 243, and enter the time parameter with the Keyboard 244. The audionic clock system would repeat the time and start the clock timing operations when the Cycle Start switch 246 is depressed. Although the control panel 114 is arranged for general purpose applications, a control panel arrangement optimized for a particular application will now become obvious to those skilled in the art.

Various audio controls may be provided to permit the operator to control characteristics of the audio reply with programmable parameters. These characteristics include reply rate, audio pitch, audio tone, volume, quality, frequency, fidelity, and other such characteristics. The selected control parameter may be entered by selection of the parameter address with the Parameter selector switch 242 and entry of the parameter value with the keyboard switches 244 as described in the parent application, Data Processing System. Other parameter entry arrangements will become obvious to those skilled in the art.

A rate control permits an operator to select a reply rate desired for a mode of operation or other considerations. For example, a high speed calculator keyboard entry mode of operation would require rapid response to provide a full echo response for a key depression before the next key is depressed. A slower reply rate is applicable to an operator with a slower data entry rate. The computer 112 is responsive to a rate control parameter and processes an audio program routine to provide the commanded reply rate. It may not be practical to merely speed up the sample rate because of the associated increase in frequency of the audio reply. One practical arrangement for increasing the rate is for the routine to selectively remove redundant information such as by deleting every fifth sample for an increase in rate by approximately 20% and by deleting every other sample for an increase in rate by approximately a factor of two. Other techniques for rate control will become obvious to those skilled in the art.

An audio pitch control permits an operator to select a desired frequency such as for personal preference, esthetics, and clarity. The computer 112 is responsive to a pitch control parameter and processes an audio routine to provide a commanded pitch. This may be accomplished by adjusting the time between samples to provide a commanded pitch or by other techniques that will become obvious to those skilled in the art.

Other audio controls may be used to permit an operator to define characteristics of an audio reply such as applying an exponential multiplier or a constant multiplier or both of these values, which may be operator programmable, to the output sample such as for a tone control or a volume control. Other programmable parameters will become obvious to those skilled in the art.

A Sub-Mode selector switch 241 will permit an operator to select various sub-modes of operation such as single reply, continuous reply, or scan reply. Single reply will cause a single audio reply for each switch actuated. Continuous reply will cause a selected parameter to be continuously repeated. Scan reply will cause a group of parameters to be scanned with an audio reply for each parameter presented in sequence.

APPLICATIONS

The audionic system described herein can be used in a wide range of applications, where an audionic calculator and an audionic clock are typical of these applications. Other applications include a typewriter, medical testor, data concentrator, musical instruments, monitor, vehicular announciator, cash register, appliance, and others described herein. The broad scope of this audionic invention permits it to be used in virtually every system involved in communicating with an operator or where operator feedback would enhance utilization. Therefore, the applications described herein are in no way intended to place a limitation on the broad applicability of this invention.

The audionic system provides greater economy when two or more functions are performed by the same system. As an example, an audionic clock can be provided with an audionic calculator for only a small additional cost for the clock functions. As another example, an audionic system for an automobile may include an audionic calculator and an audionic clock with only a small additional cost. Therefore, audionic devices may be compatible and it is intended that the audionic devices may be combined to provide multi-function capability to achieve greater capability without significantly increasing costs.

Audionic messages can be presented by the build-up of sub-character sounds to provide characters, then the statement of characters to provide a complete message. In order to disclose audio messages in text form herein, an audio notation is provided. The audio message is shown in quotations and dashes ("- -") and the characters are separated by dashes (-). Several examples are presented below:

"-two-"

"-five-fifty-three-point-five-"

"-six-thirty-five-and-three-seconds-"

Further examples are disclosed hereafter to exemplify the operation of the system. Audio tones will be designated with the terms "-beep A-beep B-". A pause or time delay will be designated with the term "-...-" as with "-five-...-beep-".

The audionic stimulus to initiate an audionic message may include switch actuation or automatic stimuli such as internal system timing as discussed herein. In order to disclose system operation, with examples, a stimulus notation is provided and may be used in conjunction with the previously discussed audio notation. The stimulus notation is shown with the stimulus designation between astericks (* *). A list of stimulii are shown below:

| | |
|---|---|
| *1* | Keyboard switch 1 |
| *5* | Keyboard switch 5 |
| *+* | Add switch |
| *=* | Equals switch |
| *TIME* | Time switch |
| *AUTO* | Automatic such as for timing with a system clock. |

Various audionic effects may be provided such as greater volume for important messages, wailing or other forms of modulation for special effects, modulated audionic signals at a carrier frequency for transmission of information over a telephone data link, and other such effects. These effects may be provided with superposition techniques, scale factor multiplier, or other techniques that are discussed herein. Still other effects may be provided with still other techniques that will become obvious to those skilled in the art.

An audionic system may be arranged to provide a plurality of tasks comprising at least one main task and at least one subtask. These tasks may be combinations of audionic tasks and non-audionic tasks. As an example, a main task may be the control of a vehicle and a subtask may be providing audio messages as described herein. As another example, a main task may be operating as an audionic calculator and a subtask may be operating as an audionic clock. As still another example, a plurality of main tasks may include control of cash register operations and performance of audionic calculator operations and a plurality of subtasks may include data logging, off-line data transmission, and performance of audionic clock operations. Incorporation of a stored program computer in an audionic system thereby provides flexibility and capability for performance of a plurality of tasks. Therefore, the audionic tasks described herein may be provided in combination with each other and with other tasks to further expand system capability.

AUDIONIC CALCULATOR

An audionic calculator will now be described for the audionic system of FIGS. 1A and 1B. The operator will depress momentary switches on the control panel 114 to provide input data and to command calculator operations. The computer 112 is responsive to switch input signals and provides an audionic reply for feedback to the operator for interactive operation, then the computer 112 processes the input switch condition as required.

The operator can command the calculator 110 to repeat an audio message for each depression of a Repeat switch 282. The reply may pertain to the last parameter entered by the operator through the keyboard 244 for parameter verification or may pertain to the solution of a calculation if the last switch actuated was a discrete command switch such as the Add switch 283.

A simple example of an arithmetic add operation will now be presented in switch and audio notation to exemplify audionic calculator operation.

| | |
|---|---|
| *CLEAR* | "-CLEAR-" |
| *1* | "-ONE-" |
| *5* | "-FIVE-" |
| *.* | "-POINT-" |
| *3* | "-THREE-" |
| *+* | "-PLUS-" |
| *5* | "-FIVE-" |
| *7* | "-SEVEN-" |
| *.* | "-POINT-" |
| *2* | "-TWO-" |
| *=* | "-SUM-SEVEN-TWO-POINT-FIVE-" |
| *REPEAT* | "-SUM-SEVEN-TWO-POINT-FIVE-" |

The Repeat command can also be implemented to cause the audionic calculator to repeat the complete problem (15.3+ 57.2=72.5).

It will be obvious to those skilled in the art that other operations can be commanded with the switches on control panel 114 such as with Add switch 283, Subtract switch 285, Multiply switch 287, Divide switch 289 and other such control switches.

AUDIONIC CLOCK

An audionic clock will now be described for the audionic system of FIGS. 1A and 1B. The computer 112 will continually accumulate time as a real time parameter and convert this parameter to the desired form for audionic messages upon the desired stimulus. The audionic clock provides multiple function capability. The functions include a basic clock, a periodic clock, an alarm clock, an itinerary reminder, and other capability that will now become obvious to those skilled in the art from the teachings of this invention.

The basic audionic clock mode will cause the computer 112 to update time such as with the real time clock operating under program control. The clock will generate an audionic reply upon interrogation to define the time. The time can include the hours, minutes, seconds, and, if desired, fractions of seconds and can present time based upon a twelve hour or twenty four hour schedule. The audio time message can pertain to the time at which the clock was interrogated, or, with a look ahead feature, the time at which the audio reply is completed, or the time defined by an audio tone shortly after the audio reply. Several examples will now be presented to exemplify this operation. A twelve hour clock operating mode may reply with:

| *TIME* | "-EIGHT-FIFTY-FIVE-AND-SEVENTEEN-SECONDS-" |
|---|---|

A twenty-four hour clock operating mode may reply with:

| *TIME* | "-EIGHT-FIFTY-FIVE-PM-AND-SEVENTEEN-SECONDS-" |
|---|---| or with,

*TIME* "TWENTY-FIFTY-FIVE-AND-SEVENTEEN-SECONDS-"

A time tone operating mode may reply with:

| *TIME* | "-EIGHT-FIFTY-FIVE-AND-SEVENTEEN-SECONDS-....-BEEP A-" |
|---|---|

In a continuous mode of operation, the audionic clock would, upon interrogation, initially define the complete time, then repeat only the changed parameters as time increases and discontinue the count upon switch actuation. Several examples will now be presented to exemplify various forms of this continuous operation. In one example, continuous time will be presented with a one second resolution.

| *TIME* | "-EIGHT-FIFTY-MINE-AND-FORTY-EIGHT-SECONDS-....-BEEP-NINE-....-BEEP-FIFTY-SECONDS-....-BEEP-ONE-....-BEEP-TWO-....-BEEP-THREE-....-BEEP-FOUR-....-BEEP-FIVE-....-BEEP-SIX-....-BEEP-SEVEN-....-BEEP-EIGHT-....-BEEP-NINE-....-BEEP-NINE-O'CLOCK-SHARP-....-BEEP-ONE-....- |
|---|---|
| *TIME* | BEEP-TWO-...." |

In another example, the time may be presented in speech form at periodic intervals such as at every quarter minute on the quarter minute. Tones can be used to provide rapid resolution intervals such as at every second or at every half second interval. Different tones can be used for larger intervals such as at every five second interval. Further, tones can be superimposed on speech to resolve time intervals during speech periods. One form of this continuous operation described in the following example.

| *TIME* | "-EIGHT-FIFTY-NINE-AND-FORTY-EIGHT-SECONDS-....-BEEP A-....-BEEP B-....-BEEP A-....-BEEP A-....-BEEP A-....- |
|---|---|

*-continued*

| | BEEP A-....-BEEP C-....-BEEP A-....-BEEP A-....-BEEP A-....-BEEP A-....-NINE-O'CLOCK-SHARP-....- |
|---|---|
| *TIME* | BEEP A-....-BEEP A-...." |

In a Greenwich Mean Time (GMT) mode of operation, the computer will accept time zone information from the control panel and provide audionic messages for the selected time zone.

In a stop watch mode of operation, the audionic clock would, upon interrogation, start counting from zero continuously as described for the continuous mode of operation. Upon a stop signal, the clock would start repeating the accumulated time to that stop signal. The accumulating time could be presented as discussed for the continuous mode, rounding off the time to the second or other convenient resolution. The final time could be presented with a high resolution such as one hundredths of a second. An alternative stop watch mode of operation would provide rapid audio tone replies for each resolution increment of time. One mode of operation is exemplified with the following example:

| *STOP* | "-ONE-....-TWO-....-THREE-....-FOUR-....-FIVE-....- |
|---|---|
| *STOP* | FIVE-POINT-SEVEN-FOUR-SECONDS-FIVE-POINT-SEVEN- |
| *TIME* | FOUR-SECONDS-" |

The stop watch Stop switch 262 causes the computer 112 to exit the normal mode of operation and to enter the stop watch mode of operation, but the computer 112 will continue to keep track of real time independent of the mode of operation. The Time switch 263 returns the clock to the normal mode of operation.

In a periodic clock mode of operation, the audionic clock would present an audio reply for each periodic occurance. These periodic occurances could be each fifteen minutes on the quarter hour or other desired occurance. This form of operation is illustrated in the following example:

| *AUTO* | -....-EIGHT-FIFTEEN-....-BEEP- |
|---|---|
| *AUTO* | -....-EIGHT-THIRTY-....-BEEP- |
| *AUTO* | -....-EIGHT-FORTY-FIVE-....-BEEP- |
| *AUTO* | -....-NINE-O'CLOCK-....-BEEP- |

As another periodic mode of operation, the audionic clock can provide chimes or beeps as with the well known chiming clocks.

In an alarm clock mode of operation, the audionic clock would accept a preload time parameter such as through the control panel 114 which would be stored and periodically compared with the actual time. When the actual time and the preload time compare, an audio reply would be generated. This audio reply could be the preloaded time, the actual time as continuously updated, a tone, or other selected audio reply. Further, this reply could be a single audio reply or a continuously presented reply. A plurality of preload time parameters could be entered for a plurality of alarm conditions. With a calendar feature described hereafter, the preload parameters could be entered with the date parameter to provide an alarm schedule for a long period of time such as for a week. The audio reply alarm could be louder than the audio reply for other modes of operation to insure that the operator's attention is attracted. As an alternative, the audio reply could start quietly in a continuous mode of operation and continue to increase in volume until turned-off with the selected stimulus.

In an itinerary mode of operation, the alarm clock mode would be expanded to present a message with each audio reply alarm. The messages could provide a calendar of appointments for an executive, a set of traveling instructions for a traveler, or a general reminder schedule. The messages can be loaded manually with the control panel 114, automatically with the tape reader 116, or with other input devices.

Other modes of operation will become obvious to those skilled in the art.

AUDIONIC TYPEWRITER

A typewriter 156 is an example of a system requiring operator interaction for performing a task, wherein the task may be providing a hard copy document such as a letter or may be the conversion of information to digital electrical form such as with a Teletype Corporation model ASR-33 TELETYPEWRITER. The use of an audionic typewriter 156 enhances operator interaction by providing audionic message feedback to the operator. The audionic subsystem 100 could be provided as an integral part of the typewriter, as an attachment for the typewriter, or as an independent subsystem operating in response to typewriter signals.

A typewriter 156 is typically used by an operator with visual attention fixed on the material being typed using conditioned typing reflexes to select typewriter keys without visually verifying that the proper key has been depressed and the proper print element has been actuated. An audionic typewriter 156 is responsive to operator actions and provides an audionic message defining the condition that is input to the typewriter. This audionic message provides feedback to the operator to verify proper operation and to detect errors.

An example of audionic typewriter operation will now be presented for typing a letter using the audionic and switch notation previously defined.

|  | EXAMPLE 1 | EXAMPLE II |
|---|---|---|
| *D* | "-CAP DEE-" |  |
| *e* | "-EE-" |  |
| *a* | "-AH-" |  |
| *r* | "-AR-" | "-DEAR-" |
| *SPACE* | "-SPACE-" | "-SPACE-" |
| *M* | "-CAP EM-" |  |
| *r* | "-AR-" |  |
| *.* | "-PERIOD-" | "-ABB. MISTER-" |
| *SPACE* | "-SPACE-" | "-SPACE-" |
| *J* | "-CAP JAY-" |  |
| *o* | "-OH-" |  |
| *n* | "-EN-" |  |
| *e* | "-EE-" |  |
| *s* | "-ES-" | "-JONES-" |
| *:* | "-COLON-" | "-COLON-" |

Example I defines a simple character feedback arrangement. A more sophictocated system with a large stored vocabulary could respond with complete audionic word messages as illustrated in Example II above. This would be accomplished by accumulating the characters for a word, then using a table lookup or other arrangement for selecting the appropriate word from an audionic vocabulary memory for message feedback.

For a communication typewriter such as the TELETYPEWRITER, information can be transmitted to a remote location over a data link such as a telephone line, then reconstructed into audionic messages either for the characters as described in Example I above or into complete words as described in Example II above and as described in more detail hereafter under the subtitle Audionic Data Concentrator.

The controls previously discussed such as repeat, volume, pitch and others are equally applicable to the audionic typewriter.

In the prior art, it is often necessary to "proof" typing by comparing the original copy with the final typed copy. This comparison is tedious and often requires two secretaries, one secretary to read the original copy and a second secretary to compare it with the typed copy. In one embodiment of this invention, the typed audionic information may be recorded, then played back for this "proof reading". The typing may be recorded in main memory 130, auxiliary memory 152, tape punch 144, or other well known digital storage arrangement.

AUDIONIC CASH REGISTER

An audionic cash resister application will now be described for the audionic system of FIGS. 1A and 1B. As described for the audionic calculator and typewriter, the audionic cash register can echo back audionic messages in response to the keys depressed. Although the control panel 114 is not optimized for a cash register application, it is exemplary of the cash register control functions. The operator will depress switches such as with keyboard switches 244 and receive audionic responses.

In a more sophisticated application, the computer 112 will receive inputs identifying the product such as with a coded input through the control panel 114, an input from a label reader or tape reader 116, or other inputs from input devices; then the computer will respond with a descriptive audionic message. As an example, a supermarket checkout register operator will read a number 5721 from a box of cereal and type:

| *5* | "-FIVE-" |
| *7* | "-SEVEN-" |
| *2* | "-TWO-" |
| *1* | "-ONE-" |
| *ENTER* | "-GROCERIES-CEREAL-FIFTY-SEVEN-CENTS-" |

This response alerts the customer as to the item and the charges which are related to the coded number. As another example, the operator will place a bag of oranges on a scale and enter the number 3495 stamped on the oranges. The computer 112 will monitor the input 333A from scale 360, convert the weight parameter, look up the cost of the item, and respond as follows:

| *3* | "-THREE-" |
| *4* | "-FOUR-" |
| *9* | "-NINE-" |
| *5* | "-FIVE-" |
| *ENTER* | "-PRODUCE-ORANGES-NINTEEN-CENTS-PER-POUND-SEVEN-POUNDS-EIGHT-OUNCES-ONE-DOLLAR-FORTY-THREE-CENTS-" |

The term cash register is used to exemplify a particular application and is intended to mean a generalized point-of-sale checkout, or other such tally type device. Other audionic register arrangements will now become obvious to those skilled in the art. Such a generalized point-of-sale system may be operated by a sales person in conjunction with a customer, as is common in the prior art cash register systems such as in a grocery store. Typically, the sales person will operate the system and the customer will monitor the audionic responses. This system may also provide a data logging and calculator capability and may provide a hard copy output such as with the prior art cash register "tapes". In a point-of-sale system, a sales person may be termed an operator and a customer may be termed a monitor for the transaction.

An audionic cash register or point-of-sale system is intended herein to include a system for performing customer transactions such as for the purchase of products by a customer.

MULTI-TERMINAL SYSTEM

A multi-terminal audionic system will now be discussed for the audionic system shown in FIGS. 1A and 1B. This multi-terminal system will be discussed for a point-of-sale system such as using a plurality of cash registers. A central computer system 110 with computer 112 and audionic memory, which may be the main memory 130 or the auxiliary memory 152, are interconnected to a plurality of terminals each having an audionic subsystem 100, including interface 102 and transducer 104. The audionic memory 130 or 152 stores audionic messages or submessages that are provided to each terminal as required.

The audionic memory may be shared between a plurality of terminals and may be time shared such as under program control of computer 112. Because audionic message sample rates are typically less than 10,000 samples per second and because a computer 112 may be able to generate samples at a 100,000 samples per second rate, therefore a computer 112 may be able to control a plurality of audionic subsystems in different terminals and with different messages which may be provided simultaneously. The terminals may be located in close proximity to the central unit or may be located remotely such as at various locations in a large store as with cash registers.

The audionic messages may be the same as discussed herein for the audionic register system or may be other message forms that will become obvious to those skilled in the art.

The multiple terminals may each be driven from an output channel 331 such as shown for output channel 331A; where a transducer and associated drive electronics, such as sample-and-hold amplifier 320, would be provided for each channel.

VEHICULAR ANNOUNCIATOR

A vehicular audionic system will now be discussed for the audionic system of FIGS. 1A and 1B for use in a vehicle such as an aircraft or an automobile. Important parameters such as speed may be sensed by the computer 112. A speed sensor interrogated through A/D converter 164 may provide required inputs for processing. The computer 112 can generate the desired audionic reply 105 for operator cognizance of conditions. Many parameters can be presented with an audionic message such as speed, fuel level, pressure, and other parameters which can be selected with a parameter switch 242 or with other arrangements as discussed herein. Other parameters can be presented when the value exceeds a predefined tolerance. Parameters can be presented in audionic message form when interrogated by an operator, periodically under timer control, or sequentially under scanner control or in various combinations of these presentations. Parameters can also be presented in audionic message form when certain conditions occur such as (1) presenting a parameter whenever the value changes by a predefined increment such as velocity for each five mile per hour change, time for each fifteen minute change, distance for each ten mile change, fuel for each gallon change or other such presentations, (2) presenting a parameter whenever an associated condition occurs such as velocity when the brake is applied, or velocity when the steering wheel is turned past the center position, or (3) other such presentations.

A vehicular system is herein intended to be generally interpreted in broad terms and to include vehicles for transportation and for generalized locomotion such as automobiles, aircraft, watercraft, locomotives, and other such vehicles.

AUDIONIC MEDICAL TESTOR

An audionic reply system may be used as a testor to calibrate a persons hearing such as in a medical application. The system would generate audio stimuli and would monitor the operator responses to these stimuli. The operator responses could be obtained automatically with biological sensors, manually such as with an operator switch control, or with other arrangements that will become obvious to those skilled in the art.

Present test systems are manual devices that generate frequency tones with oscillator circuits and volume potentiometers manually controlled by a test technician. These systems are limited in capability and provide only simple static tones. An arrangement is presented where dynamic tones can be provided such as continuously varying amplitude or frequency or both and to provide complex sounds to detect subtle hearing conditions.

As illustrated in FIG. 3, computer 112 is responsive to a test program such as from memory 130 or tape reader 116 for generating audio test signals with the audionic subsystem 100. The computer 112 is responsive to operator responses from operator input controls 114 and processes these responses to calibrate the operator's audio responsiveness. The computer can provide outputs 331B and 331C for X-Y recorder 362 to plot the frequency verses amplitude response of the operator. Other input arrangements will become obvious to those skilled in the art such as with other program sources, operator input devices, and output devices.

An adaptive control arrangement can be provided where the computer 112 generates a tone at low amplitude and gradually increases the tone until an operator response is received. The computer can periodically present signals at that tone bracketing the operator's threshold previously detected to be used as a precision calibration and as a double check on the test information.

Operator response data can be correlated with the particular operator's historical records to detect changes in audio response and can be correlated with the audio responses of other operators to provide statistical correlations. This correlation and record keeping can be performed with the computer 112 in the audionic system 110 or with a hierarchy arrangement such as with a remote large scale computer 160 receiving data over data link 150 or other arrangement for transferring digital data.

This arrangement is particularly suitable for a testing bureau such as in a clinic or office, where a patient would present himself for automatic testing. The test results would then be made available such as to a doctor for diagnosis of a medical condition. A franchise operation could be organized to provide this testing service in centrally located facilities.

Audionic outputs may be provided to each of a plurality of individual patients such as discussed for the Multi-Terminal System.

AUDIONIC DATA CONCENTRATOR

Voice communication contains many redundancies and is therefore inefficient. Redundancies may be greatly reduced with digital data communication. Unfortunately, an operator can't directly interpret digital data. Therefore, an audionic data concentrator arrangement will now be discussed to provide digital communication of audionic messages and the conversion from digital to audionic form with an audionic system 110.

An arrangement is illustrated in FIG. 7, where a message encoder 700 receives messages 702 from an input device 701 which are encoded into digital form and provided to transmitter 704 to transmit signal 706. Receiver 708 receives signal 706 and provides the received information to the audionic converter 110 to generate the audionic message 105.

The input device 701 may be a typewriter such as the well known TELETYPEWRITER or a type reader providing digital input information 702, where message encoder 700 processes this input information to generate digital messages that can be interpreted by audionic converter 110 to generate the audionic messages 105. An alternative arrangement uses an audio input device 703 such as a microphone 140 and an A/D converter 164 to provide digital speech samples 712 to encoder 700 which are converted to digital messages that can be interpreted by audionic converter 110 to generate the audionic messages 105.

Message encoder 700 may be a large scale computer 160 which is programmed to analyze the audio signal samples such as with well known pattern recognition programs for generation of the digital messages.

The transmitted digital data 706 can be a binary code that identifies a syllable, word, or other such character. When received, the digital data 709 is processed by the audionic converter 110 to generate audionic signals 105.

Efficiency of the audionic data concentrator will now be described by way of example. For a vocabulary of 1000 words, a ten bit binary code can be used to select one word from the vocabulary. Assuming for this example that an audio channel has a bandwidth of 10 KHz and an average audio word has a one second duration; then approximately five thousand bits of digital information can be transmitted over that channel per second, relating to 500 ten bit binary word codes transmitted per second. This provides a data concentration efficiency of 500 to 1, where 500 digital channels can now be transmitted on a single channel that could only accommodate a single speech channel.

Another advantage of the audionic data concentrator is the convenience of encoding the digital data for security or other such purposes and the ease of changing those codes. In one application, an audionic data concentrator could be provided for police car communication, where a limited vocabulary consisting of the numerals and a few control words could be provided. A vocabulary of only 32 words would permit five bit binary codes to be used and would greatly reduce the audionic memory requirements for the receiver in the vehicle.

AUDIONIC MUSICAL INSTRUMENTS

An audionic reply system may be used to provide musical responses such as for an electronic instrument. Although electronic organs are in wide use, these organs are implemented with special purpose frequency generators, filters, and other such equipment. The use of a stored program digital computer operating under program control with an audionic memory portion as disclosed herein is a unique, flexible arrangement not anticipated in the prior art. As an example, an electronic organ has special frequency generators for each frequency signal, where these signals are summed with filters to provide a composite musical signal. The audionic system of this invention uses a data processor to generate complex time and amplitude relationships in the digital domain under program control using programming techniques such as multi-level subroutines and computational techniques including addition and multiplication to provide composite signal samples in digital form, then converting to an analog signal with D/A converter 302.

A programmable musical instrument can be configured around the audionic system 110, where a program input device such as a tape reader 116 can cause the system to generate a musical reply as programmed. This programmed input can be in the form of digital codes representing a music sheet such as shown in Table II. A block of input commands would define the note duration, note selection, and other such definitions. Many notes could be combined in a block to define a complex musical arrangement such as to simulate an orchestra with many instruments.

TABLE II

| NOTE DURATION | |
|---|---|
| full | G01 |
| half | G02 |
| quarter | G03 |
| eighth | G04 |
| NOT VALUE | |
| 1 | S00001 |
| 2 | S00010 |
| 3 | S00011 |
| 4 | S00100 |
| 5 | S00101 |
| . | . |
| . | . |
| . | . |
| n | S11111 |

AUDIONIC MONITOR

The audionic system can be implemented as a signal monitoring system, where an input A/D converter 164 monitors signals 333 and provides an audionic message 105 related to a particular signal 336.

Computer 112 monitors control panel 114 to sense operator selection of a signal such as with selector switch 242, then selects input signal 336 with address 332 to input selector 329 and converts the analog signal to a digital number with the A/D converter program routine discussed herein. The computer 112 then presents an audionic message 105 related to the selected signal. The selected signal can have selected characteristics such as an analog amplitude, a frequency, a phase, a pulse width, or other well known signal characteristics to be monitored and presented in audionic form.

One embodiment of this signal monitoring capability could be in an operator panel which monitors system conditions for operator cognizance. Multiple meters and other such instruments may be replaced with an audionic system for monitoring signal characteristics and presenting the signal parameters to the operator in audionic form.

Another application would be a vehicle such as an automobile or an aircraft, where selection of a signal by the operator would cause the computer 112 to provide the parameter in audionic form. For example, parameters such as velocity, fuel level, oil pressure, temperature could be selected and presented in audionic form.

A scan mode can be provided where the computer 112 would sequentially select various signals and provide a sequence of audionic messages. One example for an automobile could be:

"-SPEED-THIRTY-FIVE
-FUEL-ONE-FIFTH
-OIL-PRESSURE-FIFTY-THREE
-TEMP-ONE-THRITY-FIVE
-TIME-SEVEN-FORTY-THREE-"

An announciator mode can be provided, where the computer 112 would monitor a set of critical signals and provide an announcement if a signal exceeded a preset threshold such as excess velocity or temperature or insufficient fuel or oil pressure.

BATCH-FABRICATED ARRANGEMENT

A batch-fabricated arrangement 810 is illustrated in FIG. 8A comprising a conventional printed circuit (PC) board 811 having components mounted thereon such as integrated circuit (IC) dual inline package (DIP) components 812 and 813, an integrated circuit audio amplifier 814, PC board mounted switches such as switch 815, PC board mounted display elements such as display element 816, a PC board mountable sound transducer 817, and other such devices. IC DIPs 812 and 813 may include microcomputer circuits having an IC memory architecture as discussed in referenced application Ser. No. 101,881 and may include digital logic, analog logic, and other IC components. Other electronic circuit elements may also be provided in discrete circuit form and mounted on PC board 811.

PC board mountable switches such as switch 815 may be discrete PC board mountable switches, or may be batch-fabricated diaphram switches such as manufactured by Datanetics Corp, or may be known touch switches, or may be other types of switches. Display 816 may be a known light emitting diode (LED) display, liquid crystal display (LCD), or other known display and may include discrete display elements such as bulbs and/or segmented numeric display elements. Transducer 817 may be any known transducer but, in a preferred embodiment, may be a batch-fabricated transducer mounted or bonded to PC board 811 at base 820 such as transducer 817 described with reference to FIGS. 8B–8E.

In a preferred embodiment, batch-fabricated system 810 is constructed in the form of control panel 114 and display panel 118 shown in FIGS. 1A and 2 of the instant application and shown in greater detail in FIG. 2 and related figures of copending application Ser. No. 101,881. For example, display panel 118 can include discrete displays 233 and numeric or alphanumeric segment displays 238 and 816 and control panel 114 can include momentary switches such as switches 262, 263, etc (FIG. 2) and switch 815 (FIG. 8A) and selector switches 240–242 (FIG. 2) mounted with other components on PC board 299 (FIG. 2) and 811 (FIG. 8A).

This batch-fabricated arrangement reduces interconnections and manufacturing efforts and provides many well-known advantages such as reduced cost; enhanced reliability, maintainability, and performance; and other advantages.

In a preferred embodiment, electronic components and transducer 817 are mounted on PC board 811 including the digital processor, power supplies, clock pulse generator, and the components described above.

IMPROVED AUDIO TRANSDUCER

The improved low-cost transducer shown in FIG. 8A will now be discussed in more detail with reference to FIGS. 8B–8E. An embodiment having magnetic material (or other material) on cone 817 and electrical coils on PC board 811 will be discussed with reference to FIG. 8B and an alternate embodiment having electrical coils on cone 817 and magnetic material (or other material) on PC board 811 will be discussed with reference to FIG. 8C. Batch-fabricated methods for implementing magnetic material cone 817A (FIG. 8B) and electrical coil cone 817B (FIG. 8C) will be described with reference to FIG. 8D and FIG. 8E respectively. Although the preferred embodiment is discussed in the form of an electrical signal to acoustical signal transducer, those skilled in the art will now be able to implement other devices from the teachings of the present invention such as an acoustical signal to electrical signal transducer.

The batch-fabricated transducer arrangement of the present invention (FIG. 8) has many advantages such as elimination of discrete mounting structures, elimination of discrete coils, elimination of discrete magnets, and other such simplifications associated with the batch-fabricated and with the monolithic type transducer.

In the prior art, acoustical transducers have been constructed to provide high quality sound and, as a result, have been relatively expensive. Multitudes of applications for acoustical transducers do not have high quality requirements but have low cost requirements. For example, sound generation for a toy, speech generation for a talking doll, sound generation for an appliance having an electronic control, and multitudes of other applications do not require high fidelity (hi fi) and do not even require good fidelity; but require low cost and mere understandability. Therefore, in accordance with the present invention, a low-cost acoustical transducer is discussed hereinafter for providing at least understandable acoustical signals and, depending on construction, may provide good quality acoustical signals.

Cone 817A (FIGS. 8B and 8D) and cone 817B (FIGS. 8C and 8D) have apex 822 and base 820, where base 820 can be bonded to PC board 811, 811A, and 811B (FIGS. 8A, 8B, and 8C respectively). The PC board can have a hole 823 for air movement within the cone. Each cone can have an edge element extending from apex 822 to the base at point 826 and 827. Each three-dimensional cone 817A and 817B (FIGS. 8B and 8C respectively) can be formed from flexible planar elements (FIGS. 8D and 8E respectively) by being cut into an appropriate known planar form of a cone, then being bent to form a three-dimensional type arrangement by making points 826 and 827 adjacent to each other; thereby bulging apex 822 and lining up conical edge 822–826 with conical edge 822–827 and thereby establishing base 820. Edges 822/826 and 822/827 can be bonded together to support the three-dimensional shape of the cone.

The audio transducer is shown for convenience as cone 817, 817A, and 817B mounted on PC board 811, 811A, and 811B respectively having associated ferrite material and electrical coils. In a preferred embodiment, the ferrite material and/or electric coils may be described as batch-fabricated material using the PC board and transducer cone as a support or as a substrate. In a first embodiment, the transducer cone contains the ferrite material and the PC board contains the coils (FIG. 8B). In a second embodiment, the transducer cone contains the coils and the PC board contains the ferrite material (FIG. 8C). Further, the transducer cone may not itself have a separate supporting structure but may use the PC board for support at contact position 820 therebetween.

For convenience of discussion, a transducer is provided having a cone for coupling to the air and having ferrite material and coils for providing acoustical forces. It is herein intended that these specific features be illustrative of the broad teachings of the present invention, wherein the present invention is not limited thereto. For example, cone 817 can be a diaphram, a portion of a structural element, or any other device for coupling energy. Energy can be coupled into the air such as with an audio transducer or may be coupled into structural numbers, a water medium, a bone of an operator, or other such medium. Electrical coils and ferrite material are a common force generating arrangement, but other force generating arrangements can be used such as having multiple sets of coils for generating forces therebetween, having non-ferrite material, being responsive to coil generated fields, and other such arrangements. Further, the batch-fabricated monolithic structure can be supplemented with discrete components, wherein for example a discrete magnet can be used in addition to or in place of the monolithic ferrite structure. Other implementations of this invention will now become obvious to those skilled in the art from the teachings herein.

In one embodiment shown in FIG. 8B, transducer coils 821 can be provided on PC board 811A with PC wiring. Electrical interconnections to the coil can be made through amplifier 814 and with a return signal such as ground connection 824 using conventional PC board methods. Transducer cone 817A can be inserted over coil 821 at contact point 820 between cone 817A and PC board 811A. Cone 817A can be constructed as a monolithic ferrite structure, as will be described with reference to FIG. 8D hereinafter.

Ferrite cone 817A (FIG. 8B) can be constructed in a form shown in FIG. 8D or with other known techniques. Cone 817 can be constructed as a planar element such as a monolithic ferrite sheet cut to a form that can be bent to provide a three-dimensional cone such as the semi-circular type arrangement of FIG. 8D. This ferrite sheet can be formed with well-known methods such as those used for ferrite tape in the manufacture of memory cores or for monolithic ferrite memories; which methods are known in the art. The ferrite material can be formed of uniform thickness or can be formed with variable thickness. In one variable thickness embodiment, cone 817A can have a minimum thickness at apex 822 of cone 817A and a maximum thickness at outer periphery 820 of cone 817A as shown in the cross-section view at the top of FIG. 8D taken as looking at the planar conical element vertically downward in the direction of arrow 825 toward straight edge 826, 822, 827 in the plane of FIG. 8D. Alternately, the thicker portion of ferrite material around periphery 820 can be achieved by bonding a toroidal ferrite core around the periphery, which may be supported at the point of mounting 820 to PC board 811A or with other methods. The ferrite material can be magnetized with well-known methods or can be a low-reluctance path for magnetic fields that can be generated with magnets such as a discrete toroidal magnet element discussed above.

An alternate arrangement is shown in FIG. 8C, where cone 817B contains coils 821 and wherein PC board 811B contains ferrite material 828. Ferrite material 828 can be placed on PC board 811B with known deposition, printing, or monolithic processes. For example, a ferrite paste used in making magnetic tapes or monolithic ferrite memories can be formed as ferrite material 828 on PC board 811B with well-known processes used in constructing such prior art devices. Alternately, magnetic material 828 can be a discrete magnet mounted on PC board 811B. Transducer cone 817B having coils 821 placed therearound can be mounted on PC board 811B having a contact at line 820.

Cone 817B can be constructed in planar form similar to the ferrite cone described with reference to FIG. 8D, as will now be described with reference to FIG. 8E. Planar cone 817B can have a flexible substrate and can have electrical interconnecting positions placed thereon. Interconnections 821 may be wires and can be generated with well-known thick film, and/or thin film techniques or with other known techniques. Interconnections 821 can be formed on a substrate such as a flexible PC board type substrate, a magnetic tape type substrate, or other substrate. The planar cone (FIG. 8E) can be assembled to form three-dimensional cone 817B (FIG. 8C) in the same form discussed relative to FIGS. 8B and 8D. After such assembly, interconnecting wires 821 line up at edges 826–822 and 827–822 as shown with dashed lines 830. Interconnections 821 can be soldered or otherwise connected together as indicated with dashed lines 830 (FIG. 8E) and the two ends of these interconnections can be interconnected to PC board 811B such as with wire jumpers or with PC board insertion and interconnection techniques used for other components as is known in the art.

In an acoustical signal to electrical signal transducer, acoustical energy induces motion into element 817 which will induce relative motion between the magnetic material and the coils (FIGS. 8B–8E). This relative motion induces an electrical signal into coils 821 for processing with amplifier 814 (FIGS. 8A, 8B, and 8C) and subsequently with electronic circuits 812 and 813. Although amplifier 814 is shown pointing in the reverse direction (FIGS. 8A–8C) to exemplify an electrical signal to acoustical signal transducer, one skilled in the art will now be able to adapt the arrangement of FIGS. 8A–8C to provide an acoustical signal to electrical signal transducer from the teachings herein.

The improved transducer feature of the present invention has been discussed for a conical-type element, which has been shown in FIG. 8 in the form of a relatively tall conical element 817 for illustrative purposes. Alternately, conical element 817 can be relatively short or flat to provide close electrical and magnetic coupling between the windings and the ferrite material. Alternately, element 817 may not be conical but may be a flat diaphram bonded to PC board 811 along line 820 to minimize distance between element 817 and PC board 811 thereby maximizing coupling.

Because of the monolithic nature of the audionic system of the present invention, an alternate preferred embodiment can also include a monolithic sound transducer. Such a monolithic sound transducer can perform the function of a microphone as an input device or as a speaker as an output device. It may be constructed with two electrodes such as by two parallel metalization planes separated by an insulator wherein the top or outtermost electrode may have a degree of physical motion. Depositing of metalization electrodes and insulation patterns is well known in the art, where a first metalization electrode can be deposited, an insulation pattern such as silicon dioxide can be deposited thereover, and a second metalization electrode can be deposited over the insulation layer. Deposition of a material to prevent the top metalization layer from fully adhering to the insulation layer can be provided so that the top metalization layer can be free to move in response to electrical fields or sound waves.

If the two electrodes are excited in a manner to cause electrostatic (capacitor) repulsion and attraction such as by exciting the lower electrode at ground potential and the upper electrode with an audio electrical signal, the upper electrode (which may not be fully bonded to the insulation layer) can vibrate to produce sonic vibrations in the air for use as a monolithic sound-generating transducer such as a speaker. Alternately, the electrodes can be excited such as with a constant voltage differential, wherein external sound waves can cause the top electrode to vibrate thereby changing the capacitance between the two electrodes. The variable capacitance can be sensed such as with a charge amplifier, capacitance bridge, or other well-known circuitry to generate a voltage related to the capacitance and therefore related to the sound waves for use as a monolithic sound sensing transducer such as a microphone.

Because of the susceptibility of a monolithic substrate to contamination and damage, it is desirable to protect the monolithic substrate but to permit sound waves to be transmitted from the monolithic substrate to the outside environment. This can be provided with a sealed package filled with dry nitrogen or other sound conducting medium for minimizing degradation of the monolithic structure. For example, air may degrade the monolithic structure due to oxidation and due to moisture in the air, where it is desirable to reduce the amount of oxygen and moisture in the package while preserving the sound conducting nature of the medium. Alternately, the package may be filled with other gaseous, or liquid, or solid media for conducting the sound between the monolithic transducer and the outside environment. For example, various compliant solids can be used in place of nitrogen gas, where the compliant solid can permit movement of the transducer element and can provide an inherent filler media.

Particular advantages will be achieved if the monolithic transducer is constructed as part of the monolithic structure of the audionic system. For example, all elements of this system can be constructed on the single monolithic structure including a CPU, a read only memory, an alterable memory, an output interface, and an output transducer.

Other monolithic and/or batch-fabricated transducer arrangements will now become obvious to those skilled in the art from the teachings herein.

SOUND SYSTEM

An improved sound system such as a high fidelity system, stereo sound system, auditorium sound system, etc can be implemented in accordance with the teachings of the present invention. A preferred embodiment is shown in FIG. 1A which can include data processor 112, control panel 114, tape reader 116, tape recorder 144, display panel 118, sound signal input arrangement 140 and 164, and sound response arrangement 100. Also, power drives 120-122 are shown for controlling a physical device 124 which can be an audio transducer such as a speaker in this sound system embodiment. Further, various peripheral and auxiliary devices are shown communicating with processor 112 through I/O channels 128.

Prior art sound systems are conventionally implemented with special-purpose analog circuitry and controlled with analog devices such as potentiometers and switches and having displays implemented with analog meters.

Machine 124 has been described in the embodiment of a machine tool in the referenced patent applications but may herein be described in the embodiment of a sound transducer arrangement. In a preferred embodiment of a sound system, machine 124 can be a known audio transducer for generating sound signals in response to electrical signals. Device 124 can be controlled with analog signals, pulse modulated signals, and other signals and, in a preferred embodiment, can be controlled with pulse width modulated signals. Alternately, device 124 may be controlled with a hybrid embodiment as discussed with reference to audionic response device 100.

Interface devices 120-122 have been described in the embodiment of servo drives for controlling a machine but alternately can be configured as drives for an audio transducer as discussed herein. Devices 120-122 can generate pulse modulated signals as disclosed in the referenced patent applications and as discussed herein or can generate analog signals such as with power amplifiers as disclosed in the referenced patent applications for the alternate embodiment of a machine 124.

Data processor 112 has been described in the preferred embodiment of a monolithic data processor, which provides particular advantages with the sound system arrangement of the present invention. Processor 112 can operate as a supervisory and control processor such as discussed for the machine tool control systems of the referenced patent applications. For example, processor 112 can control the amplitude of signals to device 124 such as by various scaling techniques with the use of a multiplying DAC for controlling amplitude of an analog signal or alternately by scaling pulse modulated signals such as under program control. Further, processor 112 can receive operator inputs from panel 114 and generate operator displays to panel 118 in a form consistent with sound system operation. Yet further, processor 112 can perform various time-related control functions such as by automatically turning on a radio receiver and a tape recorder for unattended recording a program, for providing a clock display, and for controlling various time-related functions. Still further, processor 112 can search a record or a tape for a particular selection as discussed for the tape search arrangements using tape reader 116 for the machine control arrangements of the referenced patent applications. Yet still further, processor 112 can provide automatic tuning such as by monitoring a tuning signal and by controlling a frequency synthesizer to maximize the tuning signal; wherein tuning signal generators are provided for prior art tuning displays and frequency synthesizer tuners are provided for prior art radio tuning arrangements.

Other known sound system functions can be controlled with processor 112. For example, multi-channel balance controls can be provided as discussed for a volume control herein. Also, treble and base controls can be provided such as with digitally controllable filters. These filters can be reactive digital-to-analog converters or can be the compensation-type arrangements as discussed in referenced application Ser. No. 302,771 or can be various known arrangements. Yet further, processor 112 can perform various switching functions such as with relay control as discussed in the referenced patent applications to select various peripherals as sources and/or as destinations including tape, records, radio, and other such peripherals.

Data processor 112 can control amplifiers and can monitor amplifiers using well-known control and monitoring techniques such as set forth in the referenced applications. One such control technique is to provide switching and controlling functions such as through relays, electronic switches, multiplying digital-to-analog converters, and other such devices; many of which are well known in the art and many of which are discussed in the referenced patent applications.

Monitoring operations can be performed with A/D converter 164 as discussed with reference to FIG. 3 of U.S. Pat. No. 4,016,540. Data processor 112 processes the monitored signals and then controls display panel 118, audionic interface 100, and/or other equipment in response thereto. For example, data processor 112 can monitor audio amplifier power levels with A/D converter 164 and can display power-related information on display panel 118. One embodiment of such a monitoring system having an audionic output is discussed in U.S. Pat. No. 4,016,540 such as at column 31 entitled Vehicular Announciator. Further, computer 112 can provide scheduling, sequencing, controlling, timing, and other computer operations such as disclosed in the chain of copending applications relative to machine control; which can be adapted for controlling the sound system of the present invention from the teachings herein. For example, an operator can input a desired tape or record selection, where data processor 112 can control a search of a tape or a record.

Data processor 112 can also receive selection information from the operator through control panel 114 such as the station and time of a desired program, wherein data processor 112 can operate independently and unattended to turn on a radio, select a station, and record the program such as on a magnetic tape as exemplified with the teachings in the referenced patent applications.

Sound input arrangement 140 and 164 can be provided as a well-known microphone input such as for voice, guitar, and other inputs. Data processor 112 can monitor sound signals 101 processed with converter 164, as discussed for the sound input arrangement herein. Alternately, data processor 112 can switch audio signal 141 into various audio channels such as to audio amplifiers 120–122; wherein the arrangement thereof will now become obvious from the teachings herein.

Display panel 118 and control panel 114 have been discussed in detail in the referenced patent applications in the embodiment of a numerical control arrangement, a business system arrangement, and other arrangements; wherein this display and control panel arrangement will herein be discussed in the embodiment of a control and display arrangement for a sound system.

Tape reader 116 and tape recorder 144 have been discussed in the embodiment of a punched tape reader and a tape punch respectively for a machine tool system, but tape reader 116 and tape recorder 144 will herein be discussed as exemplifying other tape systems such as audio tape systems for the sound system arrangement of the present invention.

Various peripherals and auxiliary devices which interface through I/O channels 128 such as CRT 158, typewriter 156, etc can be used in conjunction with the sound system arrangement of the present invention.

System 110 can provide a clock capability such as for display with panel 118 or for audionic generation with output device 100.

Machine 124 exemplifies various sound system machines such as tape units, record players, etc which can be controlled with data processor 112 with discrete control signals 126 for controlling relays and motors and/or using servo interfaces 120–122 for controlling motors in a manner similar to the control of machine tool 124 as discussed in the referenced patent applications, the adaptation of which to the sound system of the present invention will now become obvious from the teachings herein.

A tuning control arrangement will now be discussed with reference to FIG. 1A. An operator controls a tuner to select a desired station. A known tuning circuit generates a tuning signal that can be monitored to detect the peak signal for alerting the operator to a peak signal condition to aid in station selection.

In one embodiment, a tuning aid may be provided for an operator. For example, as an operator tunes a radio dial, an RF signal strength indication can be generated as an analog signal such as used with signal strength meters and tuning meters in the prior art. Data processor 112 monitors an RF signal strength signal such as with A/D converter 164 and generates output signals related to tuning information. For example, data processor 112 can provide output signal 101 to generate audionic signal 105 which can be increasing and decreasing in amplitude, pitch, or other characteristics as the operator tunes closer to a station or further from a station respectively and computer 112 can detect the peak signal such as with a digital peak detection arrangement for generating an output audio tone 105 in response to detection of the peak signal. Such a peak detector signal can merely subtract adjacent samples to determine when the slope of the monitored signal changes direction. Other peak detector arrangements will now become obvious from the teachings herein. Alternately, well-known analog peak detectors can be used to generate a tone directly to audionic output device 100 or to generate a signal to computer 112 such as through spare I/O channels 128 or discrete channels 126 as being indicative of a peak signal for commanding generation of an output tone. A visual display can be provided in place of the tone or in addition to the tone, wherein computer 112 can control display panel 118 in a manner similar to that discussed for the audionic output.

In another embodiment, a prior art peak detector circuit can be used to monitor the tuning signal and to either excite a light as indicative of a peak condition or generate an audio response signal to indicate a peak signal condition. Data processor 112 can monitor the tuning signal directly such as through converter 164 to determine the peak signal. Alternately, data processor 112 can monitor the output of a peak detector such as through converter 164 to determine the peak signal. Upon detection of a peak signal, processor 112 can generate an output display signal to panel 118, and/or an output tone signal to audio interface 100, and/or other output signal to alert an operator to a peak signal condition. Alternately, special-purpose arrangements can be used in place of the programmable processor of the present invention.

In still another tuning embodiment, an operator enters tuning information through control panel 114, wherein processor 112 performs tuning automatically such as by controlling a frequency synthesizer. In this embodiment, an operator enters a desired station frequency with control panel 114, wherein processor 112 displays station identification on numeric display 238. In one embodiment, the tuning frequency is entered with keyboard 244 and is displayed with display 238. In another embodiment, the call letters of a station are entered with keyboard 244 and are displayed on display 238. In yet another embodiment, the frequency is entered with keyboard 244 and the station call letters are displayed on display 238. In still another embodiment, the station call letters are entered with keyboard 244 and the frequency is displayed with display 238. Although keyboard 244 is shown as a numeric keyboard in FIG. 2, keyboard 244 can readily be expanded to an alphanumeric keyboard as is well known in the art. Similarly, display 238 is shown as a numeric display but can be implemented as an alphanumeric display that is known in the art.

Conversion between station frequency and station call letter information can be performed with a well-known table-lookup operation in data processor 112. In one embodiment, a table of station frequencies and call letters are loaded into data processor 112 through control panel 114, through tape reader 116, or through other peripherals or alternately are received over a radio data link such as from a radio station.

Another feature of the present invention uses a sampled filter arrangement to reduce noise, to reduce the effect of scratches on records, etc. For example, sampled filters generate filtered output information in response to input information, wherein the output information has reduced noise and reduced effects of perturbing influences. Such an arrangement can be implemented with digital electronics, charge coupled devices, and other known arrangements and can be implemented as discussed in the referenced patent applications. Although the referenced applications describe preferred embodiments of correlators, Fourier transform processors, etc; sampled filters for reducing noise, scratch sounds, etc can be implemented from the teachings therein to provide the capabilities discussed herein.

A reverberation unit has been described with reference to FIG. 4 of copending application Ser. No. 812,285; wherein that reverberation unit can be used with the audio system of the present invention. In one embodiment, a patchboard network can be used for programming the reverberation unit. In an alternate embodiment, electronic switches can be used in place of a patchboard such as with an electronic switch matrix or a crossbar switch arrangement for automatically programming the reverberation unit under control of computer 112. Such programmable arrangements are well known in the art, wherein patchboard arrangements are well known in the analog computer art and wherein crossbar switch arrangements are well known in the automatic test equipment art.

The arrangement discussed with reference to FIG. 1A is provided in the form of a machine control system for consistency with the chain of copending applications which provide detailed disclosures of interfaces, structures, and operations. Although the elements of the disclosures in the chain of copending applications may not be identical to the well-known elements exemplified therewith, the operations and use of the disclosed elements and the desired elements are now well known in the art wherein one skilled in the art may provide substitutions therebetween based upon the teachings of the present invention. For example, servos 120–122 include amplifiers which are similar to audio amplifiers in high fidelity systems. Further, tape reader 116 and/or tape recorder 144 characterize tape readers and tape recorders such as cassette and audio tape recorders. Still further, control panel 114 and display panel 118 are typical of control and display panels having operator input elements such as switch elements and operator output elements such as display elements. Yet further, microphone 140 may be a conventional air coupled audio microphone or may be other transducers such as a guitar microphone. Also, many audio elements can be controlled with digital words such as a well-known programmable frequency synthesizer for a radio receiver or radio transmitter, wherein the disclosure of data processor 112 generating digital words for controlling various peripherals shown in FIG. 1A is exemplary of data processor 112 controlling various other peripherals such as a frequency synthesizer for a high fidelity system embodiment.

CRT DISPLAY ARRANGEMENT

Particular advantages can be achieved by using the combination of elements shown in FIG. 1A; particularly the combination of the monolithic data processor 112, the audio response arrangement 100, the CRT arrangement 158, the display arrangement 118, and the control arrangement 114. This combination provides the important elements for operator interaction, including input controls with control panel 114, processing intelligence with data processor 112, and output audio and visual messages for operator interaction with audio response device 100, CRT 158, and display panel 118. Particular economies are achieved if data processor 112 provides audio responses and visual responses under program control in accordance with the system of the present invention. Data processor 112 is disclosed in application Ser. No. 101,881. Audio response arrangement 100 is disclosed herein and in U.S. Pat. No. 4,016,540. CRT arrangement 158 is disclosed in related applications referenced herein including application Ser. No. 230,872 at page 5 lines 27–31 and page 16 line 14 to page 19 line 2, and elsewhere therein; in application Ser. No. 232,459 relative to element 158 (FIG. 1A); in application Ser. No. 246,867 at page 14 lines 1–12 and elsewhere therein; in application Ser. No. 288,247 at page 3 lines 3–7, page 8 lines 24–27, page 55 line 30 to page 56 line 8, and elsewhere therein; in application Ser. No. 291,394 at page 5 lines 11–14 and elsewhere therein; and in application Ser. No. 302,771 at page 78 line 1 to page 80 line 24 and elsewhere therein. Further, the related applications referenced herein set forth extensive detail on interfacing of the data processor 112 to various peripherals; which disclosures are applicable to interfacing well-known CRT displays such as display 158 to data processor 112.

The combination of a CRT display and an audionic response arrangement has been found to provide important advantages for operator interaction, particularly when further combined with the monolithic data processor of the present invention to provide processing capability therewith. Further, the improved interfacing arrangement of the present invention and the monolithic data processor of the present invention provide significant advantages over prior art systems, including the advantages of using a stored program data processor for controlling audionic and CRT display peripherals.

Further advantages are provided by including the display and control capability provided with display panel 118 and control panel 114 as discussed herein and in greater detail in the referenced patent applications.

Use may be made of the system of the present invention in CRT display systems. Such systems can incorporate a stored program computer and preferably the monolithic computer of the present invention to provide intelligent interactive capability. The combination of audionic and visual feedback to an operator further enhances operator interaction.

Use of the system of the present invention as a game such as a television game enhances such a game product. For example, CRT 158 may be any known CRT such as a television receiver CRT display which may be used for television game products. Incorporation of the monolithic data processor of the present invention, the audionic response system of the present invention, and/or other elements of the present invention in combination with the CRT display in a television game embodiment provides significant advantages over prior art television games.

Many other uses of the system of the present invention will now become obvious from the teachings herein including combinations of monolithic data processor 112, audionic response arrangement 100, CRT display 158, and other devices of the system of the present invention.

A television control arrangement will now be discussed in accordance with another feature of the present invention. TV receivers are well known in the art. Further, TV receivers have been widely used in the prior art to provide auxiliary capabilities such as for general display capabilities. Such arrangements typically utilize special-purpose hard-wired logic. In accordance with another feature of the present invention, a stored program data processor is used in conjunction with a CRT display for providing visual messages in addition to sound messages. In a preferred embodiment, the controlling device may be the data processor arrangement of the present invention implemented as a monolithic stored program data processor. A preferred embodiment thereof will now be discussed with reference to FIG. 1A.

Data processor 112 generates audionic messages with signal 101 to audionic device 100. Further, data processor 112 communicates with CRT 158 through I/O channels 128 to provide CRT display capability. CRT interfaces are well known in the art and further CRT interfaces are discussed in the referenced patent applications. Further, many CRT interfaces utilize the well-known teletype interface, which is disclosed in the referenced patent applications. Other CRT interfaces are well known in the art and may be implemented with the system of the present invention from the teachings herein. Therefore, an improved CRT display arrangement is provided in accordance with the present invention and a CRT display arrangement in combination with the audionic message arrangement of the present invention provides particular multi-sensory advantages, especially in combination with the monolithic data processor of the present invention and the improved control and display arrangement of the present invention.

A video tape recorder arrangement will now be discussed for the CRT embodiment of the present invention. A video tape recorder is well known in the art for recording television program information. Such recorders are implemented for recording television programs but, in accordance with the present invention, can be used for recording television game and television display information such as with the system of the present invention. Such a recorder is exemplified with tape reader 116 and/or tape recorder 144, wherein a video tape recorder can be controlled with microcomputer 112 to record and playback information from CRT 158. In a television game embodiment, game information is recorded on the video tape recorder for playback to analyze the game, to resolve questions on the game, and/or for entertainment by monitoring a game played at a prior time. Similarly, a video tape recorder can be used to provide background displays for television games and for other purposes such as by superimposing or mixing the video tape recorder playback signals and other signals such as from a television game arrangement. Other uses of a video tape recorder in combination with a microprocessor 112, a tape recorder exemplified with tape punch 144 and tape playback unit exemplified with tape recorder 116, and/or other system elements such as shown in FIG. 1A may be implemented to provide further advantages and further capabilities in accordance with the system of the present invention.

PULSE MODULATED CONTROL

Pulse modulated control can be implemented with the system of the present invention for various uses exemplified by machine control and illumination control; as discussed in the referenced patent applications, as is well known in the art, and as further discussed herein. Although pulse modulation may herein be exemplified with pulsed-width-modulation, it is herein intended that pulse-width-modulation be exemplary of other types of pulse modulation such as pulse-rate-modulation, pulse-code-modulation, and other types of pulse modulation.

A pulse modulation arrangement for use with a sound system such as a high fidelity and/or stereo type sound system will now be discussed with reference to FIG. 1A of U.S. Pat. No. 4,016,540. Data processor 112 can generate control signals such as whole number and discrete control signals 123 and 126 to interface electronics such as elements 120–122 and to device 124 which can be a pulse-width-modulated sound system. For example, machine 124 can be a sound transducer such as a speaker and electronic devices 120–122 can be pulse-width-modulated amplifiers and controls used in place of the pulse-width-modulated servos which are discussed in the referenced patent applications. Alternately, pulse modulated digital signals can be generated with data processor 112 such as with a discrete output signal which can be signal 101 to interface device 100. In an embodiment where signal 101 is a pulse modulated signal, element 102 can be a power amplifier to generate pulse modulated signal 103 as a power signal to drive transducer 104 to generate sound signal 105. Use of a data processor to generate a pulse modulated output signal such as with a discrete signal is discussed in referenced application Ser. No. 134,958 at page 22 line 2 to page 23 line 15 and elsewhere in the referenced patent applications. The above-described arrangement can be used for a sound response system such as discussed with reference to interface 100 (FIG. 1A) which may be used for a toy, a game, or multitudes of other uses some of which are discussed in referenced U.S. Pat. No. 4,016,540. Further uses of this pulse modulation arrangement will now become obvious from the teachings herein.

Pulse-width-modulation has been discussed in detail in the referenced patent applications for a machine control embodiment and for an illumination control embodiment, wherein these disclosures have been incorporated herein by reference. For example, a pulse-width-modulated arrangement has been disclosed in referenced application Ser. No. 101,881 particularly with reference to FIGS. 1 and 16–19 therein; at page 33 lines 13–27, page 85 lines 23–25, page 86 lines 7–24, and page 88 lines 11–15; and elsewhere therein. Further, a pulse-width-modulation arrangement has been disclosed in referenced application Ser. No. 134,958 particularly at page 3 lines 21–28, page 6 lines 14–24, and page 22 line 2 to page 23 line 15, and elsewhere therein. Yet further, a pulse-width-modulated arrangement has been disclosed in referenced application Ser. No. 135,040 particularly at page 10 lines 10–15, page 18 lines 16–26, page 22 lines 1–28, page 24 lines 14–28, page 26 lines 10–16, page 31 line 4 to page 32 line 5, and elsewhere therein. Still further, a pulse-width-modulation arrangement has been disclosed in referenced application Ser. No. 246,867 particularly in FIGS. 4A and 4B; at page 24 lines 27–33 and page 27 line 1 to page 34 line 30; and elsewhere therein. Yet further, a pulse-width-modulated arrangement has been disclosed in referenced application Ser. No. 302,771 particularly with reference to FIGS. 5, 6, and 8; at page 21 line 30 to page 22 line 2 and page 57 line 1 to page 67 line 24; and elsewhere therein. Still further, a pulse-width-modulated arrangement has been disclosed in referenced applications Ser. No. 366,714;. Ser. No. 727,330; and Ser. No. 730,756 particularly with reference to FIGS. 2 and 6E and at page 16 lines 10–19, page 17 line 1 to page 21 line 15, page 46 lines 18–30, and page 48 lines 12–34; and elsewhere therein and further with reference to applications Ser. No. 727,330 and Ser. No. 730,756 particularly at page 172 lines 9–25 and elsewhere therein.

As an alternate embodiment to the D/A converter of the interface device, a pulse modulated or other duty cycle modulated arrangement can be used. Such a duty cycle arrangement provides particular advantages, where a duty cycle device may be a digital device which may be more compatible with the digital electronics of the digital audionic system than would be a hybrid D/A converter arrangement. Various pulse modulated devices such as pulse-width-modulated devices are set forth in the copending applications in the chain of related applications which are incorporated by reference such as for the pulse-width-modulated servo drives of referenced applications Ser. No. 101,881; Ser. No. 134,958; Ser. No. 135,040; Ser. No. 339,817 now U.S. Pat. No. 4,034,276; and Ser. No. 339,688 and for illumination control in referenced applications Ser. No. 366,714 now U.S. Pat. No. 3,986,022; Ser. No. 727,330; and Ser. No. 730,756 set forth a pulse-width-modulated arrangement in FIGS. 2B, 2C, and 2D therein. Further, various pulse-width-modulated drives are commercially available and may be used with the system of the present invention for output transducer drivers in place of the D/A converter arrangement discussed herein.

In one embodiment such as discussed herein with reference to FIGS. 9A and 9B, a pulse-width-modulated signal may be generated with a counter such as by loading the output digital number into the counter and permitting the counter to count-down to zero. When the counter counts-down to zero, detection of the counter zero condition or the counter overflow condition can be used to reset a flip-flop. The flip-flop can be set at the start of the new cycle. Therefore, the output of the flip-flop set at the beginning of a cycle and reset after a controlled period of time provides a pulse-width-modulated output signal to drive an output transducer. Alternately, the pulse-width-modulated signal can be generated under program control of the computer, where the computer can set the flip-flop at the beginning of a cycle and can provide a program time delay for resetting the flip-flop thereby performing the same function as the counter described above; such as discussed in greater detail in the related applications referenced herein.

Further, the pulse modulated servo arrangement of the referenced patent applications set forth interface register and counter arrangements for interfacing a computer to a servo. These arrangements are exemplary of interfacing a computer to a sound generation arrangement wherein servo electronics 120–122 of the referenced patent applications is exemplary of sound interface electronics and wherein machine 124 of the referenced patent applications is exemplary of a sound transducer such as a speaker.

The audionic system of U.S. Pat. No. 4,016,540 has been discussed in a preferred embodiment using a digital-to-analog converter 102 to interface between data processor 112 and transducer 104 (FIG. 1A). Alternately, other arrangements can be used including analog, hybrid, and digital arrangements as disclosed in U.S. Pat. No. 4,016,540 particularly at column 7 lines 15–24 and also at column 5 line 67 to column 6 line 19 and elsewhere therein. An analog embodiment is exemplified by the direct outputting of analog signals stored in an analog ROM or other analog memory as discussed in referenced application Ser. No. 812,285 such as at page 41 line 16 to page 42 line 7 and elsewhere therein. A hybrid (analog and digital) embodiment is characterized by the digital-to-analog converter arrangement discussed in U.S. Pat. No. 4,016,540 with reference to FIG. 3. A digital embodiment can be implemented as the pulse modulated embodiment discussed herein such as with reference to FIGS. 9A and 9B. Further, a digital embodiment is illustrated in the referenced applications such as applications Ser. No. 101,881; Ser. No. 134,958; Ser. No. 135,040; Ser. No. 302,771; etc such as for controlling analog servos with pulse-width-modulated signals as discussed elsewhere herein wherein digital commands are loaded into counters and registers for controlling pulse-width-modulated servos. Many other embodiments will now become obvious to those skilled in the art from the teachings herein.

TIME-DOMAIN PULSE MODULATION

A time-domain pulse modulator will now be discussed for a preferred embodiment using the monolithic computer of the system of the present invention for generating a pulse-width-modulated signal under program control. Other pulse modulation arrangements will now become obvious from the teachings herein such as using program controlled arrangements as described herein and as described in related application Ser. No. 134,958 at page 22 line 2 to page 23 line 15; or using hardwired arrangements as disclosed in the related patent applications referenced herein; or using other computers, programs, and/or arrangements as will now become obvious from the teachings herein.

A program controlled pulse-width-modulation arrangement will now be discussed with reference to FIGS. 9A and 9B. An interface arrangement 971 consistent with the data processor of referenced application Ser. No. 101,881 is illustrated in FIG. 9A. A flow diagram 976 for generating a pulse-width-modulated signal with arrangement 971 (FIG. 9A) is illustrated in FIG. 9B. Arrangement 971 constitutes set-reset flip-flop 972 which is set by discrete output signal DO-8, reset by discrete output signal DO-9, and used to control device 974 with output signal 975 from flip-flop 972. Device 974 can be an audio speaker, a servo, or other device controlled with a pulse modulated signal. Amplifier 973 can be used to amplify output signal 975 to drive output device 974. Feedback signal DI-8 provides feedback on the state of flip-flop 972 to the data processor. The data processor generates signal DO-8 to set flip-flop 972 and generates signal DO-9 to reset flip-flop 972 under program control using discrete output instructions. A time delay between generating the DO-8 signal and the DO-9 signal controls the time period that output signal 975 is in the high state or the duty cycle of output signal 975. Therefore, the duty cycle of output signal 975 can be directly controlled by the data processor under program control. One form of program control which is exemplary of a wide range of methods is discussed herein with reference to FIG. 9B.

Flow diagram 976 (FIG. 9B) illustrates one method for generating pulse-width-modulated signal 975 under program control. The computer enters subroutine 976 through operation 977 and exits subroutine 976 through operation 983 with well-known subroutine operations. For example, ENTER operation 977 can include a calling sequence such as saving the return address to the main program or to the executive program and EXIT operation 983 can include fetching the stored return address and transferring back to the main program location defined with the return address, as is well known in the computer programming art.

After entering subroutine 976 through operation 977, the program initializes the subroutine such as by loading parameters or constants into various registers and memory locations. For example, a time delay word that defines the width of the pulse-width-modulated signal is defined as the $N_o$ parameter which is loaded into the N scratchpad register; wherein this scratchpad register designation is provided for convenience and may be assigned to any scratchpad register or other storage in the computer. The time delay number $N_o$ can be provided as a stored constant, or generated under program control, or generated by various known methods to determine the time delay between discrete output signals which determines the width of output pulse 975 and therefore the information content of the pulse-width-modulated signal.

The program generates the DO-8 signal with a discrete output instruction to set flip-flop 972 with operation 979 and then executes a time delay iterative routine using decrement operation 980 and test operation 981 to control the width of pulse-width-modulated output signal 975. The N-parameter is successively decremented in operation 980 to provide a time delay and tested with operation 981 to detect when the time delay has expired. Operations 980 and 981 can be implemented with a decrement and transfer on non-negative instruction, where the N-parameter in the N-register is decremented and the program operation transferred until the N-parameter is decremented to a negative number. The conditional transfer on the N-parameter being non-negative is shown by the looping back from the test operation 981 to the decrement operation 980 along the positive path. When the N-parameter has been decremented to a negative number, the conditional transfer is disabled and the program operations continue in sequence to operations 982 and 983.

Operation 982 discontinues the pulse-width-modulated output signal 975 by generating the DO-9 signal with a discrete output instruction to flip-flop 972. Program operation then continues to exit operation 983 to exit the subroutine.

AUDIONIC TOYS AND GAMES

The audionic system of the present invention has particular advantages when applied to toys and games. For example, sound generation for interactive games such as TV games and speech generation for toys such as a talking doll has particular advantages. In a preferred embodiment, an audionic toy can be configured with the audionic system discussed with reference to FIGS. 1A and 1B herein and in U.S. Pat. No. 4,016,540; can be configured in a batch-fabricated form as discussed with reference to FIG. 8A herein; can use a batch-fabricated speaker arrangement as discussed with reference to FIGS. 8A to 8E herein; can use the microcomputer as briefly discussed with reference to FIG. 1A herein and in U.S. Pat. No. 4,016,540 and as discussed in detail in copending application Ser. No. 101, 881; and in a preferred embodiment can use an analog read only memory as discussed in copending application Ser. No. 812,285 and continuations and divisionals therefrom such as with reference to FIGS. 1 and 2 therein.

Further, the audionic toy of the present invention can also include illumination and display devices as discussed in referenced U.S. Pat. No. 3,986,022 and in referenced applications Ser. No. 727,330 and Ser. No. 730,756. For example, digital control and particularly microcomputer control of liquid crystal displays can be implemented as discussed in said referenced patent and copending applications in accordance with the interface disclosure of the system of the present invention such as the interface between data processor 112 and display panel 118 as discussed in referenced application Ser. No. 101,881. Further, the display arrangement disclosed in said referenced patent and applications may be used in accordance with the teachings therein in combination with the system of the present invention.

The control arrangement of the present invention such as the switches discussed with reference to FIG. 2 can be used in combination with the system of the present invention in a toy embodiment. For example, the switches can be used to command microcomputer 112 to provide various audionic and display responses wherein actuation of a switch can cause generation of an audionic reply from a talking doll, or control of an illumination image, or an audionic response in a game or other use as will now become obvious from the teachings herein.

In accordance with another feature of the present invention, a sound responsive toy or other system can be provided. For example, microphone 140 can be used to detect sound energy and to generate sound signal 141, which is converted with A/D converter 164 to provide digital input signal 101 to data processor 112. Data processor 112 can process the input digital sound information with well-known sound recognition programs and can generate output signals in response thereto. One output signal can be audio response signal 101 to audionic output device 100. An alternate response can be generation of output signals 115A to display panel 118 for generating a visual response. Still other responses can be generated with output signals 123 to servos 120–122 to control a machine or through spare I/O channels 128 to control other devices. In yet another embodiment, computer 112 can generate output signals to control a lock system such as discussed in applications Ser. No. 438,328 now U.S. Pat. No. 3,897,753; Ser. No. 583,136 now U.S. Pat. No. 4,036,178; and Ser. No. 814,818 being incorporated herein by reference.

Another embodiment of an audionic toy can be an audionic doll having an audionic heartbeat feature. Such a toy may be particularly attractive for babies who are responsive to a heartbeat effect but who do not understand speech. It has been shown that such a heartbeat effect has a soothing effect on a baby. A heartbeat sound can be implemented from the teachings herein such as by storing sound samples of a heartbeat or by synthesizing heartbeat signals iteratively under program control. Further advantage can be achieved by providing a transducer that can generate a heartbeat type motion in addition to sound to stimulate a feeling sensation in addition to an audio sensation.

In yet another embodiment, a whistling doll can be provided such as by generating tones and controlling the tones in frequency and amplitude such as discussed with reference to FIGS. 4 and 5 herein. Such a whistling implementation may require only a single sinewave cycle to be synthesized, wherein the sinewave cycle can be generated repetitively for the desired duration of the particular note and can be controlled in frequency and amplitude such as discussed with reference to FIGS. 6C and 6D of referenced application Ser. No. 844,765. A sequence of notes can be generated wherein the duration of time for each note, the frequency of each note, and the amplitude of each note can be controlled based upon the teachings herein and in application Ser. No. 844,765.

In yet another toy embodiment, an audionic device can be used in a toy animal to synthesize animal noises such as barking and growling for a dog and meowing and purring for a cat. Such sounds can be synthesized based upon the teachings herein.

OPTICAL EFFECTS

Various optical effects can be provided for electronic devices such as for electronic toys and games. In a preferred embodiment, these optical effects can be provided with liquid crystal optical devices under control of a microcomputer such as disclosed in the referenced patent applications; wherein this preferred embodiment is intended to exemplify generalized optical effects that can be controlled with any computer or circuit arrangement. Alternately, non-microcomputer related control arrangements can be implemented in accordance with the teachings of the present invention using optical devices in general and control circuits in general that are exemplified by the microcomputer controlled liquid crystal arrangement of this preferred embodiment.

Optical effects will now be exemplified with a liquid crystal eyelid embodiment for a toy doll with reference to FIG. 9C. Illustration 984 shows liquid crystal eyelids 986 controlling illumination 987 to illuminate eye patterns 988. Illustration 984A shows liquid crystal eyelids 986A being controlled to be transmissive for viewing eye patterns 988 indicative of open eyes and illustration 984B shows liquid crystal eyelids 986B controlled to be non-transparent for obscuring eye patterns 988 indicative of closed eyes. Eye patterns 988 may be any known eye pattern arrangement such as painted or otherwise colored eyes such as conventionally used in dolls. Liquid crystal elements 986 can be implemented with liquid crystal techniques discussed in U.S. Pat. No. 3,986,022 and copending applications Ser. No. 727,330 and Ser. No. 730,756. The two liquid crystal eyelids 986 can be controlled together to be transparent and non-transparent to provide an awake effect and a sleeping effect respectively. Further, the two liquid crystal eyelids 986 can be controlled separately such as for controlling one of the two eyelids to be transparent while the ether eyelid is controlled to be opaque and then transparent for a winking effect. Further, eyelids 986 can be controlled in various ways such as multiple sequential on and off transparent and non-transparent control operations to provide a fluttering eye effect. Yet further, eyelids 986 can be implemented in segments such as to provide half-closed eyelid effects. Many other effects will now become obvious from the teachings herein.

Control arrangements are discussed in detail in said patent and in said two copending applications such as pulse modulated control, digital control, and analog control. Further, in a preferred embodiment, the microcomputer of the present invention can be used to control devices 986 such as discussed in said patent and two copending applications such as for a camera control embodiment and a pulse modulation control embodiment discussed therein.

A simplified control arrangement 985 (FIG. 9D) will now be provided to exemplify operation of the liquid crystal doll eye embodiment. Liquid crystal eyes 986 can include a first eye element 986C and a second eye element 986D being excited with excitation signal EXCIT under control of switches 989 and 990. Switch 989 provides dual eyelid control and switch 990 provides single eyelid control. Dual eyelid control switch 989 may be a well-known double-pole double-through (DPDT) type switch where both contacts operate together to control both LCD elements together for both eyelids to be opened or closed together. Switch 989 may be implemented as a gravity switch. The gravity switch will open when the doll is upright to provide an open eyelid condition 984A and will close when the doll is reclining to provide a closed eyelid condition 984B. Such gravity switches are well known in the art such as mercury switches and such as safety switches exemplified with the switch in Sears Kenmore portable heater Model No 771-72230. Single eyelid control switch 990 may be a well-known single-pole double-through (SPDT) switch with a censer off position for selecting either element 986C to be non-transmissive when in the up position, or to select element 986D to be non-transmissive when in the down position, or to select both elements 986C and 986D to be transmissive when in the center-off position. Corresponding terminals of switches 989 and 990 are connected together for control of elements 986C and 986D in accordance with the dual eye control and single eye control arrangements discussed above.

Further, liquid crystal devices 986 can be implemented as eyeglasses (either for a doll or for a human) which may be controlled to be transmissive for conventional eyeglasses and opaque or semi-opaque for sunglasses.

Still further, eyelids 986 and eye patterns 988 can be combined into a single element being a liquid crystal element having concentric controllable sub-elements. Control of an inner concentric element to be continuously non-transmissive, control of the middle concentric element to be partially transmissive, and control of the outer concentric element to be transparent provides the effect of an open eye and control of all elements to be fully non-transmissive provides the effect of a closed eye. Such a concentric circle control arrangement is discussed in the embodiment of a shutter and aperture for a camera in U.S. Pat. No. 3,986,022 and in copending applications Ser. No. 727,330 and Ser. No. 730,756 with reference to FIG. 8 therein.

Optical effects for toys and games will now be exemplified with a three-dimensional illumination control arrangement 991 (FIG. 9E). For simplicity of discussion, this embodiment will be discussed in the arrangement of the transparent person toy. Such a toy has been implemented in the prior art using transparent plastic elements mounted within each other and formed to appear as internal parts therebetween such as for internal organs presented in a transparent doll type figure. In this arrangement, element 994 is shown internal to element 993 which is shown internal to element 992. Each element 992–994 includes liquid crystal illumination control elements which are controlled to be transmissive or non-transmissive. Switch 995 applies excitation signal EXCIT to either outer element 992 to make outer element 992 non-transmissive, to middle element 993 to make middle element 993 non-transmissive, and/or to neither element 992 nor 993 to permit viewing of inner element 994 through transparent elements 992 and 993. Therefore, liquid crystal arrangements can be provided internal to other liquid crystal arrangements for selective viewing of internal elements as a function of excitation of the more outer elements.

The projection display arrangement of copending application Ser. No. 730,756 may be used to provide large screen display capability for enhanced effectiveness in combination with a small low-cost illumination amplifier device. This game embodiment exemplifies the general concept of projection displays for enhanced utility and economy. A game projection display arrangement will now be discussed with reference to FIG. 14A of application Ser. No. 730,756 An electronic game can be implemented having an illumination amplifier display such as a chess game, a "battleship" game, or other games. The illumination amplifier display can be implemented as illumination amplifier 104 in image generator 1450 as part of projector 1410 for projection of the display as illumination 1414 on screen 1451.

Other uses of displays for toys will now become obvious from the teachings herein. For example, projection LCD displays (or non-projection LCD displays) can be used for board games such as bingo, battleship, monopoly, tic-tac-toe, dungeons and dragons, etc.

SOUND ACTUATED ARRANGEMENT

A sound actuated arrangement will now be discussed for a voice actuated preferred embodiment. This voice preferred voice actuated embodiment is intended to be exemplary of the more general sound actuated embodiments; wherein a device may be actuated by a voice, by a whistle, by a machine sound, or by other sounds. In a preferred embodiment, the sound actuated system has the capability to be selectively responsive to certain sounds and to be selectively non-responsive to other sounds. For example, in a voice actuated system, the system can be responsive to particular voices and/or particular words and can be non-responsive to other voices and/or other words. Alternately, the system can be responsive to any sound such as for a burglar alarm system, or the system can be responsive to any sounds within a particular amplitude, or the system can be responsive to sounds within a particular frequency band, or the system may be responsive to other sound characteristics.

Voice recognition systems are well known in the art such as manufactured by Scope, Digital Equipment Corp, etc; wherein such known systems may be used in accordance to the teachings of the present invention to provide a voice actuated arrangement.

A preferred embodiment of a sound responsive system will now be discussed with reference to FIG. 1A. Other embodiments will now become obvious from the teachings herein. A sound responsive system 110 includes sound transducer 140 for generating transducer signal 141 to interface device 164 for processing with data processor 112. Processor 112 generates sound responsive output signals such as signals 123 and 126 for controlling machine 124, or signals 115A and 115B for interfacing with an operator through displays 118, or signal 101 for controlling a sound message generator 100, or other signals for controlling other equipment such as through I/O channels 128. Transducer 140 may be a well-known microphone or may be other transducer devices for generating transducer signal 141. An interface converter 164 can generate a digital sound related signal 101 in response to analog sound signal 141. Alternately, interface device 164 can be implemented in other forms for operating with other types of transducers such as digital transducers. Data processor 112 can be a monolithic computer in a preferred embodiment or can be any known computer or signal processor arrangement. Processor 112 can process the input signals such as with buffering, Fourier transformation, correlation, and various known sound processing techniques. Such techniques are discussed in U.S. Pat. No. 4,016,540 such as at column 16 line 6 to column 18 line 2 and elsewhere therein. Further, other sound recognition techniques are well known in the art such as set forth in the prior art patents referenced herein and in the textbooks by Meisel and Flanagan referenced herein. Further, audio technology and computer programming are well known in the art such as exemplified by the references cited herein. Therefore, sound recognition techniques can be implemented with processor 112 by those skilled in the art from the teachings herein when used in combination with well-known prior art technology. Control of equipment such as a sound response transducer, a machine, and other equipment with the preferred embodiment of the present invention is discussed in detail in the referenced patent applications such as application Ser. No. 291,394. Therefore, one skilled in the art will now be able to practice the present sound responsive invention from the disclosures herein and the disclosures in the referenced patent applications when considered in conjunction with well-known prior art technology.

In another processor embodiment, a sample signal correlator can be used to process input signal 141 from transducer 140 for correlation with a known voice pattern or sound pattern to generate an output signal when the correlation signal exceeds a threshold. A threshold detector for an adaptive compositor arrangement has been disclosed in combination with an improved correlator arrangement in application Ser. No. 550,231 particularly with reference to FIG. 6D therein; wherein this correlator arrangement and threshold detector can be used to detect a particular sound signal and generate an output threshold signal related to such recognition.

In a preferred embodiment, a sound responsive system can be implemented in a batch-fabricated form as discussed with reference to FIG. 8A. This batch-fabricated arrangement can include transducer 817 which can be a sound signal to electrical signal transducer and can include interface, processing, and other elements disclosed herein being mountable on circuit board 811 in accordance with the batch-fabricated implementation.

The broad applicability of the sound responsive feature of the present invention will now be exemplified with a plurality of different uses thereof.

A voice actuation and answerback arrangement will now be discussed with reference to FIG. 1A. In one embodiment of a voice response system, an operator generates a voice command for providing a desired response. In a preferred embodiment and as a check on the system, a voice response system generates a speech message for operator verification of the command to be executed. The voice responsive action can be interlocked with the verification speech message to minimize improper responses. After evaluating the speech answerback message, the operator provides a command such as "proceed", which initiates the previously commanded action. Other sequences may be provided for closed loop audio control with the operator in the loop. In one operator feedback embodiment, an operator's command is sensed with transducer 140 for generating signal 141 which is preprocessed with converter 164 to be input to processor 112 as signal 101. Processor 112 identifies the command and generates a speech message as signal 101 to speech interface 100 for feedback to the operator. If the operator responds within a period of time with an acknowledgement word such as "proceed", then the operation will be performed. The acknowledgement word may also be detected with transducer 140, preprocessed with converter 164, and processed with data processor 112; where proper acknowledgement results in processor 112 providing the desired control function such as by outputting the appropriate signals 126 to machine 124. This inventive feature may be characterized by the generation of an output audio message in response to identification of an input audio message and may be further characterized by an input audio message that is responsive to an output audio message for providing desired control.

Alternately, the voice responsive system may provide the voice responsive operation after a time delay following the answerback message unless the operator generates a correction command such as a "cancel" command to cancel the previous command related either to an incorrect feedback message or to a change in the desired command.

The answerback feature may be used in accordance with the voice compression arrangement discussed relative to FIG. 7, wherein an input message provided with input devices 701 or 703 can be provided as an audio speech answerback message for operator verification prior to transmission.

A sound actuated lock system will now be discussed with reference to FIG. 1A herein and with reference to FIGS. 1 and 5 of referenced U.S. Pat. No. 3,897,753 and U.S. Pat. No. 4,036,178. A voice actuated lock system can use voice actuation alone or can use voice actuation in combination with other devices. For example, voice actuation can be used in combination with a mechanical key, a switch input, a code, and/or other auxiliary identification arrangement. The auxiliary arrangement can be actuated before voice actuation or after voice actuation. An alarm can be sounded if the sequence of auxiliary actuation and voice actuation is improper, or if voice actuation is achieved without auxiliary actuation, or if auxiliary actuation is achieved without voice actuation, or other such improper actuation sequences or forms. For example, it may be desirable to have voice actuation prior to inserting a key into a lock, wherein insertion of a key into a lock without being preceded by voice actuation may be indicative of an improper access attempt and can be used to sound an alarm. Auxiliary actuation can be provided through panel 118 such as by entering a code with the keyboard 224 (FIG. 2) or inserting a key into a locking mechanism.

Voice actuation can be achieved with transducer 140 generating electrical signal 141 in response to acoustical energy. Converter 164 can generate digital input 101 in response to electrical signal 141. Processor 112 can process input signal 101 to identify predetermined words, or predetermined operators, or predetermined words spoken by a predetermined operator for lock actuation. Lock actuation can be provided by controlling a lock mechanism such as a relay with output signals from processor 112 such as output signal 126. Control of relays and other machine elements have been discussed for machine 124 in the referenced applications such as application Ser. No. 291,394; thereby providing a means and method for controlling such machine devices.

The arrangement shown in FIG. 1 of said U.S. Pat. No. 3,897,753 and U.S. Pat. No. 4,036,178 further exemplify the voice responsive lock arrangement of the present invention. Key 110 can be a voice key generating acoustical signal 112 to sensor 114 which can be a microphone sensor for generating electrical signal 116 related to acoustical signal 112 (FIG. 1 therein) similar to sensor 140 generating signal 141 (FIG. 1A herein). Signal processor 118 can be an analog signal processor, a digital signal processor, or a combination analog and digital signal processor such as an A/D converter and a digital data processor for processing input acoustical signal 116 (FIG. 1 therein) similar to converter 164 and processor 112 (FIG. 1A herein). Processed output signal 120 can be a signal indicative of the proper speech signal being detected or being non-detected for controlling output device 122 (FIG. 1 therein) similar to output signals 123, 126, 101, 115A, etc (FIG. 1A herein). Output device 122 (FIG. 1 therein) can be a solenoid such as solenoid 122 (FIGS. 4A and 4B therein) or alternately can be other output devices such as shockers, alarms, and other such arrangements disclosed therein similar to machine 124, sound response circuit 100, and display panel 118 (FIG. 1A herein).

An alarm system such as a burglar alarm system and fire alarm system will now be discussed with reference to FIG. 1A. Transducer 140 senses burglar-related sound signals such as opening of a window, footsteps on a carpet and/or fire-related sound signals. Transducer 140 generates signal 141 related to detected sounds for conversion with converter 164 to generate digital sound signal 101 for processing with data processor 112. Data processor 112 identifies the desired sounds to selectively control a relay or other such device for actuating an alarm, to control an automatic telephone dialing system to call the police or fire department, or to control other alarm-related actions.

A voice actuated toy will now be discussed in the embodiment of a voice actuated doll with reference to FIG. 1A. A doll system may be implemented having a voice actuated response, wherein a child's voice can be used to initiate the desired response. In one embodiment, the desired response can be an audio response such as discussed for arrangement 100 (FIG. 1A). In another embodiment, the desired response can be a mechanical response such as discussed for the alarm arrangements above. Other responses will now become obvious from the teachings herein. In the audio response embodiment, detection of acoustical energy generates a speech response, or a crying response, or a laughing response in accordance with the sound generating feature of the present invention. Different responses can be generated in response to different voice messages. In a simple embodiment, the mere detection of acoustical energy of a threshold magnitude can be used to trigger a response such as a crying response in a doll. Alternately, recognition of particular sounds can be used to selectively generate different sound messages.

A voice actuated appliance or mechanism will now be discussed with reference to FIG. 1A in the embodiment of a voice actuated TV channel selector mechanism. This voice actuated TV channel selector mechanism exemplifies the broader features of the present invention for providing voice actuated mechanisms in accordance with the broad scope of the present invention. In one embodiment, a voice responsive TV tuner detects the word "channel" to indicate a channel change command and detects a channel number to identify the desired channel. For example, the message "channel five" is recognized as being a channel change command based upon recognition of the word "channel" and selection of channel five based upon the word "five" being recognized as following the word "channel". If the word "five" were detected without being preceded by the word "channel", the voice responsive tuner would not respond because of the improper nature of the command. Sensor 140 generates signal 141 in response to acoustical energy for processing with converter 164 and data processor 112. Identification of a proper command causes generation of output signals to control the channel selector mechanism as is well known in conventional non-voice responsive remote controlled tuning mechanisms.

Other mechanisms may be controlled with voice actuation. For example a radio can be controlled with a "radio on" and "radio off" voice actuated command; an air conditioner can be controlled with an "air conditioner on" and "air conditioner off" voice actuated command; a heater thermostat can be controlled by an "increase heat" and a "stop increase", a "decrease heat", and a "stop decrease" set of commands; and other devices can be similarly controlled by voice actuated commands.

Further, various other devices can be sound actuated either to free an operator to perform other tasks such as requiring use of the hands, or for operators who may be disabled such as paraplegics who do not have use of their hands, or for other such purposes. Such systems may include voice controlled typewriters, voice controlled calculators, and other machines. For example, voice-related information can be input from transducer 140 and converter 164 for processing with data processor 112 to characterize the speech message. Data processor 112 can control peripheral devices in accordance with programmed instructions such as a voice actuated typewriter embodiment where data processor 112 controls typewriter 156 to type desired information in response to voice information 101. Multitudes of other applications of this voice responsive arrangement will now become obvious from the teachings herein.

AUDIONIC DATA VERIFICATION

There are many potential applications where data has been recorded, but must be interpreted, checked, or otherwise monitored by an operator. One prior art method is to provide hard-copy information such as printed information to an operator for visual monitoring. Such visual comparison of two sets of printed information is tedious and error-prone. In an audionic verification arrangement, recorded information is presented to the audionic system of the present invention for evaluation by an operator in audio message form, where the operator concentrates visual attention on a written copy while a recorded copy is presented in audio form. Alternately, instructions or other information can be presented to the operator in audio form in response to recorded input information.

For simplicity of discussion, a recorded-to-audio data converter will now be discussed relative to FIG. 1A. A numerical control tape to be checked can be loaded through tape reader 116 under control of data processor 112, where data processor 112 reads each tape character, performs a table look-up program operation to obtain the audionic information stored in main memory 130, and outputs the audionic information to output subsystem 100 for providing an audio message in response to the information from tape reader 116. Because of the standardization of EIA format tapes, only a limited number of character combinations is permissable. Therefore, this application provides a relatively simple audio response requirement.

Similar to the numerical control example provided above, other forms of recorded data such as bank statements and general data base information can be retrieved and presented to an operator in audio form. Alternately, printed information may be scanned by well-known optical character recognition (OCR) systems for generating digital codes related to printed information. Such well-known OCR equipment can be substituted for tape reader 116 in the above example.

CLOSED LOOP SOUND SYSTEM

A closed loop sound system in accordance with the system of the present invention will now be discussed with reference to FIG. 1A. Sound-related signals are generated with system 100 such as with digital, analog, or hybrid generation equipment. The sound-related signals can be generated to sound interface 102 and transducer 104 from data processor 112 as signal 101 or alternately to interface circuits 120–122 to a machine 124 such as a speaker in response to sound-related signals 123 and 126 from data processor 112. The sound generated by transducer 104 and 124 can be sensed with microphone 140 to generate sound input signal 141 for processing with converter 164 for input to processor 112 as signal 101. Processor 112 compares commanded signal 101, 123, and/or 126 with feedback signal 101 to adjust the sound generation commands. A commanded signal can be input from panel 118, tape reader 116, I/O channels 128, memories 130 and 131, and other sources of sound commands. This closed loop sound system is exemplified by a closed loop illumination control system set forth in U.S. Pat. No. 3,738,242; U.S. Pat. No. 3,986,022; and continuations therefrom and in applications referenced therein; wherein the closed loop illumination system of those related applications is exemplary of the closed loop sound system of the present invention.

Circuitry for processing signal 141 from microphone 140 and circuitry for generating signal 101 to speaker 104 and signals 123 and 126 to speaker 128 can be implemented with digital, analog, or hybrid circuitry. In a digital circuit embodiment, a stored program data processor exemplified by the microcomputer 112 of the present invention is used to process input sound signals and generate output sound signals under program control. Alternately, a special-purpose (non-computerized) digital arrangement can be used in place of microcomputer 112. Alternately, well-known analog signal processing circuitry such as used in sound recording studios can be used. Alternately, combinations of digital and analog circuitry can he used such as by processing and generating information in the digital domain under stored program computer control; processing input and output signals with converters such as A/D converter 164 and D/A converter 102; and providing analog signal processing before input converter 164 and after output converter 102.

In one use of the closed loop sound system of the present invention, a sound transducer calibration arrangement will now be described with reference to FIG. 1A. Data processor 112 generates sound signals 101 to sound transducer 104 through interface circuit 102 to generate sound signal 105. Sound signal 105 can be sensed with input transducer 140 to generate input signal 141 for processing with converter 164 to generate sound input signal 101 to data processor 112. Data processor 112 compares input signal 101 from converter 164 with the previously commanded output signal 101 to converter 102 to determine the comparison therebetween. Such a comparison is indicative of the performance of the closed loop sound system such as the performance of output transducer 104 and input transducer 140.

In one embodiment of the closed loop sound system, data processor 112 generates output signal 101 to output transducer 104 having a particular precise frequency or having a combination of frequencies with known characteristics and wherein data processor 112 implements a Fourier transform to analyze input signal 101 from transducer 140 to derive the frequency components thereof. Comparison of the frequency characteristics of a signal output to output transducer 104 and received from input transducer 140 is indicative of the performance of the system. Because output transducer 104 and the input transducer 140 typically contribute the largest error to the sound signals, the comparison is indicative of the error contributions of output transducer 104 and input transducer 140 and also other system components.

In this embodiment, data processor 112 generates a particular discrete frequency at a time for calibrating the system with respect to this particular frequency and successively generates a plurality of precise frequencies for obtaining a plurality of different calibration points which can be stored, displayed, plotted, or otherwise utilized as indicative of system performance. Alternately, data processor 112 can generate a complex signal having a plurality of frequencies and related amplitudes superimposed therebetween such as with a superposition program or with a recorded or stored calibration signal and can analyze the related received signals such as with a Fourier transform processor or program to separate out and analyze each frequency component for system calibration.

In yet another embodiment, data processor 112 may not be in the loop but may provide a supervisory function, wherein data processor 112 can monitor sound signals being generated by output sound transducer 104 and can monitor signals received from input sound transducer 140 such as with an A/D converter or a well-known sound analyzer device and provide a comparison therebetween. For example, data processor 112 can process both output signals and input signals with a Fourier transform program to derive the frequency components therebetween, data processor 112 can take a ratio of the related frequency components as indicative of the gain or transfer function of the system, and data processor 112 can compare the ratios therebetween to determine the frequency response or transfer function of the system. Comparison of the output signal with the input signal can be used to identify distortion, noise, and other signal characteristics in addition to frequency response and transfer function characteristics.

The closed loop sound system of the present invention can be utilized in combination with a frequency compensation arrangement for controlling amplitude of the various frequencies such as with well-known controllable notch filters. After deriving system calibration information such as frequency response information, data processor 112 can provide this information to an operator such as through display panel 118 and the operator can manually adjust a filter compensation device as is well known in the sound recording art to provide proper sound response characteristics. Alternately, data processor 112 can automatically control compensation circuitry such as by setting filter gains with electronic controls such as a multiplying DAC through a gain-setting register, with electromechanical controls such as motors and relays, or with other automatic amplitude control arrangements. Alternately, a pulse modulation control arrangement can be utilized in accordance with the arrangement discussed with reference to FIG. 6B in referenced application Ser. No. 302,771.

A recording studio or auditorium sound system embodiment of the closed loop sound system will now be described as exemplary of the many uses of this feature of the present invention. A singer or an instrumentalist can generate music signals to microphone 140 for input to data processor 112 through converter 164. Processor 112 or alternately conventional sound circuitry can be used to generate output audio signal 105 from audio transducer 104 such as amplified audio signals through an auditorium sound system. Output signal 105 can be monitored with a transducer such as input transducer 140 which can be the same transducer used for the original sound input or which can be a similar transducer or instrumentation transducer properly arranged such as located near speaker 104 for proper reception of generated sound signal 105. Data processor 112 can monitor the signal received from this calibration input transducer, can compare the input calibration sound signal with the generated sound signal 105 such as with the Fourier transform processing discussed above, and can calibrate the system such as with multiplying DACs controlling analog filters to linearize the frequency response or to filter out distortion and noise.

In well-known auditorium-type embodiments, a plurality of output sound transducers 104 are provided for generating sound at different locations in the auditorium and are excited by different audio amplifiers. Therefore, mounting of a separate transducer 140 in conjunction with each of a plurality of speakers 104 or at each important calibration location in the auditorium provides a plurality of feedback signals 141 for calibration. In accordance with this feature of the present invention, a plurality of calibration channels or systems having a plurality of calibrating filter circuits can be provided, either time sharing feedback control circuitry such as data processor 112 or alternately having control circuitry dedicated to each channel.

In a preferred embodiment, the monitoring, control, and calibration system can use the same input transducer and the same output transducer used in the sound system such as on an off-line calibration basis before a performance, on an on-line calibration basis during a performance, or in other forms or alternately may use the same type of input transducer and output transducer for calibration as used for the performance but with the monitoring transducers being redundant with the performance transducers. With this feature that utilizes the same or similar transducers, calibration of the performance transducers is more effective because transducer inaccuracies are common for performance and for calibration and therefore will automatically be calibrated out.

In yet another embodiment, low-level calibration signals such as signature signals can be superimposed on the performance sound signals for on-line calibration during a performance. For example, a frequency chirp signal or a coded signature signal at a particular frequency can be generated and can be mixed or otherwise superimposed on the performance sound signals, wherein a correlator in data processor 112 may be used to separate the signature signals from the performance signals received from input transducer 140 for system calibration. The calibration signature signals can be low-level signals and therefore may not be detectable by an audience. Processing of low-level signature signals with a correlator or other filter arrangement enhances processed signal amplitude, inherent in the filter processing. Further, a filter arrangement provided with integration or compositing after filtering further enhances low-level signals. Signal processing such as signature, Fourier, correlation, compositing, etc is discussed in detail in the referenced patent applications.

In one embodiment, the signature signal may merely be a single constant frequency tone or a plurality of constant frequency tones superimposed therebetween and generated as a low-level calibration signal superimposed on a higher level performance-related signal. Correlation or other types of processing of the received signal and integration after processing if necessary would generate a calibration signal which is dominated by the continuous low-level calibration signal because the low-level calibration signal is enhanced by filtering and/or integration to significantly exceed the level of the more randomly generated performance-related signals. Therefore, the low level of the calibration signals superimposed on the performance signal is not detectable by an audience because of the low level, but the continuous nature, repeatability, and/or signature of the calibration signal permits separation of the calibration signal from the performance signal or alternately permits integration of the calibration signal to provide relatively larger calibration signals than performance signals after processing. Superimposing of generated signals can be performed with signal mixers and other circuits well known in the sound recording and performance art.

Many other embodiments of the closed loop sound system of the present invention will now become obvious to those skilled in the art from the teachings herein.

SCOPE AND DEFINITIONS

The invention disclosed herein is presented in a preferred embodiment of a digital audionic system to exemplify the inventive features, but the scope of this invention is much broader than illustrated with the preferred embodiment. This scope is intended to be broadly interpreted to cover the general fields of interaction between an operator and a machine or other device.

In order to describe the features of this invention, simplified block diagrams and schematic diagrams are used having symbolic representations. As an example, digital logic is shown using symbols associated with digital integrated circuits such as the Texas Instruments series 7400 integrated circuits. As another example, analog switches are shown symbolically in FIG. 3 which may be implemented with FET switches or other analog switches. The detailed circuit arrangements to implement the symbolic representations will become obvious to those skilled in the art.

Various publications may be used for providing background for this invention and for illustrating the prior art. The various subject areas and associated references for each subject area are listed below.

(1) Pattern recognition is described in the book *Computer-Oriented Approaches to Pattern Recognition* by William S. Meisel for Academic Press (1972).

(2) Integrated circuit technology is described in the book *Integrated Circuits* by Raymond M. Warner, Jr. and James N. Fordemwalt (Editors) for McGraw-Hill Book Company (1965).

(3) Digital computer technology is described in the books (a) *Digital Computer Design* by Edward L. Braun for Academic Press (1963) and (b) *Digital Computer Design Fundamentals* by Yaohan Chu for McGraw Hill (1962).

(4) Digital computer programming is described in the books (a) *Programming: An Introduction to Computer Languages and Techniques* by Ward Douglas Maurer for Holden Day Inc. (1968), (b) *Programming for Digital Computers* by Joachim Jeenel for McGraw Hill (1959), (c) *Elements of Computer Programming* by Swallow and Price for Holt, Rinehart, and Winston (1965), (d) *Programming and Coding Digital Computers* by Philip M. Sherman for John Wiley & Sons Inc. (1963), (e) *Digital Computer Programming* by Peter A. Start for MacMillian Co. (1967), (f) *IBM 360 Programming and Computing* by Golden and Leichus for Prentis-Hall Inc. (1967), (g) *Fundamentals of Flowcharting* by Thomas J. Schriber for John Wiley & Sons, Inc. (1969), and (h) *Design of Real-Time Computer Systems* by James Martin.

(5) Audio technology is described in the books (a) *Speech Analysis, Synthesis, and Perception* (Second Edition) by J. L. Flanagan for Springer-Verlag (1972); particularly in Chapter VI (P. 204–275) on Speech Synthesis and Chapter VIII (P. 321–405) on Systems for Analysis-Synthesis Telephony and (b) *Manual of Phonetics* by Bertil Malmberg (Editor) for North-Holland Publishing Co. in Amsterdam (1968); particularly in Chapter 8 (P. 173–277) on Analysis and Synthesis of Speech Processes.

These publications and the publications referenced therein provide non-essential subject matter and are incorporated herein by reference.

Terminology used in this description will now be defined to more clearly illustrate the intended meaning.

The term "word" is intended to mean a generalized parameter comprising a plurality of digital bits or other conditions and may relate to letters, numbers, combinations of letters and numbers, or other such groups of conditions.

The computer system of the referenced application Ser. No. 101,881 exemplifies a system that can be used to implement this invention. The data processor and input/output structure of that parent application are used to illustrate one form of this invention.

The terms computer and data processor are each intended to mean an arrangement for processing signals. In a preferred embodiment, the computer or data processor is a stored program digital computer or stored program digital data processor as exemplified in the parent applications.

The term computer as used in the description of a preferred embodiment herein is intended to mean a stored program digital data processor. This includes the well known prior art general purpose digital computers such as minicomputers, but also includes the monolithic data processor and factored data processor disclosed in the referenced application Ser. No. 101,881, and the extension of these data processor concepts to higher levels of integration; where the computer may be distributed throughout the system and may be physically and operationally associated with an extremity of the system, or the computer may be merged to such a degree that the component computer parts are individually indistinguishable.

A dedicated computer system may be dedicated to one or more tasks which may include a prime task such as numerical control, payroll processing, or calculator processing and one or more sub-tasks such as controlling extremities. Also, the data processor need not maintain it's physical or operational identity. Also, this invention is not limited to a single computer but may include a plurality of computers associated with various portions of the prime task and sub-tasks.

A data processing system can be structured with (1) extremities that may have a physical size and form and (2) monolithic data processors that may have relative inconsequential size and form; where the data processors can be totally distributed to the extremity for performance of the functions of the extremity under program control and may be dedicated to one or more extremities. In this case, a plurality of data processors may be distributed throughout the system, each dedicated to a data processor prime task, which may be a system prime task or sub-task.

The term hybrid is herein intended to pertain to both, analog and digital, signal processing. In particular, the analog-to-digital and digital-to-analog converters described herein are hybrid arrangements.

The machine tool control arrangement discussed in the referenced patent applications and the sound system control arrangement discussed herein may be used for generalized control of equipment such as household appliances. Such equipment can be controlled with relays and motors which can be commanded from data processor 112 through discrete signals 126 and servo signals 123. Further, the pulse modulated control, SCR control, and other such arrangements disclosed in the related patent applications for servos 120–122 or as known in the art can be used for control of such equipment.

The audionic device described herein is described in relation to an audio speech reply system which exemplifies the general principles of this invention. It will become obvious to those skilled in the art that the audionic device is not limited to speech replies, but is generally applicable to any audio signals. For example, the sense of hearing can be stimulated by transducers mounted on a sensitive portion of an operator such as a bone in proximity with an ear as with hearing aid type devices. This type of signal transmission and other forms of signal transmission are intended to be included within the broad scope of this invention. Also, the principles disclosed herein are widely applicable to the general construction of signals by electronic means and not limited to audio signals. This invention is therefore intended to be interpreted in broad form to cover general signal construction such as light, sound, electronic signals, and others that will become obvious to those skilled in the art.

An audionic device is herein intended to mean a device for digitally generating audio messages and replies. The operator may be located in close proximity with the audionic device or may be located remotely such as with receiving the audio reply over a telephone link.

A monolithic audionic system is intended to mean an audionic system comprising an integrated circuit or monolithic computer including an integrated circuit audionic memory for storage of audionic information.

The use of audionic message sub-systems may improve the performance of systems with which the audionic sub-system is associated. Various systems described herein use the digital audionic device of this invention. It will become obvious that these systems may also provide some advantages with the use of mechanical and analog filter arrangements. Therefore, the claimed inventive features relating to application of audionic systems are intended to be generally interpreted in broad terms to cover the use of all forms of audio devices that can provide the audio capability described herein. The digital audionic arrangement of this invention provides a preferred embodiment of such an audio message arrangement.

As used in this application, a stored program computer is said to be operating on a real time basis when time of occurance of the computer operations in a data processing subsystem is dictated by the requirements of a peripheral subsystem or external devices rather than by computer operations.

It is thus clearly seen that the present invention provides a novel means and method of providing a data processor system for operator interaction through audionic messages.

From the above description it will be apparent that there is thus provided a device of the character described possessing the particular features of advantage before enumerated as desireable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

I claim the following:

1. A sound system comprising:

a keyboard for generating a keyboard digital input signal;

an integrated circuit keyboard stored program digital computer for generating a serial digital keyboard output signal in response to the keyboard digital input signal generated by said keyboard, said integrated circuit keyboard stored program digital computer including 1) an integrated circuit keyboard digital read only memory for storing a keyboard program, 2) an integrated circuit keyboard digital input circuit for generating a keyboard computer input signal under control of the keyboard program stored in said integrated circuit keyboard digital read only memory in response to the keyboard digital input signal generated by said keyboard, 3) integrated circuit keyboard digital processing logic for processing the keyboard computer input signal generated by said integrated circuit keyboard digital input circuit under control of the keyboard program stored in said integrated circuit keyboard digital read only memory, and 4) an integrated circuit keyboard serial digital output circuit for generating the serial digital keyboard output signal under control of the keyboard program stored in said integrated circuit keyboard digital read only memory in response to the processing of the keyboard computer input signal by said integrated circuit keyboard digital processing logic;

an integrated circuit sound stored program digital computer for generating a digital sound output signal in response to the serial digital keyboard output signal generated by said integrated circuit keyboard serial digital output circuit, said integrated circuit sound stored program digital computer including 1) an integrated circuit sound digital memory for storing a sound program, 2) an integrated circuit sound computer digital input circuit for generating a sound computer input signal under control of the sound program stored in said integrated circuit sound digital memory in response to the serial digital keyboard output signal generated by said integrated circuit keyboard serial digital output circuit, 3) integrated circuit sound digital processing logic for processing the sound computer input signal generated by said integrated circuit sound computer digital input circuit under control of the sound program stored in said integrated circuit sound digital memory, and 4) an integrated circuit sound digital output circuit for generating the digital sound output signal under control of the sound program stored in said integrated circuit sound digital memory in response to the processing of the sound computer input signal by said integrated circuit sound digital processing logic; and a sound transducer for generating a sound in response to the digital sound output signal generated by said integrated circuit sound digital output circuit.

2. The system as set forth in claim 1 above, wherein said integrated circuit sound stored program digital computer is arranged for generating the digital sound output signal as a digital error sound output signal in response to the serial digital keyboard signal generated by said integrated circuit keyboard serial digital output circuit, wherein the sound program stored in said integrated circuit sound digital memory includes an error sound program, wherein said integrated circuit sound digital processing logic is arranged for processing the sound computer input signal generated by said integrated circuit sound computer digital input circuit under control of the error sound program stored in said integrated circuit sound digital memory, wherein said integrated circuit sound digital output circuit is arranged for generating the digital error sound output signal under control of the error sound program stored in said integrated circuit sound digital memory in response to the processing of the sound computer input signal by said integrated circuit sound digital processing logic, and wherein said sound transducer is arranged for generating an error sound in response to the digital error sound output signal generated by said integrated circuit sound digital output circuit.

3. The system as set forth in claim 1 above, wherein said integrated circuit sound stored program digital computer further includes an integrated circuit digital printer output circuit for generating a digital printer output signal under control of the sound program stored in said integrated circuit sound digital memory in response to the processing of the sound computer input signal by said integrated circuit sound digital processing logic and where said system further comprises a printer for printing information in response to the digital printer output signal generated by said integrated circuit digital printer output circuit.

4. A sound system as set forth in claim 1, wherein the keyboard includes a plurality of keys each key generating a key signal in response to depression by an operator and a printed circuit board mounting and interconnecting the plurality of keys, and wherein the computer system further comprises a printed circuit motherboard mounting and interconnecting the integrated circuit sound stored program digital computer.

5. A sound system as set forth in claim 1, wherein the keyboard includes a plurality of keys each key generating a key signal in response to operator actuation and an encoder circuit coupled to the plurality of keys and generating the keyboard digital input signal as an encoded keyboard digital input signal in response to the key signals.

6. A sound system as set forth in claim 1, wherein the integrated circuit sound stored program digital computer includes an integrated circuit display output circuit coupled to the integrated circuit sound digital processing circuit and to the integrated circuit sound digital memory and generating a display output signal in response to the processing of the sound computer input signal and in response to the sound program, and wherein the sound system further comprises an operator display coupled to the integrated circuit display output circuit and generating an operator display in response to the display output signal.

7. A sound system as set forth in claim 1, wherein the sound system further comprises an integrated circuit dynamic display memory storing display data and an integrated circuit serial output circuit coupled to the integrated circuit dynamic display memory and generating a serial display output signal in response to the stored display data, wherein the integrated circuit sound digital memory includes a display program having display instructions, wherein the integrated circuit sound stored program digital computer includes a writing circuit coupled to the integrated circuit dynamic display memory and to the integrated circuit sound digital memory and writing display data into the integrated circuit dynamic display memory in response to the display instructions, and wherein the computer system further comprises an operator display coupled to the integrated circuit serial output circuit and generating an operator display in response to the serial display output signal.

8. A system for communicating with an operator, said system comprising:
- a keyboard for generating a keyboard digital input signal;
- an integrated circuit keyboard stored program digital computer for generating a serial digital keyboard output signal in response to the keyboard digital input signal generated by said keyboard, said integrated circuit keyboard stored program digital computer including
  1) an integrated circuit keyboard digital read only memory for storing a keyboard program,
  2) an integrated circuit keyboard digital input circuit for generating a keyboard computer input signal under control of the keyboard program stored in said integrated circuit keyboard digital read only memory in response to the keyboard digital input signal generated by said keyboard;
  3) integrated circuit keyboard digital processing logic for processing the keyboard computer input signal generated by said integrated circuit keyboard digital input circuit under control of the keyboard program stored in said integrated circuit keyboard digital read only memory, and
  4) an integrated circuit keyboard serial digital output circuit for generating the serial digital keyboard output signal under control of the keyboard program stored in said integrated circuit keyboard digital read only memory in response to the processing of the keyboard computer input signal generated by said integrated circuit keyboard digital processing logic;
- an integrated circuit sound stored program digital computer for generating a digital sound output signal and a digital display output signal in response to the serial digital keyboard output signal generated by said integrated circuit keyboard serial digital output circuit, said integrated circuit sound stored program digital computer including
  1) an integrated circuit sound digital memory for storing a sound program,
  2) an integrated circuit sound computer digital input circuit for generating a sound computer input signal under control of the sound program stored in said integrated circuit sound digital memory in response to the serial digital keyboard output signal generated by said integrated circuit keyboard serial digital output circuit,
  3) integrated circuit sound digital processing logic for processing the sound computer input signal generated by said integrated circuit sound computer digital input circuit under control of the sound program stored in said integrated circuit sound digital memory,
  4) an integrated circuit digital sound output circuit for generating the digital sound output signal under control of the sound program stored in said integrated circuit sound digital memory in response to the processing of the sound computer input signal by said integrated circuit sound digital processing logic, and
  5) an integrated circuit display digital output circuit for generating the digital display output signal under control of the sound program stored in said integrated circuit sound digital memory in response to the processing of the sound computer input signal by said integrated circuit sound digital processing logic;
- a sound transducer for generating a sound in response to the digital sound output signal generated by said integrated circuit digital sound output circuit; and
- a CRT display for displaying information in response to the digital display output signal generated by said integrated circuit display digital output circuit.

9. A system for communicating with an operator as set forth in claim 8, wherein the keyboard includes a plurality of keys each key generating a key signal in response to depression by an operator and a printed circuit board mounting and interconnecting the plurality of keys and wherein the computer system further comprises a printed circuit motherboard mounting and interconnecting the integrated circuit sound stored program digital computer.

10. A computer system as set forth in claim 8, wherein the keyboard includes a plurality of keys each key generating a key signal in response to operator actuation and an encoder circuit coupled to the plurality of keys and generating the keyboard digital input signal as an encoded keyboard digital input signal in response to the key signals.

11. The system as set forth in claim 8 above, wherein said integrated circuit sound stored program digital computer further includes an integrated circuit digital printer output circuit for generating a digital printer output signal under control of the sound program stored in said integrated circuit sound digital memory in response to the processing of the sound computer input signal by said integrated circuit sound computer digital processing logic, and wherein said system further comprises a printer for printing information in response to the digital printer output signal generated by said integrated circuit digital printer output circuit.

12. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal in response to the serial digital keyboard output signal, wherein the integrated circuit sound stored program digital computer includes
1) an integrated circuit sound memory storing a sound program having sound instructions,
2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
3) an integrated circuit sound processing circuit coupled to the integrated circuit sound computer input circuit and to the integrated circuit sound memory and generating a processed sound signal in response to the sound computer input signal and in response to the sound instructions, and
4) an integrated circuit sound output circuit coupled to the integrated circuit sound processing circuit and to the integrated circuit sound memory and generating the sound output signal in response to the processed sound signal and in response to the sound instructions; and a sound transducer coupled to the integrated circuit sound output circuit and generating a sound in response to the sound output signal.

13. A computer system as set forth in claim 12, wherein the integrated circuit sound stored program digital computer generates the sound output signal as an error sound output signal in response to the serial digital keyboard output signal, wherein the sound instructions stored by the integrated circuit sound memory include error sound instructions, wherein the integrated circuit sound processing circuit processes the sound computer input signal in response to the error sound instructions, wherein the integrated circuit sound output circuit generates the sound output signal as an error sound output signal in response to the error sound instructions in response to the processed sound signal, and wherein the sound transducer generates the sound as an error sound in response to the error sound output signal.

14. A computer system as set forth in claim 12, wherein the keyboard includes a plurality of keys each key generating a key signal in response to depression by an operator and a printed circuit board mounting and interconnecting the plurality of keys and wherein the computer system further comprises a printed circuit motherboard mounting and interconnecting the integrated circuit sound stored program digital computer.

15. A computer system as set forth in claim 12, wherein the keyboard includes a plurality of keys each key generating a key signal in response to operator actuation and an encoder circuit coupled to the plurality of keys and generating the keyboard input signal as an encoded keyboard input signal in response to the key signals.

16. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal in response to the serial digital keyboard output signal, wherein the integrated circuit sound stored program digital computer includes
1) an integrated circuit sound memory storing a sound program having sound instructions,
2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
3) an integrated circuit sound processing circuit coupled to the integrated circuit sound computer input circuit and to the integrated circuit sound memory and generating a processed sound signal in response to the sound computer input signal and in response to the sound instructions,
4) an integrated circuit sound output circuit coupled to the integrated circuit sound processing circuit and to the integrated circuit sound memory and generating the sound output signal in response to the processed sound signal and in response to the sound instructions, and
5) an integrated circuit printer output circuit coupled to the integrated circuit sound processing circuit and to the integrated circuit sound memory and generating a printer output signal in response to the processed sound signal and in response to the sound instructions;

a sound transducer coupled to the integrated circuit sound output circuit and generating a sound in response to the sound output signal; and a printer coupled to the integrated circuit printer output circuit and printing information in response to the printer output signal.

17. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal in response to the serial digital keyboard output signal, wherein the integrated circuit sound stored program digital computer includes
1) an integrated circuit sound memory storing a sound program having sound instructions and storing a display program having display instructions,
2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
3) an integrated circuit sound processing circuit coupled to the integrated circuit sound computer input circuit and to the integrated circuit sound memory, generating a processed sound signal in response to the sound computer input signal and in response to the sound instructions and generating a processed display signal in response to the sound computer input signal and in response to the display instructions,
4) an integrated circuit sound output circuit coupled to the integrated circuit sound processing circuit and to the integrated circuit sound memory and generating the sound output signal in response to the processed sound signal and in response to the sound instructions, and
5) an integrated circuit display output circuit coupled to the integrated circuit sound processing circuit and to the integrated circuit sound memory and generating a display output signal in response to the processed display signal and in response to the display instructions;

a sound transducer coupled to the integrated circuit sound output circuit and generating a sound in response to the sound output signal; and an operator display coupled to the integrated circuit display output circuit and generating an operator display in response to the display output signal.

18. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit dynamic display memory storing display data;

an integrated circuit serial output circuit coupled to the integrated circuit dynamic display memory and generating a serial display output signal in response to the stored display data, an integrated circuit sound stored program digital computer coupled to the integrated circuit keyboard serial digital output circuit and generating a sound output signal in response to the serial digital keyboard output signal, wherein the integrated circuit sound stored program digital computer includes
  1) an integrated circuit sound memory storing a sound program having sound instructions and storing a display program having display instructions,
  2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
  3) an integrated circuit sound processing circuit coupled to the integrated circuit sound computer input circuit and to the integrated circuit sound memory and generating a processed sound signal in response to the sound computer input signal and in response to the sound instructions, and
  4) an integrated circuit sound output circuit coupled to the integrated circuit sound processing circuit and to the integrated circuit sound memory and generating the sound output signal in response to the processed sound signal and in response to the sound instructions, and
  5) a writing circuit coupled to the integrated circuit dynamic display memory and to the integrated circuit sound memory and writing display data into the integrated circuit dynamic display memory in response to the display instructions, and a sound transducer coupled to the integrated circuit sound output circuit and generating a sound in response to the sound output signal; and an operator display coupled to the integrated circuit serial output circuit and generating an operator display in response to the serial display output signal.

19. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
  1) an integrated circuit keyboard read only memory storing a keyboard program having keyboard instructions,
  2) an integrated circuit keyboard input circuit coupled to the keyboard and to the integrated circuit keyboard read only memory and generating a keyboard computer input signal in response to the keyboard input signal and in response to the keyboard instructions,
  3) an integrated circuit keyboard processing circuit coupled to the integrated circuit keyboard input circuit and to the integrated circuit keyboard read only memory and generating a processed keyboard signal in response to the keyboard computer input signal and in response to the keyboard instructions, and
  4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal and a display output signal in response to the serial digital keyboard output signal, wherein the integrated circuit sound stored program digital computer includes
  1) an integrated circuit sound memory storing a sound program having sound instructions,
  2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
  3) an integrated circuit sound processing circuit coupled to the integrated circuit sound computer input circuit and to the integrated circuit sound memory and generating a processed sound signal in response to the sound computer input signal and in response to the sound instructions,
  4) an integrated circuit sound output circuit coupled to the integrated circuit sound processing circuit and to the integrated circuit sound memory and generating the sound output signal in response to the processed sound signal and in response to the sound instructions, and
  5) an integrated circuit display output circuit coupled to the integrated circuit sound processing circuit and to the integrated circuit sound memory and generating the display output signal in response to the processed sound signal in response to the sound program;

a sound transducer coupled to the integrated circuit sound output circuit and generating a sound in response to the sound output signal; and a CRT display coupled to the integrated circuit display output circuit and displaying data in response to the display output signal.

20. A computer system as set forth in claim 19, wherein the keyboard includes a plurality of keys each key generating a key signal in response to depression by an operator and a printed circuit board mounting and interconnecting the plurality of keys and wherein the computer system further comprises a printed circuit motherboard mounting and interconnecting the integrated circuit sound stored program digital computer.

21. A computer system as set forth in claim 19, wherein the keyboard includes a plurality of keys each key generating a key signal in response to operator actuation and an encoder circuit coupled to the plurality of keys and generating the keyboard input signal as an encoded keyboard input signal in response to the key signals.

22. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal in response to the keyboard computer input signal and in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal and a display output signal in response to the serial digital keyboard output signal, wherein the integrated circuit sound stored program digital computer includes
1) an integrated circuit sound memory storing a sound program having sound instructions,
2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
3) an integrated circuit sound processing circuit coupled to the integrated circuit sound computer input circuit and to the integrated circuit sound memory and generating a processed sound signal in response to the sound computer input signal and in response to the sound instructions,
4) an integrated circuit sound output circuit coupled to the integrated circuit sound processing circuit and to the integrated circuit sound memory and generating the sound output signal in response to the processed sound signal and in response to the sound instructions,
5) an integrated circuit display output circuit coupled to the integrated circuit sound processing circuit and to the integrated circuit sound memory and generating the display output signal in response to the processed sound signal in response to the sound program, and
6) an integrated circuit printer output circuit coupled to the integrated circuit sound processing circuit and to the integrated circuit sound memory and generating a printer output signal in response to the processed sound signal and in response to the sound instructions; and a sound transducer coupled to the integrated circuit sound output circuit and generating a sound in response to the sound output signal;
a CRT display coupled to the integrated circuit display output circuit and displaying data in response to the display output signal; and
a printer coupled to the integrated circuit printer output circuit and printing data in response to the printer output signal.

23. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal in response to the serial digital keyboard output signal, wherein the integrated circuit sound stored program digital computer includes
1) an integrated circuit dynamic sound memory storing a sound program having sound instructions,
2) a refresh circuit coupled to the integrated circuit dynamic sound memory and refreshing the integrated circuit dynamic sound memory,
3) an integrated circuit sound computer input circuit coupled to the integrated circuit keyboard serial digital output circuit and to the integrated circuit dynamic sound memory and generating a sound computer input signal in response to the serial digital keyboard output signal and in response to the sound instructions,
4) an integrated circuit sound processing circuit coupled to the integrated circuit sound computer input circuit and to the integrated circuit dynamic sound memory and generating a processed sound signal in response to the sound computer input signal and in response to the sound instructions, and
5) an integrated circuit sound output circuit coupled to the integrated circuit sound processing circuit and to the integrated circuit dynamic sound memory and generating the sound output signal in response to the processed sound signal and in response to the sound instructions; and a sound transducer coupled to the integrated circuit sound output circuit and generating a sound in response to the sound output signal.

24. A computer system as set forth in claim 23, wherein the integrated circuit sound stored program digital computer generates the sound output signal as an error sound output signal in response to the serial digital keyboard output signal, wherein the sound instructions stored by the integrated circuit dynamic sound memory include error sound instructions, wherein the integrated circuit sound processing circuit processes the sound computer input signal in response to the error sound instructions, wherein the integrated circuit sound output circuit generates the sound output signal as an error sound output signal in response to the error sound instructions in response to the processed sound signal, and wherein the sound transducer generates the sound as an error sound in response to the error sound output signal.

25. A computer system as set forth in claim 23, wherein the keyboard includes a plurality of keys each key generating a key signal in response to depression by an operator and a printed circuit board mounting and interconnecting the plurality of keys and wherein the computer system further comprises a printed circuit motherboard mounting and interconnecting the integrated circuit sound stored program digital computer.

26. A computer system as set forth in claim 23, wherein the keyboard includes a plurality of keys each key generating a key signal in response to operator actuation and an encoder circuit coupled to the plurality of keys and generating the keyboard input signal as an encoded keyboard input signal in response to the key signals.

27. A computer system as set forth in claim 23, wherein the integrated circuit dynamic sound memory further stores a display program having display instructions, wherein the integrated circuit sound processing circuit further generates a processed display signal in response to the sound computer input signal and in response to the display instructions, wherein the integrated circuit sound stored program digital computer further includes an integrated circuit display output circuit coupled to the integrated circuit sound processing circuit and to the integrated circuit dynamic sound memory and generating a display output signal in response to the processed display signal and in response to the display instructions, and wherein the computer system further comprises an operator display coupled to the integrated circuit display output circuit and generating an operator display in response to the display output signal.

28. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal in response to the serial digital keyboard output signal, wherein the integrated circuit sound stored program digital computer includes
1) an integrated circuit dynamic sound memory storing a sound program having sound instructions,
2) a refresh circuit coupled to the integrated circuit dynamic sound memory and refreshing the integrated circuit dynamic sound memory,
3) an integrated circuit sound computer input circuit coupled to the integrated circuit keyboard serial digital output circuit and to the integrated circuit dynamic sound memory and generating a sound computer input signal in response to the serial digital keyboard output signal and in response to the sound instructions,
4) an integrated circuit sound processing circuit coupled to the integrated circuit sound computer input circuit and to the integrated circuit dynamic sound memory and generating a processed sound signal in response to the sound computer input signal and in response to the sound instructions, and
5) an integrated circuit sound output circuit coupled to the integrated circuit sound processing circuit and to the integrated circuit dynamic sound memory and generating the sound output signal in response to the processed sound signal and in response to the sound instructions, and
6) an integrated circuit printer output circuit coupled to the integrated circuit sound processing circuit and to the integrated circuit dynamic sound memory and generating a printer output signal in response to the processed sound signal and in response to the sound instructions;

a sound transducer coupled to the integrated circuit sound output circuit and generating a sound in response to the sound output signal; and a printer coupled to the integrated circuit printer output circuit and printing information in response to the printer output signal.

29. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions, 3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and 4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit dynamic display memory storing display data;

an integrated circuit serial output circuit coupled to the integrated circuit dynamic display memory and generating a serial display output signal in response to the stored display data;

an integrated circuit sound stored program digital computer coupled to the integrated circuit keyboard serial digital output circuit and generating a sound output signal in response to the serial digital keyboard output signal, wherein the integrated circuit sound stored program digital computer includes 1) an integrated circuit dynamic sound memory storing a sound program having sound instructions and storing a display program having display instructions, 2) a refresh circuit coupled to the integrated circuit dynamic sound memory and refreshing the integrated circuit dynamic sound memory, 3) an integrated circuit sound computer input circuit coupled to the integrated circuit keyboard serial digital output circuit and to the integrated circuit dynamic sound memory and generating a sound computer input signal in response to the serial digital keyboard output signal and in response to the sound instructions, 4) an integrated circuit sound processing circuit coupled to the integrated circuit sound computer input circuit and to the integrated circuit dynamic sound memory and generating a processed sound signal in response to the sound computer input signal and in response to the sound instructions, 5) an integrated circuit sound output circuit coupled to the integrated circuit sound processing circuit and to the integrated circuit dynamic sound memory and generating the sound output signal in response to the processed sound signal and in response to the sound instructions, and 6) a writing circuit coupled to the integrated circuit dynamic display memory and to the integrated circuit sound memory and writing display data into the integrated circuit dynamic display memory in response to the display instructions;

a sound transducer coupled to the integrated circuit sound output circuit and generating a sound in response to the sound output signal; and an operator display coupled to the integrated circuit serial output circuit and generating an operator display in response to the serial display output signal.

30. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes 1) an integrated circuit keyboard read only memory storing a keyboard program having keyboard instructions, 2) an integrated circuit keyboard input circuit coupled to the keyboard and to the integrated circuit keyboard read only memory and generating a keyboard computer input signal in response to the keyboard input signal and in response to the keyboard instructions, 3) an integrated circuit keyboard processing circuit coupled to the integrated circuit keyboard input circuit and to the integrated circuit keyboard read only memory and generating a processed keyboard signal in response to the keyboard computer input signal and in response to the keyboard instructions, and 4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal and a display output signal in response to the serial digital keyboard output signal, wherein the integrated circuit sound stored program digital computer includes 1) an integrated circuit dynamic sound memory storing a sound program having sound instructions, 2) a refresh circuit coupled to the integrated circuit dynamic memory and refreshing the integrated circuit dynamic sound memory, 3) an integrated circuit sound computer input circuit coupled to the integrated circuit keyboard serial digital output circuit and to the integrated circuit dynamic sound memory and generating a sound computer input signal in response to the serial digital keyboard output signal and in response to the sound instructions, 4) an integrated circuit sound processing circuit coupled to the integrated circuit sound computer input circuit and to the integrated circuit dynamic sound memory and generating a processed sound signal in response to the sound computer input signal and in response to the sound instructions, 5) an integrated circuit sound output circuit coupled to the integrated circuit sound processing circuit and to the integrated circuit dynamic sound memory and generating the sound output signal in response to the processed sound signal and in response to the sound instructions, and 6) an integrated circuit display output circuit coupled to the integrated circuit sound processing circuit and to the integrated circuit dynamic sound memory and generating the display output signal in response to the processed sound signal in response to the sound program;

a sound transducer coupled to the integrated circuit sound output circuit and generating a sound in response to the sound output signal; and a CRT display coupled to the integrated circuit display output circuit and displaying data in response to the display output signal.

31. A computer system as set forth in claim 30, wherein the keyboard includes a plurality of keys each key generating a key signal in response to depression by an operator and a printed circuit board mounting and interconnecting the plurality of keys and wherein the computer system further comprises a printed circuit motherboard mounting and interconnecting the integrated circuit sound stored program digital computer.

32. A computer system as set forth in claim 30, wherein the keyboard includes a plurality of keys each key generating a key signal in response to operator actuation and an encoder circuit coupled to the plurality of keys and generating the keyboard input signal as an encoded keyboard input signal in response to the key signals.

33. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal in response to the keyboard computer input signal and in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal and a display output signal in response to the serial digital keyboard output signal, wherein the integrated circuit sound stored program digital computer includes
1) an integrated circuit dynamic sound memory storing a sound program having sound instructions,
2) a refresh circuit coupled to the integrated circuit dynamic memory and refreshing the integrated circuit dynamic sound memory,
3) an integrated circuit sound computer input circuit coupled to the integrated circuit keyboard serial digital output circuit and to the integrated circuit dynamic sound memory and generating a sound computer input signal in response to the serial digital keyboard output signal and in response to the sound instructions,
4) an integrated circuit sound processing circuit coupled to the integrated circuit sound computer input circuit and to the integrated circuit dynamic sound memory and generating a processed sound signal in response to the sound computer input signal and in response to the sound instructions,
5) an integrated circuit sound output circuit coupled to the integrated circuit sound processing circuit and to the integrated circuit dynamic sound memory and generating the sound output signal in response to the processed sound signal and in response to the sound instructions,
6) an integrated circuit display output circuit coupled to the integrated circuit sound processing circuit and to the integrated circuit dynamic sound memory and generating the display output signal in response to the processed sound signal in response to the sound program, and
7) an integrated circuit printer output circuit coupled to the integrated circuit sound processing circuit and to the integrated circuit dynamic sound memory and generating a printer output signal in response to the processed sound signal and in response to the sound instructions; and a sound transducer coupled to the integrated circuit sound output circuit and generating a sound in response to the sound output signal;

a CRT display coupled to the integrated circuit display output circuit and displaying data in response to the display output signal; and a printer coupled to the integrated circuit printer output circuit and printing data in response to the printer output signal.

34. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal by processing the keyboard computer input signal in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal in response to the serial digital keyboard output signal, wherein the integrated circuit sound stored program digital computer includes
1) an integrated circuit sound memory storing a sound program having sound instructions,
2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
3) an integrated circuit sound processing circuit coupled to the integrated circuit sound computer input circuit and to the integrated circuit sound memory and generating a processed sound signal in response to the sound computer input signal and in response to the sound instructions, and
4) an integrated circuit sound output circuit coupled to the integrated circuit sound processing circuit and to the integrated circuit sound memory and generating the sound output signal in response to the processed sound signal and in response to the sound instructions; and a sound transducer coupled to the integrated circuit sound output circuit and generating a sound in response to the sound output signal.

35. A computer system as set forth in claim 34, wherein the integrated circuit sound stored program digital computer generates the sound output signal as an error sound output signal in response to the serial digital keyboard output signal, wherein the sound instructions stored by the integrated circuit sound memory include error sound instructions, wherein the integrated circuit sound processing circuit processes the sound computer input signal in response to the error sound instructions, wherein the integrated circuit sound output circuit generates the sound output signal as an error sound output signal in response to the error sound instructions in response to the processed sound signal, and wherein the sound transducer generates the sound as an error sound in response to the error sound output signal.

36. A computer system as set forth in claim 34, wherein the integrated circuit sound stored program digital computer further includes an integrated circuit printer output circuit coupled to the integrated circuit sound processing circuit and to the integrated circuit sound memory and generating a printer output signal in response to the processed sound signal and in response to the sound instructions and wherein the computer system further comprises a printer coupled to the integrated circuit printer output circuit and printing information in response to the printer output signal.

37. A computer system as set forth in claim 34, wherein the keyboard includes a plurality of keys each key generating a key signal in response to depression by an operator and a printed circuit board mounting and interconnecting the plurality of keys and wherein the computer system further comprises a printed circuit motherboard mounting and interconnecting the integrated circuit sound stored program digital computer.

38. A computer system as set forth in claim 34, wherein the keyboard includes a plurality of keys each key generating a key signal in response to operator actuation and an encoder circuit coupled to the plurality of keys and generating the keyboard input signal as an encoded keyboard input signal in response to the key signals.

39. A computer system as set forth in claim 34, wherein the integrated circuit sound memory further stores a display program having display instructions, wherein the integrated circuit sound processing circuit further generates a processed display signal in response to the sound computer input signal and in response to the display instructions, wherein the integrated circuit sound stored program digital computer further includes an integrated circuit display output circuit coupled to the integrated circuit sound processing circuit and to the integrated circuit sound memory and generating a display output signal in response to the processed display signal and in response to the display instructions, and wherein the computer system further comprises an operator display coupled to the integrated circuit display output circuit and generating an operator display in response to the display output signal.

40. A computer system as set forth in claim 34, wherein the computer system further comprises an integrated circuit dynamic display memory storing display data and an integrated circuit serial output circuit coupled to the integrated circuit dynamic display memory and generating a serial display output signal in response to the stored display data, wherein the integrated circuit sound memory includes a display program having display instructions, wherein the integrated circuit sound stored program digital computer further includes a writing circuit coupled to the integrated circuit dynamic display memory and to the integrated circuit sound memory and writing display data into the integrated circuit dynamic display memory in response to the display instructions, and wherein the computer system further comprises an operator display coupled to the integrated circuit serial output circuit and generating an operator display in response to the serial display output signal.

41. A computer system comprising:

a keyboard generating a keyboard input signal;

an integrated circuit keyboard stored program digital computer coupled to the keyboard and generating a serial digital keyboard output signal in response to the keyboard input signal, wherein the integrated circuit keyboard stored program digital computer includes
1) an integrated circuit keyboard read only memory storing a keyboard program having keyboard instructions,
2) an integrated circuit keyboard input circuit coupled to the keyboard and to the integrated circuit keyboard read only memory and generating a keyboard computer input signal in response to the keyboard input signal and in response to the keyboard instructions,
3) an integrated circuit keyboard processing circuit coupled to the integrated circuit keyboard input circuit and to the integrated circuit keyboard read only memory and generating a processed keyboard signal in response to the keyboard computer input signal and in response to the keyboard instructions, and
4) an integrated circuit keyboard serial digital output circuit coupled to the integrated circuit keyboard processing circuit and to the integrated circuit keyboard read only memory and generating the serial digital keyboard output signal in response to the processed keyboard signal and in response to the keyboard instructions;

an integrated circuit sound stored program digital computer coupled to the integrated circuit keyboard serial digital output circuit and generating a sound output signal and a display output signal in response to the serial digital keyboard output signal, wherein the integrated circuit sound stored program digital computer includes 1) an integrated circuit sound memory storing a sound program having sound instructions,
2) an integrated circuit sound computer input circuit coupled to the integrated circuit keyboard serial digital output circuit and to the integrated circuit sound memory and generating a sound computer input signal in response to the serial digital keyboard output signal and in response to the sound instructions,
3) an integrated circuit sound processing circuit coupled to the integrated circuit sound computer input circuit and to the integrated circuit sound memory and generating a processed sound signal in response to the sound computer input signal and in response to the sound instructions,
4) an integrated circuit sound output circuit coupled to the integrated circuit sound processing circuit and to the integrated circuit sound memory and generating the sound output signal in response to the processed sound signal and in response to the sound instructions, and
5) an integrated circuit display output circuit coupled to the integrated circuit sound processing circuit and to the integrated circuit sound memory and generating the display output signal in response to the processed sound signal in response to the sound program;

a sound transducer coupled to the integrated circuit sound output circuit and generating a sound in response to the sound output signal; and a CRT display coupled to the integrated circuit display output circuit and displaying data in response to the display output signal.

42. A computer system as set forth in claim 41, wherein the integrated circuit sound stored program digital computer further includes an integrated circuit printer output circuit coupled to the integrated circuit sound processing circuit and to the integrated circuit sound memory and generating a printer output signal in response to the processed sound signal and in response to the sound instructions and wherein the computer system further comprises a printer coupled to the integrated circuit printer output circuit and printing data in response to the printer output signal.

43. A computer system as set forth in claim 41, wherein the keyboard includes a plurality of keys each key generating a key signal in response to depression by an operator and a printed circuit board mounting and interconnecting the plurality of keys and wherein the computer system further comprises a printed circuit motherboard mounting and interconnecting the integrated circuit sound stored program digital computer.

44. A computer system as set forth in claim 41, wherein the keyboard includes a plurality of keys each key generating a key signal in response to operator actuation and an encoder circuit coupled to the plurality of keys and generating the keyboard input signal as an encoded keyboard input signal in response to the key signals.

45. A computer system comprising:
an integrated circuit stored program digital computer generating a sound output signal, wherein the integrated circuit stored program digital computer includes
1) an integrated circuit dynamic main memory storing a computer program having computer instructions,
2) a refresh circuit coupled to the integrated circuit dynamic main memory and refreshing the integrated circuit dynamic main memory,
3) an integrated circuit processing circuit coupled to the integrated circuit dynamic main memory and generating a processed sound signal in response to the computer instructions, and
4) an integrated circuit output circuit coupled to the integrated circuit processing circuit and to the integrated circuit dynamic main memory and generating the sound output signal in response to the processed sound signal and in response to the computer instructions and a sound transducer coupled to the integrated circuit output circuit and generating a sound in response to the sound output signal.

46. A computer system comprising:
a keyboard generating a keyboard input signal, wherein the keyboard includes
1) a plurality of keys each key generating a key signal in response to depression by an operator and
2) a printed circuit board mounting and interconnecting the plurality of keys,
an integrated circuit stored program digital computer generating a sound output signal, wherein the integrated circuit stored program digital computer includes
1) an integrated circuit dynamic main memory storing a computer program having computer instructions,
2) a refresh circuit coupled to the integrated circuit dynamic main memory and refreshing the integrated circuit dynamic main memory,
3) an integrated circuit processing circuit coupled to the integrated circuit dynamic main memory, coupled to the keyboard, and generating a processed sound signal in response to the keyboard input signal and in response to the computer instructions,
4) an integrated circuit output circuit coupled to the integrated circuit processing circuit and to the integrated circuit dynamic main memory and generating the sound output signal in response to the processed sound signal and in response to the computer instructions, and
5) a printed circuit motherboard mounting and interconnecting the integrated circuit stored program digital computer; and a sound transducer coupled to the integrated circuit output circuit and generating a sound in response to the sound output signal.

47. A computer system comprising:
a keyboard generating a keyboard input signal, wherein the keyboard includes
1) a plurality of keys each key generating a key signal in response to operator actuation and
2) an encoder circuit coupled to the plurality of keys and generating an encoded keyboard input signal in response to the key signals,
an integrated circuit stored program digital computer generating a sound output signal, wherein the integrated circuit stored program digital computer includes
1) an integrated circuit dynamic main memory storing a computer program having computer instructions,
2) a refresh circuit coupled to the integrated circuit dynamic main memory and refreshing the integrated circuit dynamic main memory,
3) an integrated circuit processing circuit coupled to the keyboard, coupled to the integrated circuit dynamic main memory, and generating a processed sound signal in response to the encoded keyboard input signal and in response to the computer instructions, and
4) an integrated circuit output circuit coupled to the integrated circuit processing circuit and to the integrated circuit dynamic main memory and generating the sound output signal in response to the processed sound signal and in response to the computer instructions; and a sound transducer coupled to the integrated circuit output circuit and generating a sound in response to the sound output signal.

48. A computer system comprising:

an integrated circuit stored program digital computer generating a sound output signal and a display output signal, wherein the integrated circuit stored program digital computer includes
1) an integrated circuit dynamic main memory storing a computer program having computer instructions,
2) a refresh circuit coupled to the integrated circuit dynamic main memory and refreshing the integrated circuit dynamic main memory,
3) an integrated circuit processing circuit coupled to the integrated circuit dynamic main memory and generating a processed sound signal and a processed display signal in response to the computer instructions,
4) an integrated circuit sound output circuit coupled to the integrated circuit processing circuit and to the integrated circuit dynamic main memory and generating the sound output signal in response to the processed sound signal and in response to the computer instructions, and
5) an integrated circuit display output circuit coupled to the integrated circuit processing circuit and to the integrated circuit dynamic main memory and generating the display output signal in response to the processed display signal and in response to the computer instructions;

an operator display coupled to the integrated circuit display output circuit and displaying information to an operator in response to the display output signal; and a sound transducer coupled to the integrated circuit sound output circuit and generating a sound in response to the sound output signal.

49. A computer system comprising:

an integrated circuit dynamic display memory storing display data;

an integrated circuit serial output circuit coupled to the integrated circuit dynamic display memory and generating a serial display output signal in response to the display data stored by integrated circuit dynamic display memory;

an integrated circuit stored program digital computer generating a sound output signal and a display output signal, wherein the integrated circuit stored program digital computer includes
1) an integrated circuit dynamic main memory storing a computer program having computer instructions,
2) a refresh circuit coupled to the integrated circuit dynamic main memory and refreshing the integrated circuit dynamic main memory,
3) an integrated circuit processing circuit coupled to the integrated circuit dynamic main memory and generating a processed sound signal in response to the computer instructions,
4) an integrated circuit output circuit coupled to the integrated circuit processing circuit and to the integrated circuit dynamic main memory and generating the sound output signal in response to the processed sound signal and in response to the computer instructions, and
5) an integrated circuit writing circuit coupled to the integrated circuit dynamic display memory and to the integrated circuit dynamic main memory and writing display data into the integrated circuit dynamic display memory in response to the computer instructions; and an operator display coupled to the integrated circuit serial output circuit and displaying data to an operator in response to the serial display output signal; and a sound transducer coupled to the integrated circuit output circuit and generating a sound in response to the sound output signal.

* * * * *